(12) United States Patent
Lee et al.

(10) Patent No.: US 12,412,804 B2
(45) Date of Patent: Sep. 9, 2025

(54) SEMICONDUCTOR STRUCTURE WITH IMPROVED HEAT DISSIPATION

(71) Applicant: Taiwan Semiconductor Manufacturing Company, Ltd., Hsinchu (TW)

(72) Inventors: Cheng-Chin Lee, Taipei (TW); Shau-Lin Shue, Hsinchu (TW); Shao-Kuan Lee, Kaohsiung (TW); Hsiao-Kang Chang, Hsinchu (TW); Cherng-Shiaw Tsai, New Taipei (TW); Kai-Fang Cheng, Taoyuan (TW); Hsin-Yen Huang, New Taipei (TW); Ming-Hsien Lin, Hsinchu County (TW); Chuan-Pu Chou, Hsinchu County (TW); Hsin-Ping Chen, Hsinchu County (TW); Chia-Tien Wu, Taichung (TW); Kuang-Wei Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 708 days.

(21) Appl. No.: 17/693,668

(22) Filed: Mar. 14, 2022

(65) Prior Publication Data
US 2023/0290705 A1    Sep. 14, 2023

(51) Int. Cl.
*H01L 23/373*  (2006.01)
*H01L 23/522*  (2006.01)
(Continued)

(52) U.S. Cl.
CPC ...... *H01L 23/3738* (2013.01); *H01L 23/3732* (2013.01); *H01L 23/5226* (2013.01);
(Continued)

(58) Field of Classification Search
CPC ............. H01L 23/3738; H01L 23/3732; H01L 23/5226; H01L 23/5283; H01L 27/0886;
(Continued)

(56) References Cited

U.S. PATENT DOCUMENTS

2014/0054761 A1*  2/2014  Lin ..................... H01L 23/42
                                                          257/692
2019/0304900 A1*  10/2019  Chen .................... H01L 23/528
(Continued)

*Primary Examiner* — Eliseo Ramos Feliciano
*Assistant Examiner* — Sophia W Kao
(74) *Attorney, Agent, or Firm* — McClure, Qualey & Rodack, LLP

(57) ABSTRACT

A semiconductor structure is provided. The semiconductor structure includes a substrate and a device region formed over the substrate. The semiconductor structure further includes an interconnect structure formed over the device region and a first passivation layer formed over the interconnect structure. The semiconductor structure also includes a metal pad formed over and extending into the first passivation layer and a second passivation layer formed over the first passivation layer. The second passivation layer includes a thermal conductive material, and the thermal conductivity of the thermal conductive material is higher than 4 W/mK.

20 Claims, 48 Drawing Sheets

(51) Int. Cl.
*H01L 23/528* (2006.01)
*H10D 30/62* (2025.01)
*H10D 84/83* (2025.01)

(52) U.S. Cl.
CPC ..... *H01L 23/5283* (2013.01); *H10D 30/6211* (2025.01); *H10D 84/834* (2025.01)

(58) Field of Classification Search
CPC ........... H01L 29/7851; H01L 21/76898; H01L 23/3677; H01L 23/481
See application file for complete search history.

(56) References Cited

U.S. PATENT DOCUMENTS

| | | | |
|---|---|---|---|
| 2020/0098683 A1* | 3/2020 | Shilimkar | H01L 23/5228 |
| 2022/0157690 A1* | 5/2022 | Lee | H01L 23/53295 |
| 2022/0310472 A1* | 9/2022 | Huang | H10D 30/024 |

* cited by examiner

SEMICONDUCTOR STRUCTURE WITH IMPROVED HEAT DISSIPATION

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and packages have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
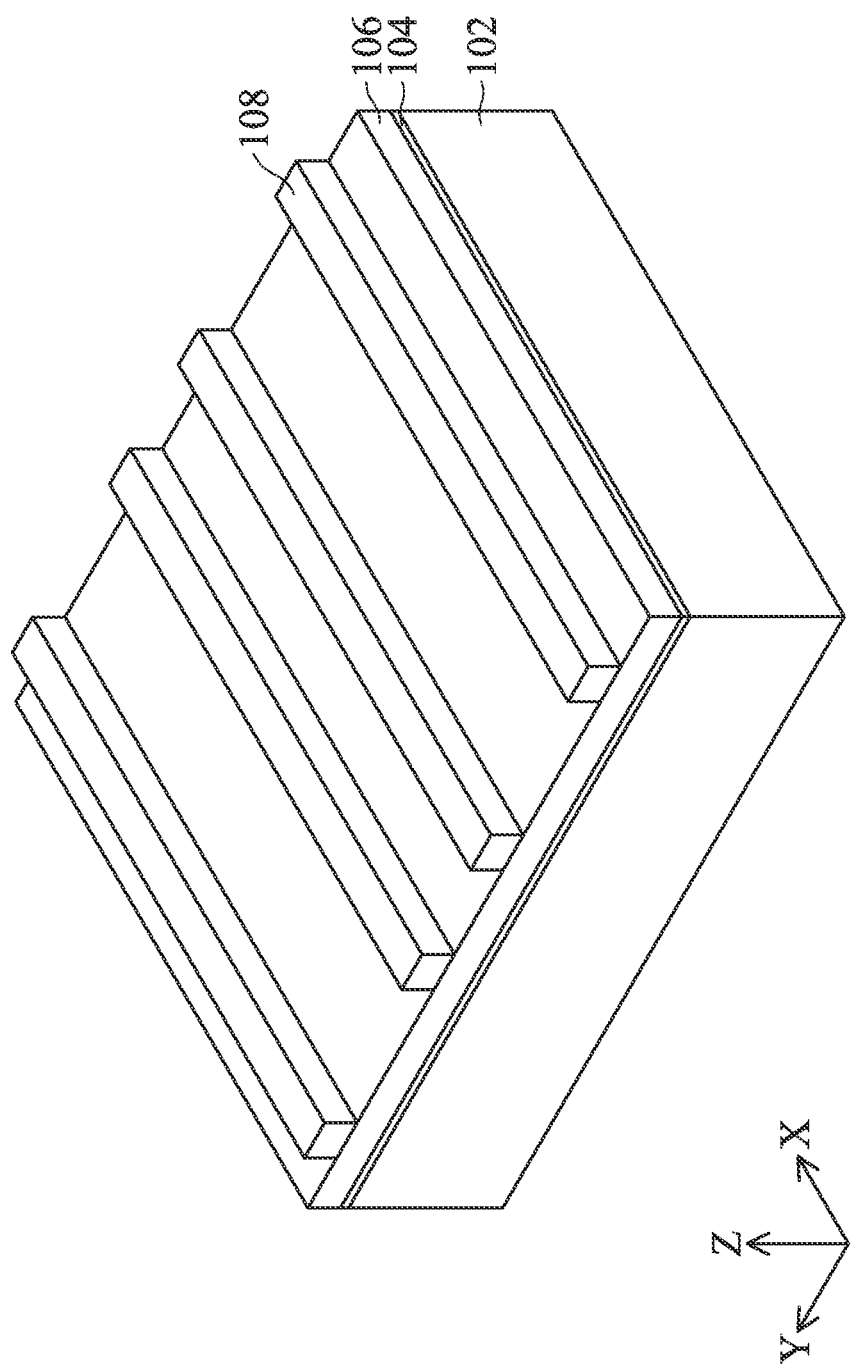
FIGS. 1A-1I are perspective views of various stages of forming a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Embodiments of a semiconductor structures are provided. The semiconductor structure may include a thermal conductive material having a thermal conductivity higher than 4 W/mK. In some embodiments, the isolation structure separating the gate structure into multiple regions has a relative high thermal conductivity (for example, greater than 4 W/mK), and therefore the formation of the isolation structure helps to dissipate the heat generated by the semiconductor structure. In addition, the liners and the conductive layer, or the passivation layers may also adopted the thermal conductive material for improving the thermal dissipation of the overall semiconductor structure.

FIGS. 1A-1I are perspective representations of various stages of forming a semiconductor structure, in accordance with some embodiments of the disclosure. A substrate 102 is provided, as shown in FIG. 1A in accordance with some embodiments. The substrate 102 is a semiconductor wafer such as a silicon wafer. Alternatively or additionally, the substrate 102 includes elementary semiconductor materials, compound semiconductor materials, and/or alloy semiconductor materials. Examples of the elementary semiconductor materials include, but are not limited to, crystal silicon, polycrystalline silicon, amorphous silicon, germanium, and/or diamond. Examples of the compound semiconductor materials include, but are not limited to, silicon carbide, gallium arsenic, gallium phosphide, indium phosphide, indium arsenide, and/or indium antimonide. Examples of the alloy semiconductor materials include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a patterned photoresist layer 108 is formed over the mask layer 106, as shown in FIG. 1A in accordance with some embodiments. In some embodiments, the patterned photoresist layer 108 is formed by a deposition process and a patterning process.

The deposition process for forming the patterned photoresist layer 108 includes a chemical vapor deposition (CVD) process, a high-density plasma chemical vapor deposition (HDPCVD) process, a spin-on process, a sputtering process, or another applicable process. The patterning process for forming the patterned photoresist layer 108 includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

Moreover, the dielectric layer 104 is a buffer layer between the substrate 102 and the mask layer 106. In some embodiments, the dielectric layer 104 is used as a stop layer when the mask layer 106 is removed. In some embodiments, the dielectric layer 104 is made of silicon oxide. The mask layer 106 is made of silicon oxide, silicon nitride, silicon oxynitride, or another applicable material. In some other embodiments, more than one mask layer 106 is formed over the dielectric layer 104.

The dielectric layer 104 and the mask layer 106 is formed by deposition processes, which includes a chemical vapor deposition (CVD) process, a high-density plasma chemical vapor deposition (HDPCVD) process, a spin-on process, a sputtering process, or another applicable process.

Figure 1B:
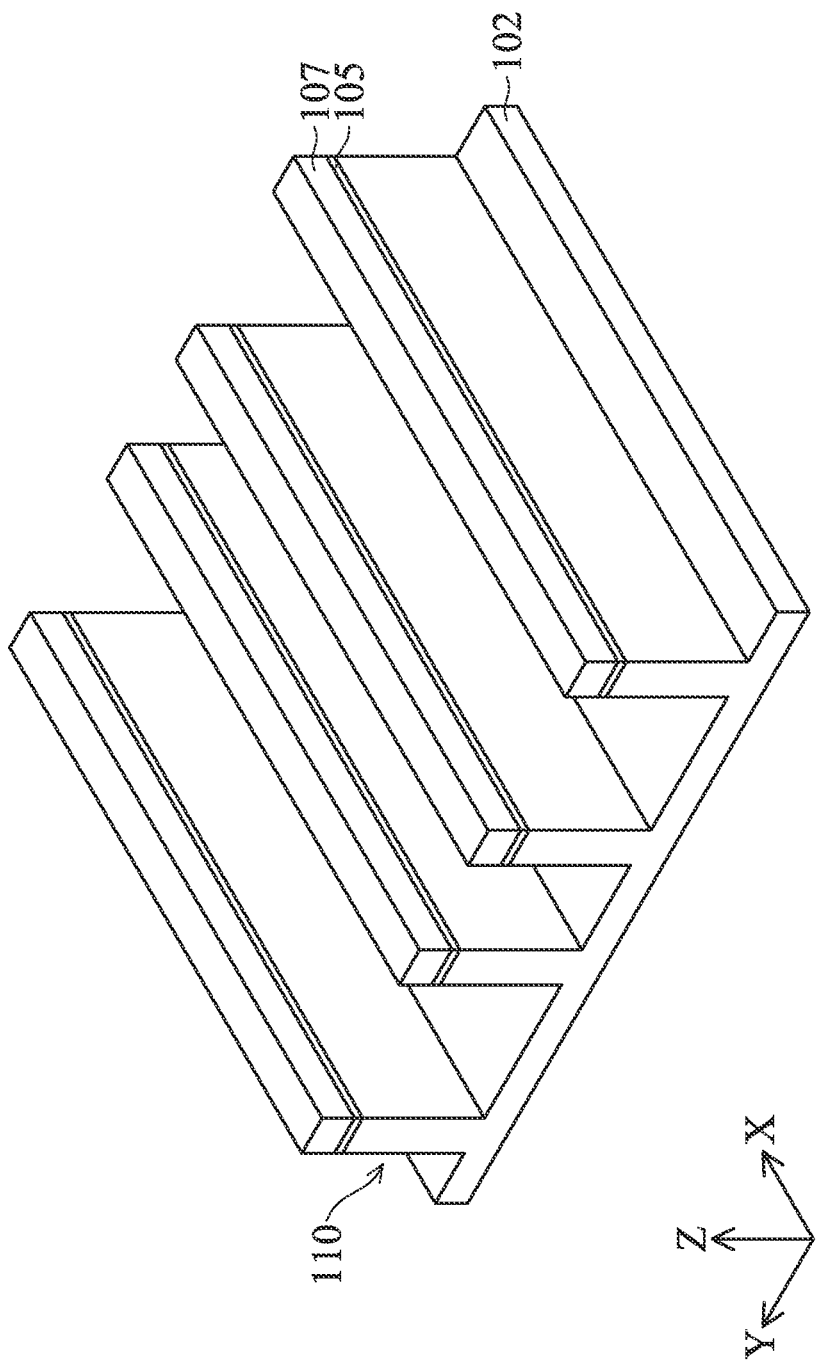

After the patterned photoresist layer 108 is formed, the dielectric layer 104 and the mask layer 106 are patterned by using the patterned photoresist layer 108 as a mask, as shown in FIG. 1B in accordance with some embodiments. As a result, a patterned dielectric layer 105 and a patterned mask layer 107 are obtained. Afterwards, the patterned photoresist layer 108 is removed.

Next, an etching process is performed on the substrate 102 to form a plurality of fin structures 110 by using the patterned dielectric layer 105 and the patterned mask layer 107 as a mask. The etching process is a dry etching process or a wet etching process.

In some embodiments, the substrate 102 is etched by a dry etching process. The dry etching process includes using a fluorine-based etchant gas, such as $SF_6$, $C_xF_y$, $NF_3$ or a combination thereof. The etching process is a time-controlled process, and continues until the fin structures 110 reach a predetermined height. In some other embodiments, the fin structures 110 have a width that gradually increases from the top portion to the lower portion.

Figure 1C:
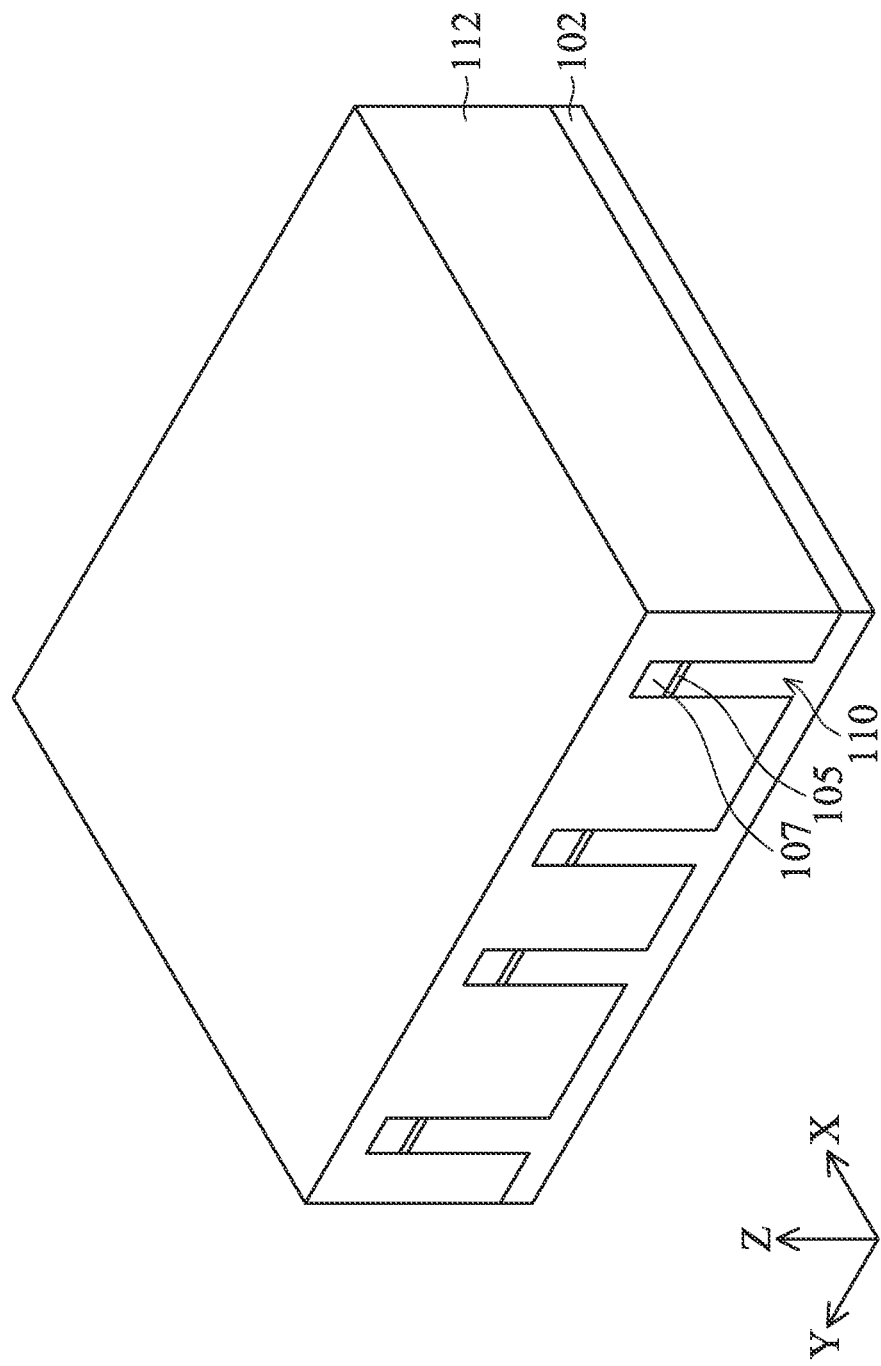

After the fin structures 110 are formed, an insulating layer 112 is formed to cover the fin structures 110, the patterned pad layer 105, and the patterned mask layer 107 over the substrate 102, as shown in FIG. 1C in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 is deposited by a chemical vapor deposition (CVD) process, a spin-on-glass process, or another applicable process.

Next, the insulating layer 112 is thinned or planarized to expose the top surface of the patterned mask layer 107. In some embodiments, the insulating layer 112 is thinned by a chemical mechanical polishing (CMP) process. Afterwards, the patterned dielectric layer 105 and the patterned mask layer 107 are removed.

Figure 1D:
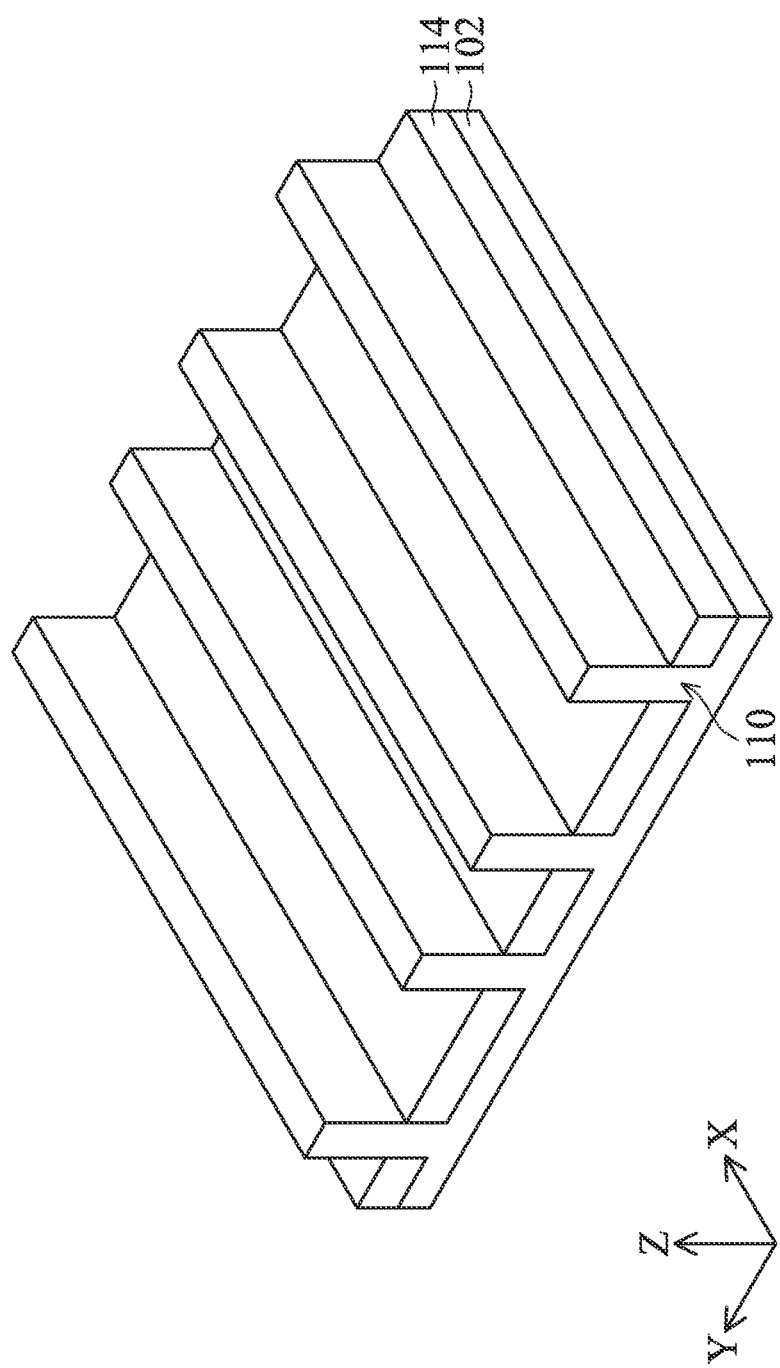

After the patterned dielectric layer 105 and the patterned mask layer 107 are removed, an upper portion of the insulating layer 112 is removed to form an isolation structure 114, as shown in FIG. 1D in accordance with some embodiments. The isolation structure 114 is a shallow trench isolation (STI) structure surrounding the fin structures 110.

In some embodiments, a portion of the fin structure 110 is embedded in the isolation structure 114. More specifically, a lower portion of the fin structure 110 is surrounded by the isolation structure 114, while an upper portion of the fin structure 110 protrudes from the isolation structure 114. The isolation structure 114 is configured to prevent electrical interference or crosstalk.

Figure 1E:
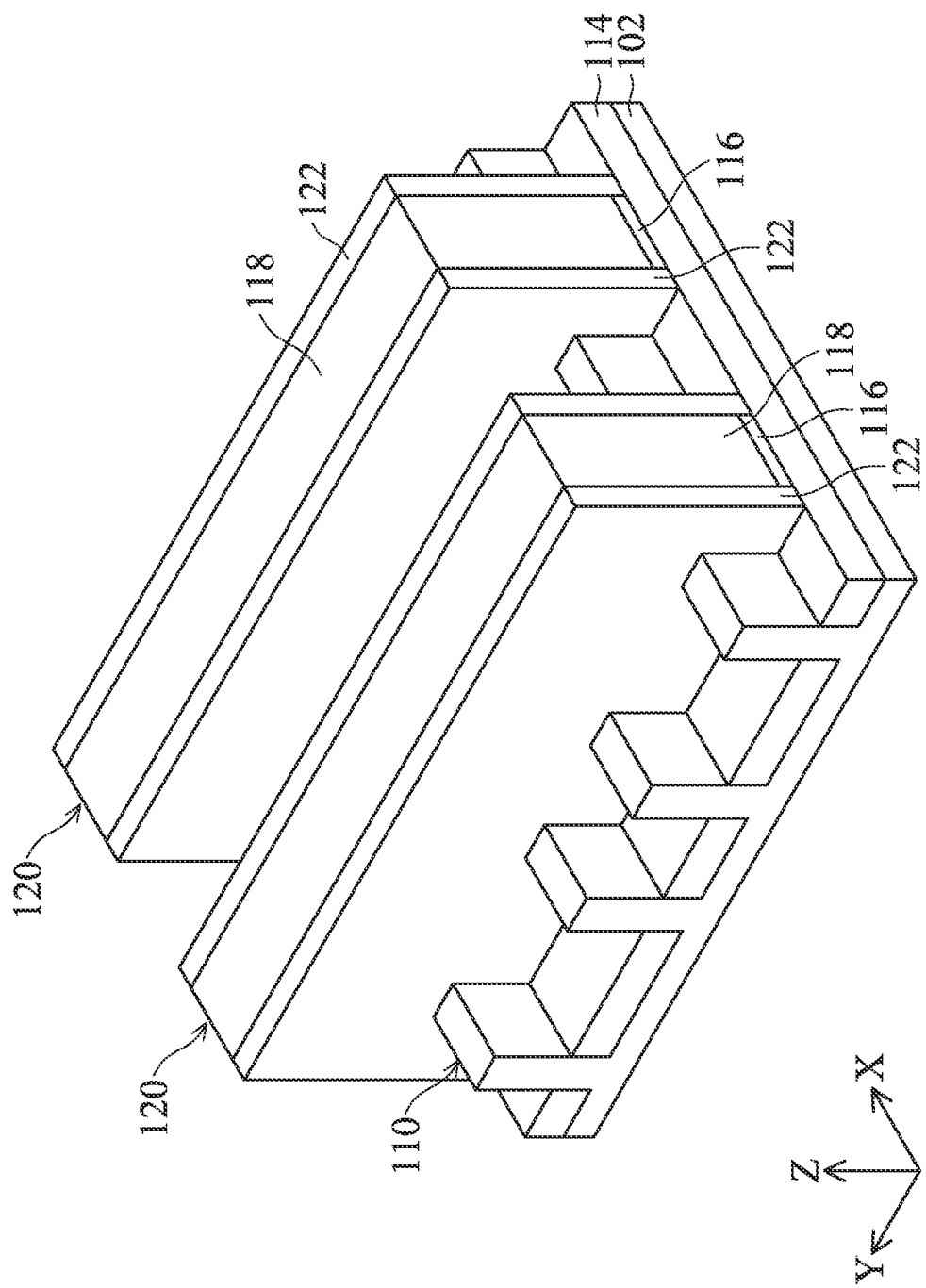

After the isolation structure 114 is formed, dummy gate structures 120 are formed across the fin structures 110 and extend over the isolation structure 114, as shown in FIG. 1E in accordance with some embodiments. In some embodiments, each of the dummy gate structures 120 includes a dummy gate dielectric layer 116 and a dummy gate electrode layer 118 formed over the dummy gate dielectric layer 116. After the dummy gate structures 120 are formed, gate spacers 122 are formed on opposite sidewalls of each of the dummy gate structures 120. Each of the gate spacers 122 is a single layer or multiple layers.

In order to improve the speed of the FinFET device structure, the gate spacers 122 are made of low-k dielectric materials. In some embodiments, the low-k dielectric materials have a dielectric constant (k value) less than about 4. Examples of low-k dielectric materials include, but are not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide.

In some other embodiments, the gate spacers 122 are made of an extreme low-k (ELK) dielectric material with a dielectric constant (k) less than about 2.5. In some embodiments, the ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

In addition, in some embodiments, the gate spacers 122 include air gaps (not shown) to further reduce their k value, such that the capacitances between the gate structures (formed subsequently) and the contacts (formed subsequently) electrically connected to the S/D structure (formed subsequently) is reduced.

Figure 1F:
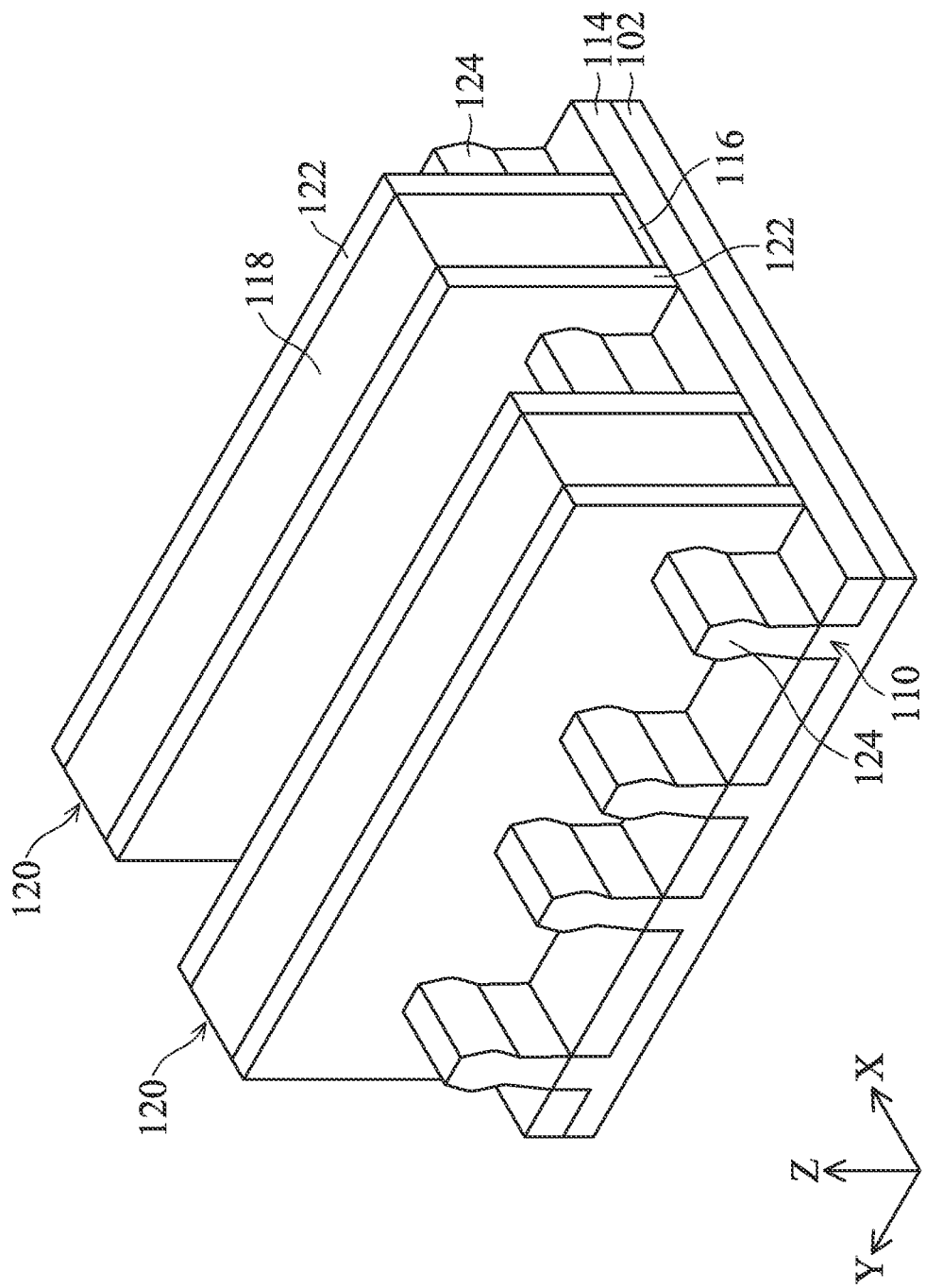

Afterwards, source/drain (S/D) structures 124 are formed over the fin structures 110, as shown in FIG. 1F in accordance with some embodiments. In some embodiments, portions of the fin structures 110 adjacent to the dummy gate structures 120 are recessed to form recesses at two sides of the fin structures 110, and a strained material is grown in the recesses by an epitaxial (epi) process to form the S/D structures 124. In addition, the lattice constant of the strained material may be different from the lattice constant of the substrate 102. In some embodiments, the S/D structures 124 include Ge, SiGe, InAs, InGaAs, InSb, GaAs, GaSb, InAlP, InP, or the like.

After the source/drain (S/D) structures 124 are formed, a contact etch stop layer (CESL) 126 is formed over the substrate 102, and an inter-layer dielectric (ILD) structure 128 is formed over the CESL 126. More specifically, the CESL 126 is formed over the S/D structures 124, the isolation structure 114, and the sidewalls of the gate spacers 122. In some embodiments, the CESL 126 is made of silicon nitride, silicon oxynitride, and/or other applicable materials. Moreover, the CESL 126 is formed by plasma enhanced CVD, low-pressure CVD, atomic layer deposition (ALD), or other applicable processes.

In some embodiments, the ILD structure 128 includes multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of the low-k dielectric materials include, but are not limited to, fluorinated silica glass (FSG), carbon doped silicon oxide, amorphous fluorinated carbon, parylene, bis-benzocyclobutenes (BCB), or polyimide. In addition, the ILD structure 128 is formed by chemical vapor deposition (CVD), physical vapor deposition, (PVD), atomic layer deposition (ALD), spin-on coating, or another applicable process.

Figure 1G:
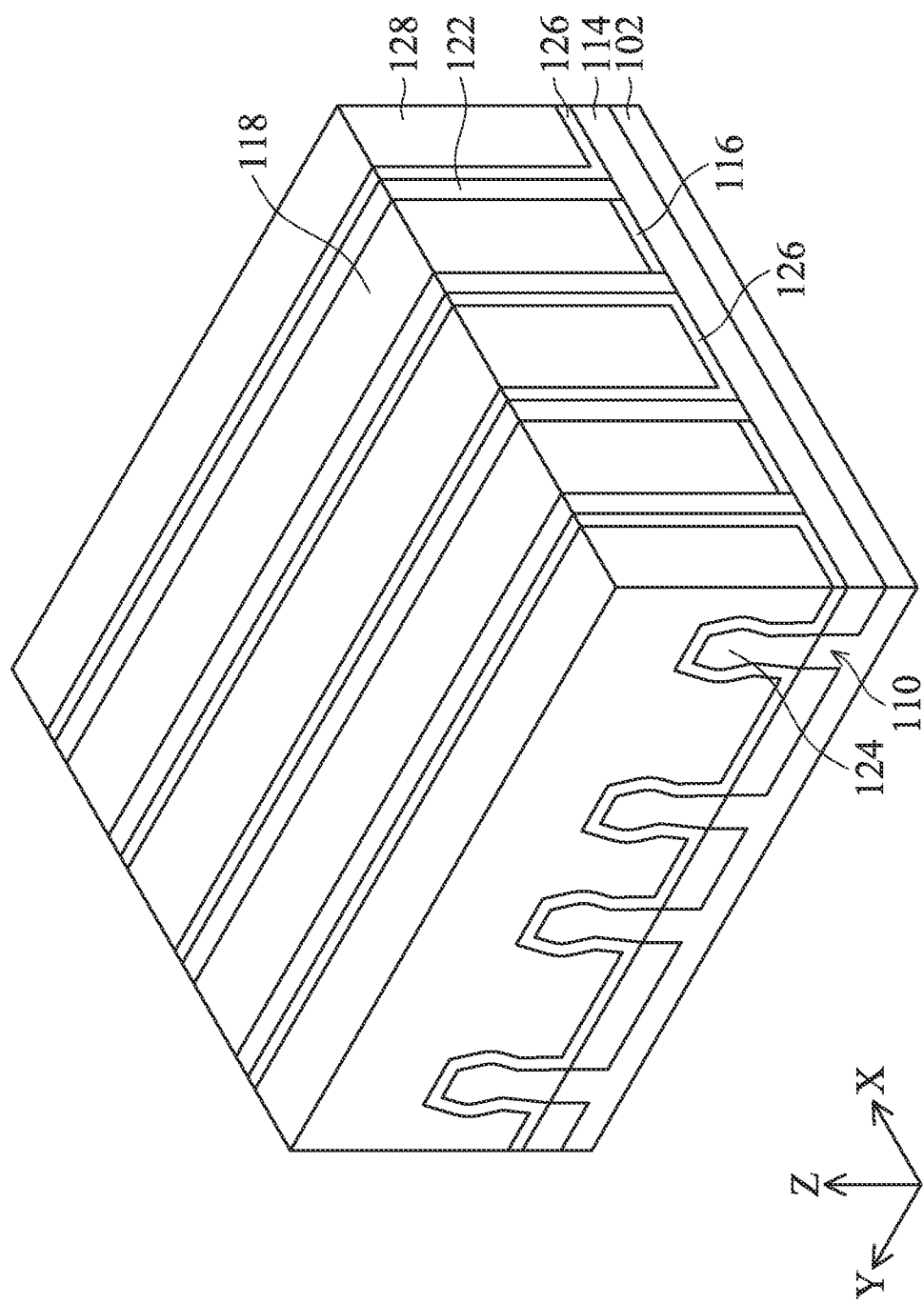

Afterwards, a planarizing process is performed on the ILD structure 128 until the top surfaces of the dummy gate structures 120 are exposed, as shown in FIG. 1G in accordance with some embodiments. After the planarizing process, the top surfaces of the dummy gate structures 120 is substantially level with the top surfaces of the gate spacers 122 and the ILD structure 128. In some embodiments, the planarizing process includes a grinding process, a chemical mechanical polishing (CMP) process, an etching process, another applicable process, or a combination thereof.

Figure 1H:
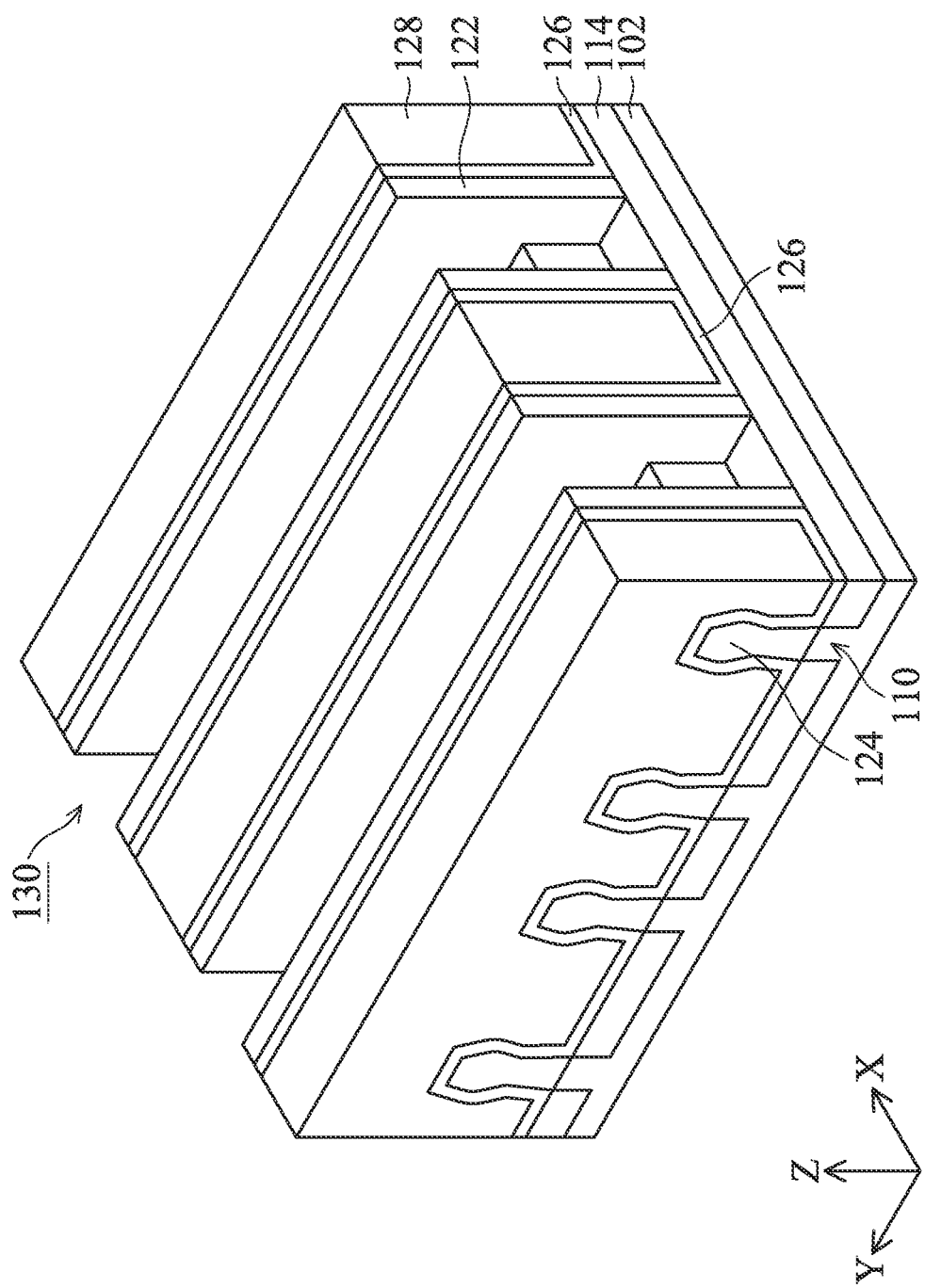

Next, the dummy gate structures 120 are removed to form trenches 130 in the ILD structure 128, as shown in FIG. 1H in accordance with some embodiments. More specifically, each of the trenches 130 is formed between each pair of the gate spacers 122, and the fin structure 110 is exposed by the trenches 130. The dummy gate dielectric layer 116 and the dummy gate electrode layer 118 are removed by an etching process, such as a dry etching process or a wet etching process.

Figure 1I:
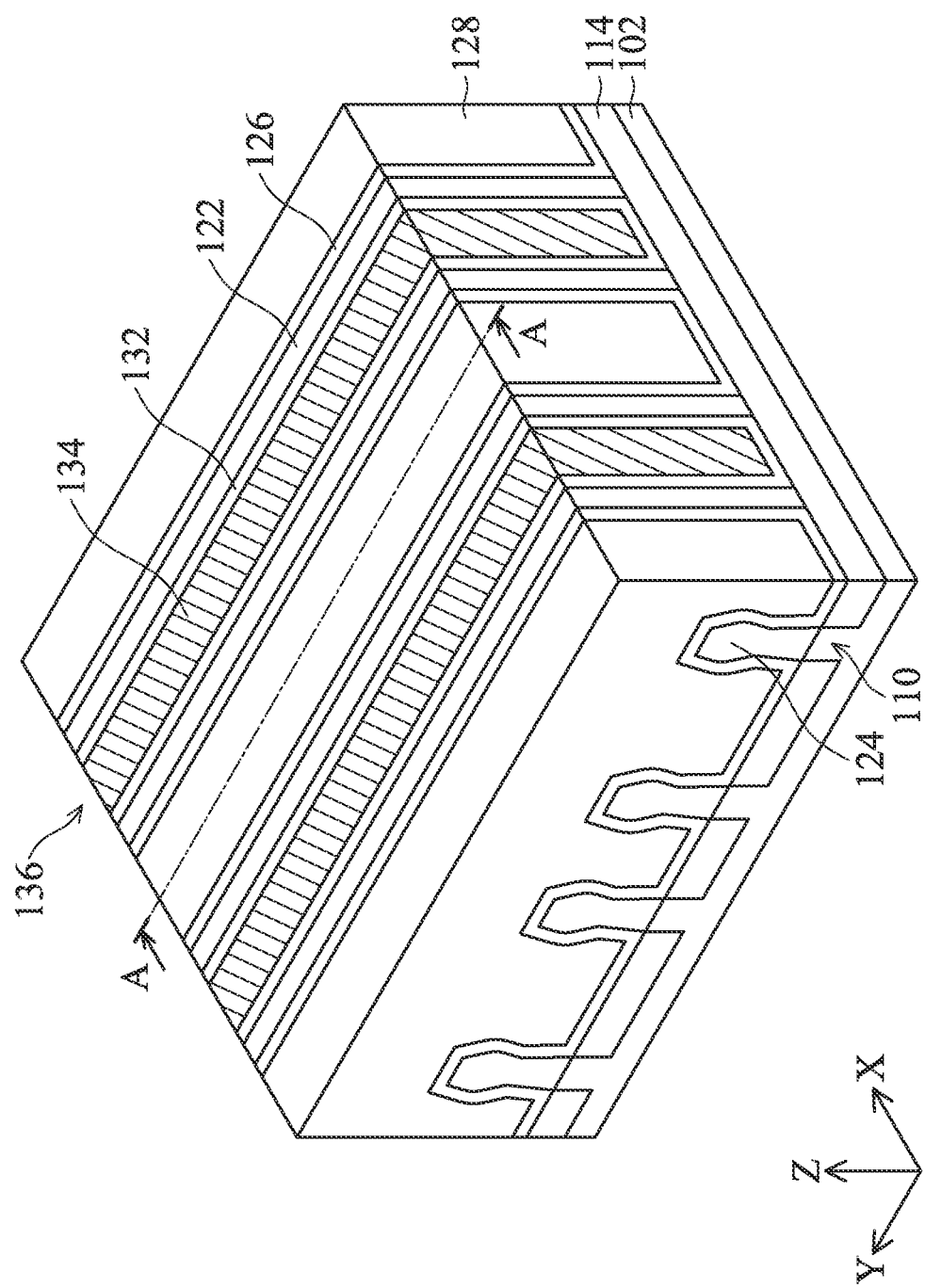

After the trenches 130 are formed, gate dielectric layers 132 and gate electrode layers 134 are formed in the trenches 130, as shown in FIG. 1I in accordance with some embodiments. More specifically, the gate electrode layers 134 are formed over the gate dielectric layers 132, and sidewalls of the gate electrode layers 132 is covered by the gate dielectric layers 132. In addition, work function layers (not shown) are formed between each of the gate dielectric layers 132 and each of the gate electrode layers 134. Accordingly, a plurality of gate structures 136 are formed. Each of the gate structures 136 includes one dielectric layer 132 and one gate electrode layer 134, and may also include work function layers (not shown) formed therebetween.

Each of the gate dielectric layers 132 is a single layer or multiple layers. In some embodiments, the gate dielectric layers 132 are made of silicon oxide, silicon nitride, silicon oxynitride (SiON), dielectric material(s) with high dielectric constant (high-k), or a combination thereof. In some embodiments, the gate dielectric layers 132 are deposited by a plasma enhanced chemical vapor deposition (PECVD) process or a spin coating process.

Moreover, the gate electrode layers 134 are made of a conductive material such as aluminum (Al), copper (Cu), tungsten (W), titanium (Ti), tantalum (Ta), or another applicable material, in accordance with some embodiments. The gate electrode layers 134 are formed by a deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, or a plasma enhanced CVD (PECVD) process.

The work function layers are made of metal materials, and the metal materials include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

Figure 2A:
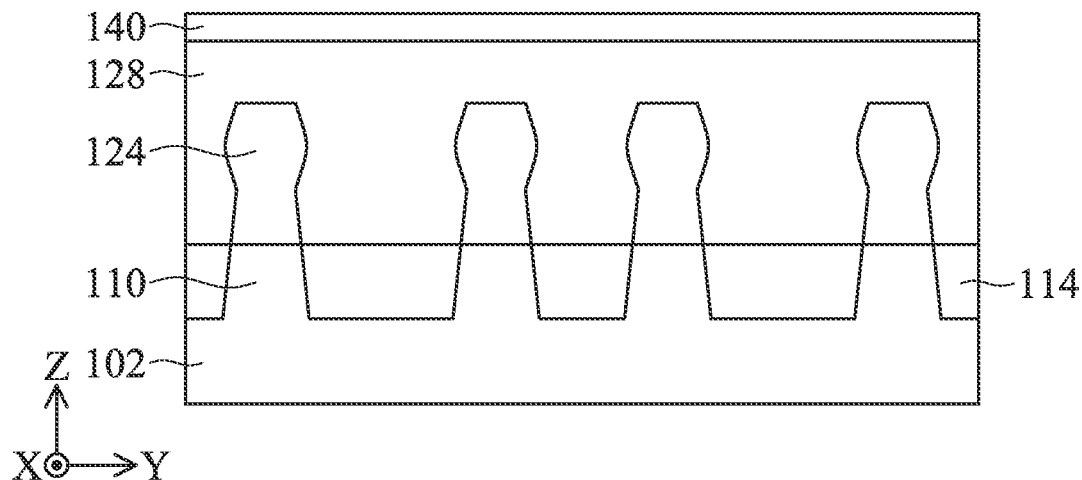
FIGS. 2A-2Q are cross-sectional views of various stages of forming a semiconductor structure, in accordance with some embodiments of the disclosure.
Figure 2B:
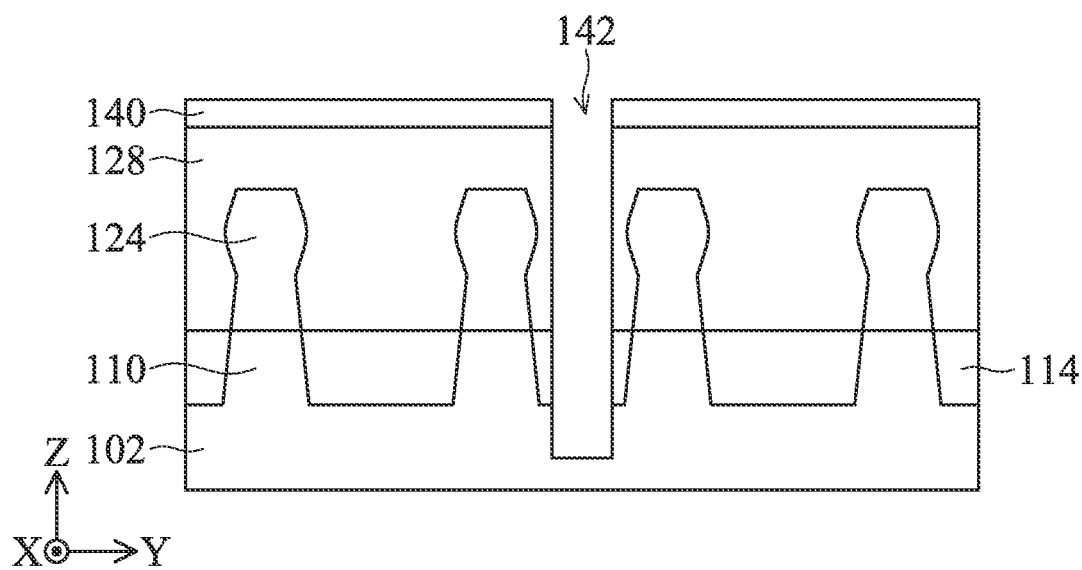
FIG. 2R illustrates a layout of the semiconductor structure, in accordance with some embodiments of the disclosure.
Figure 2C:
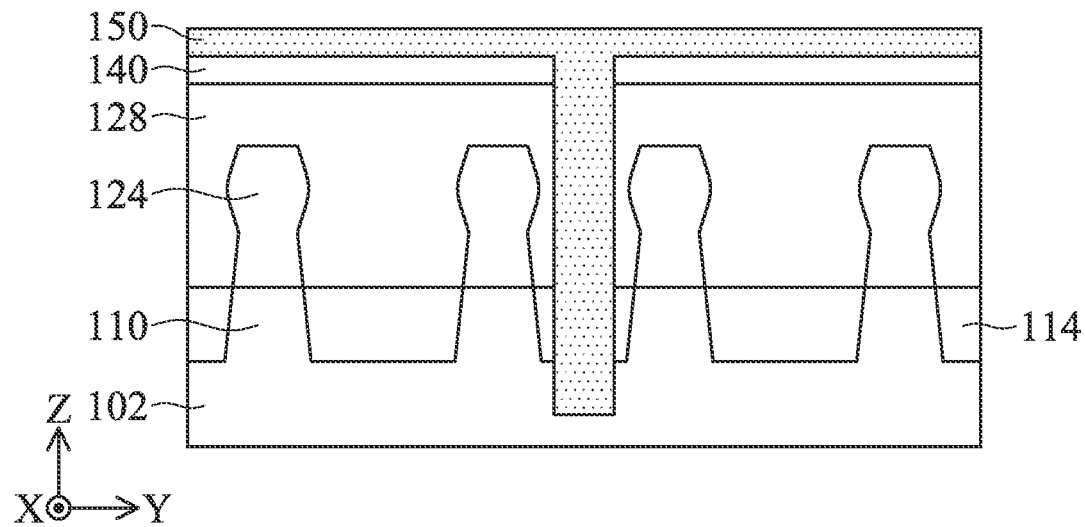
Figure 2D:
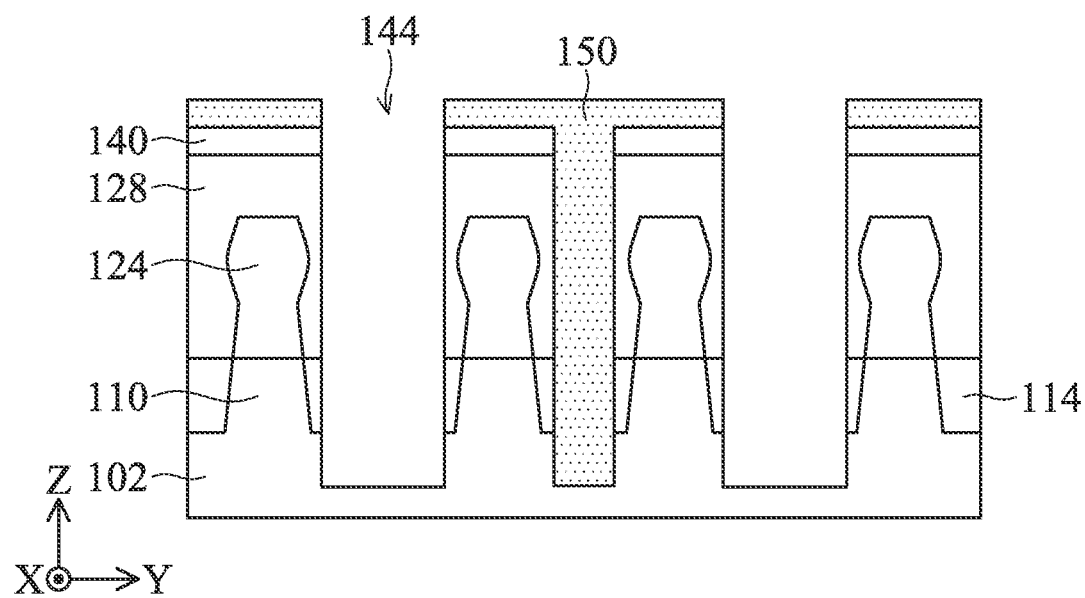
Figure 2E:
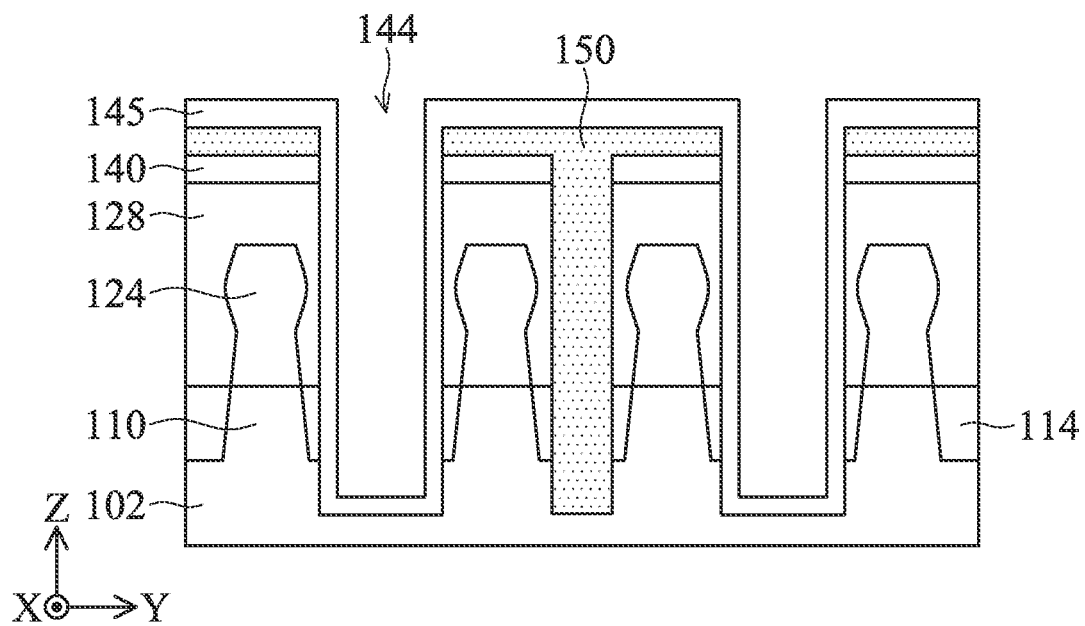
Figure 2F:
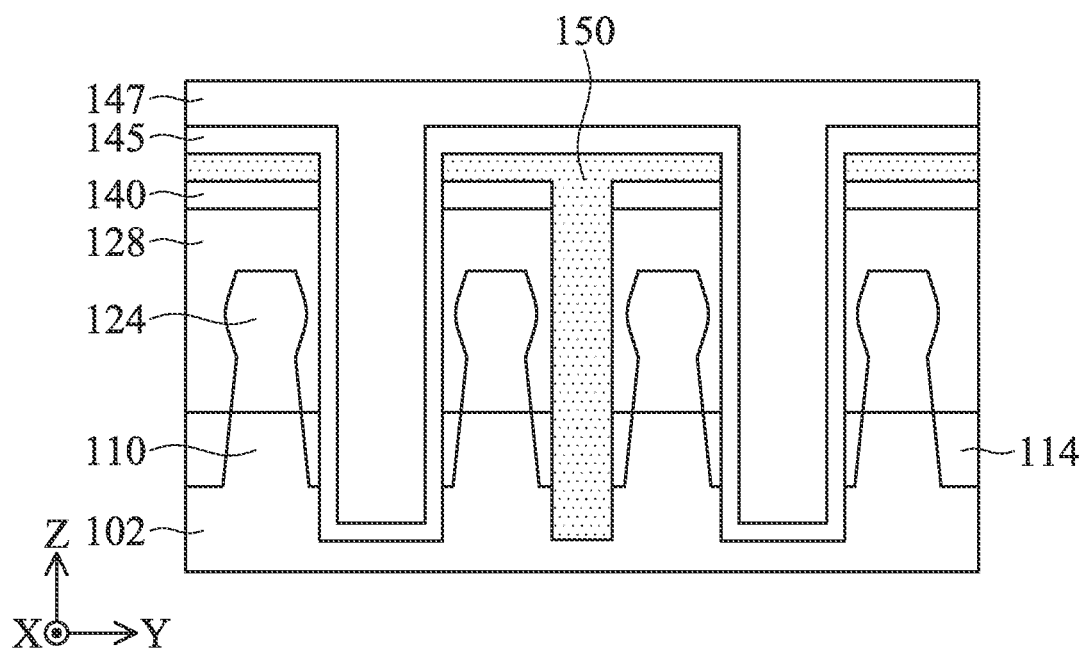
Figure 2G:
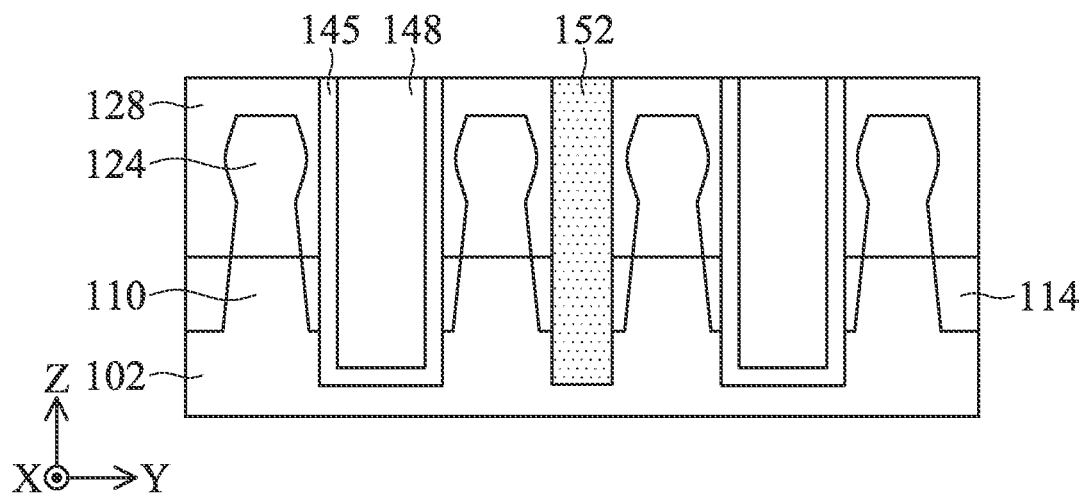
Figure 2H:
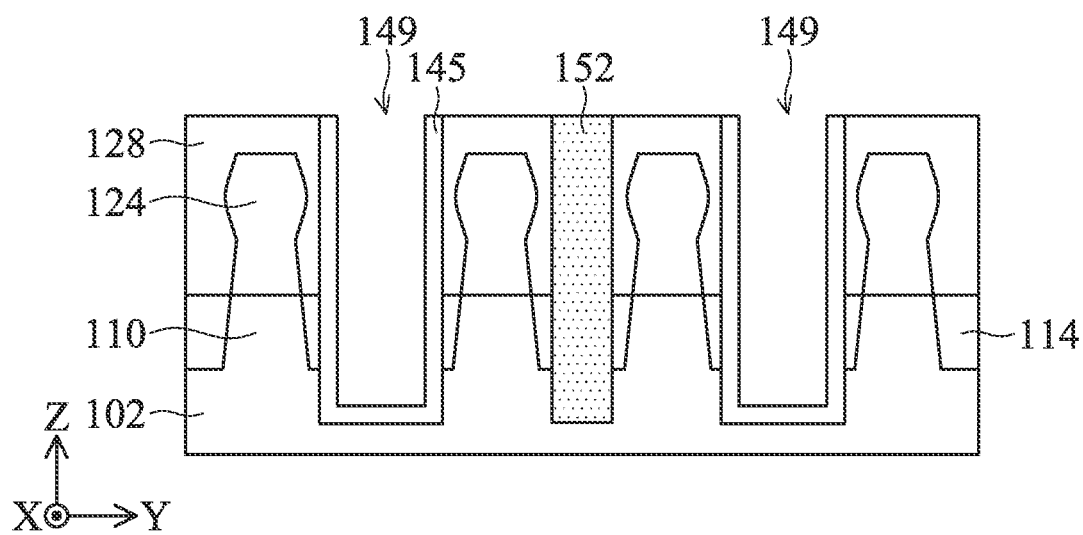
Figure 2I:
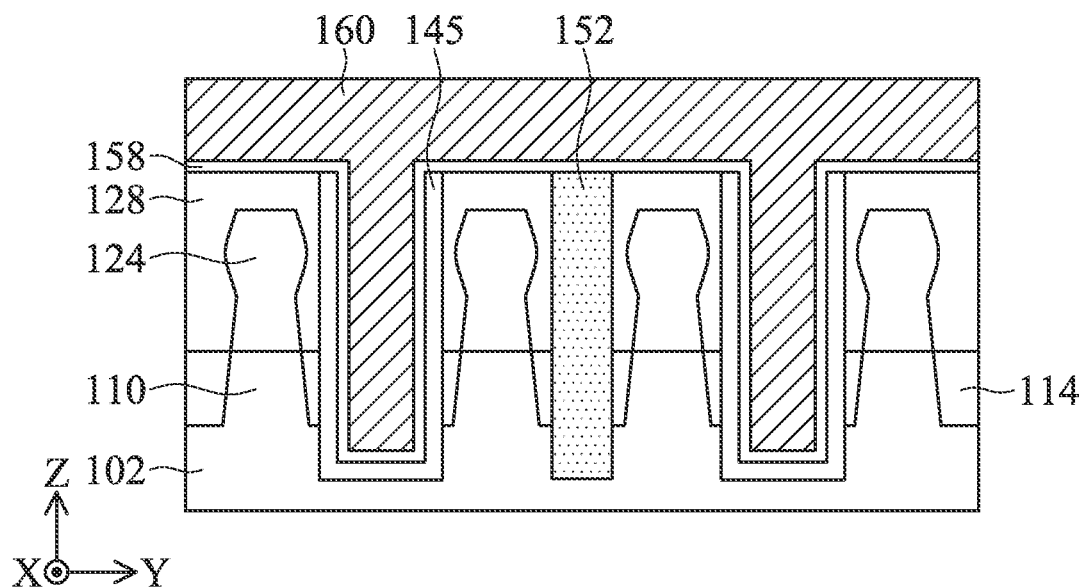
Figure 2J:
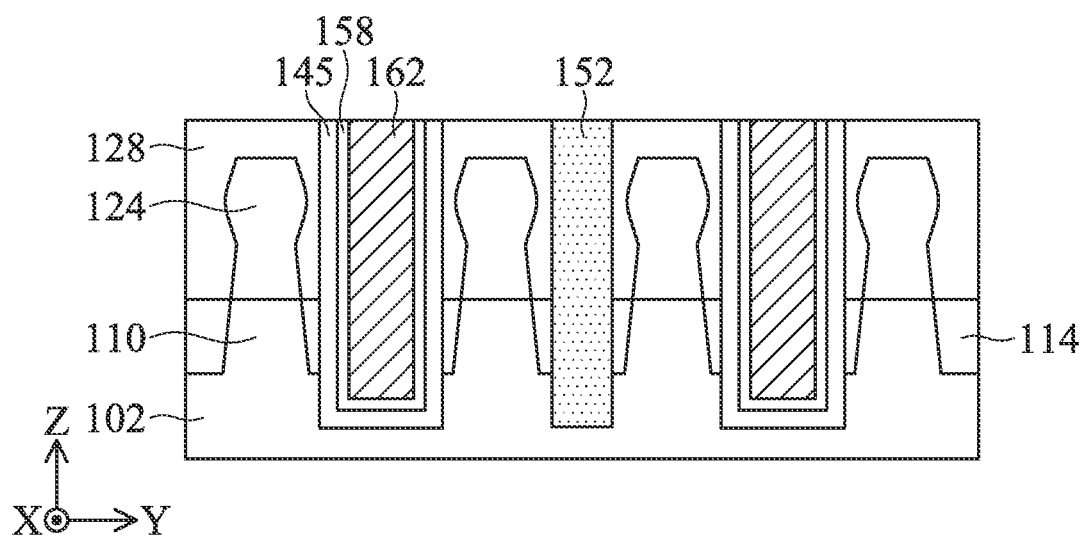
Figure 2K:
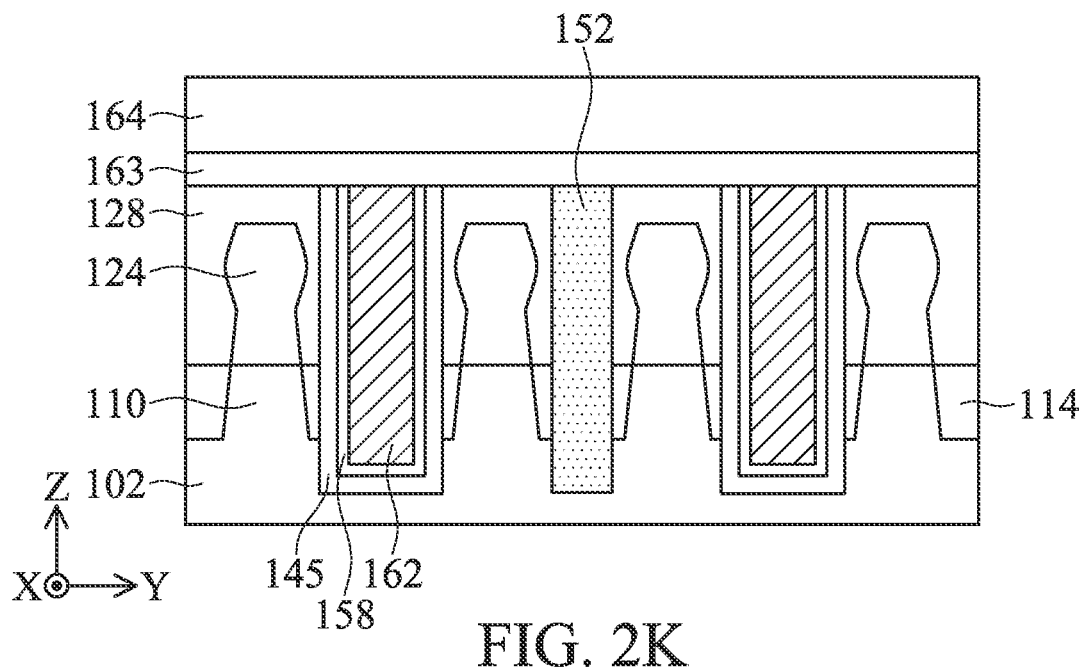
Figure 2L:
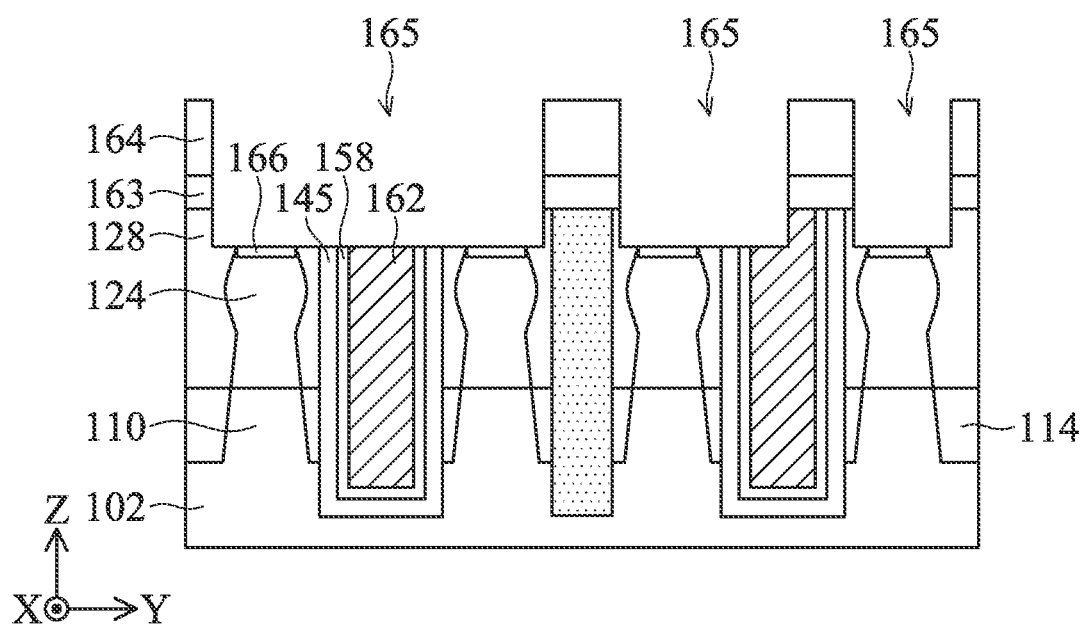
Figure 2M:
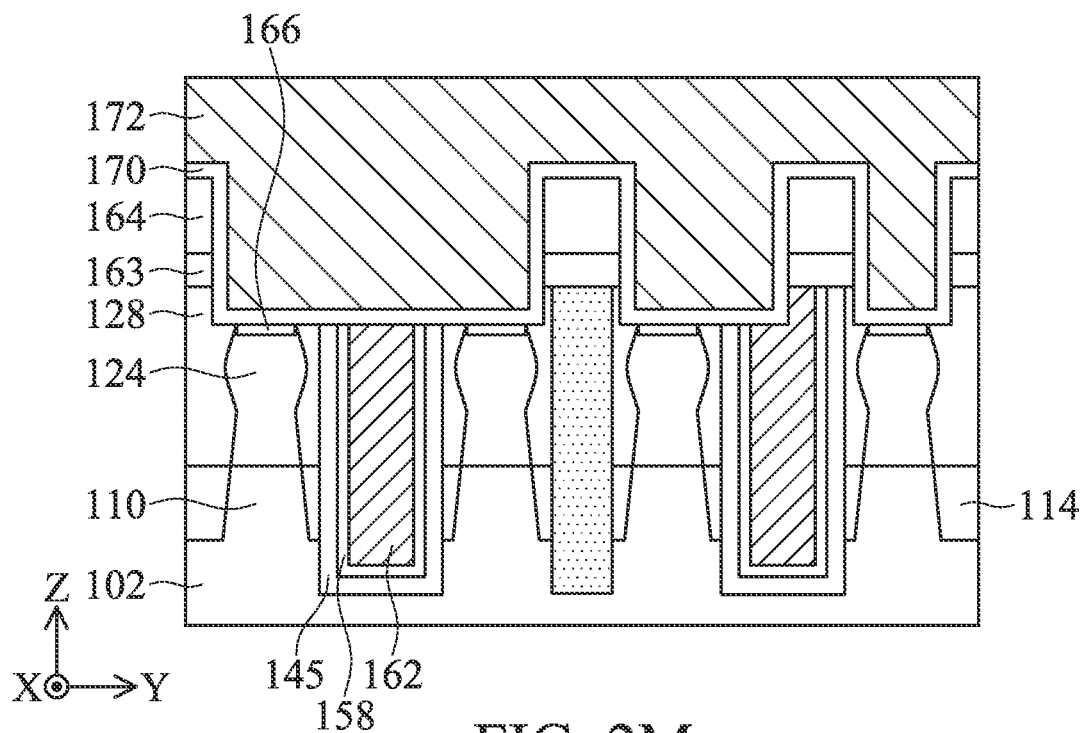
Figure 2N:
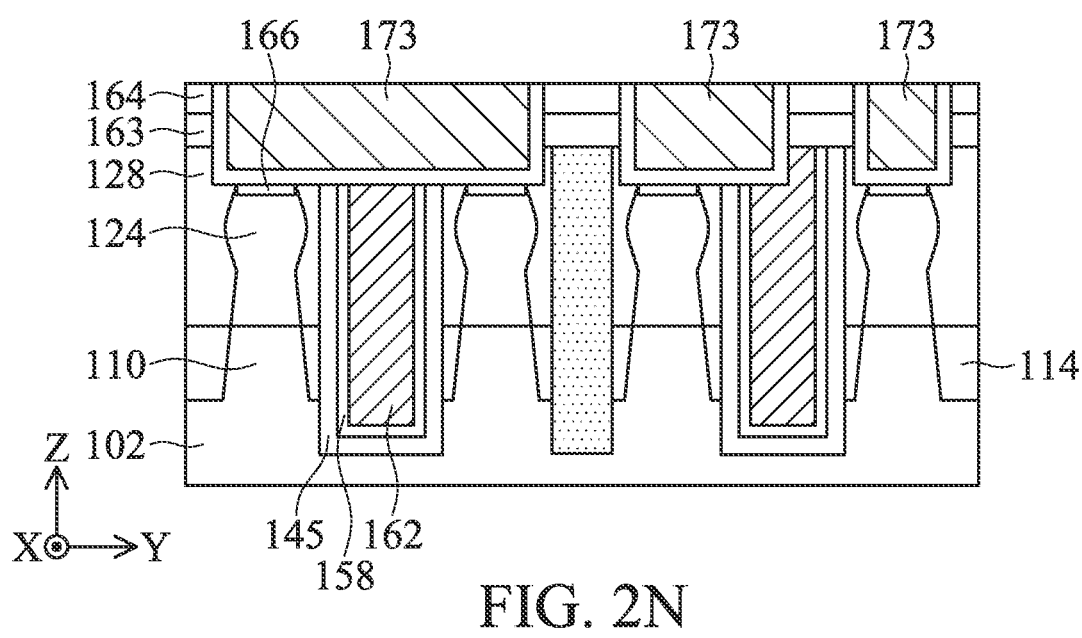
Figure 2O:
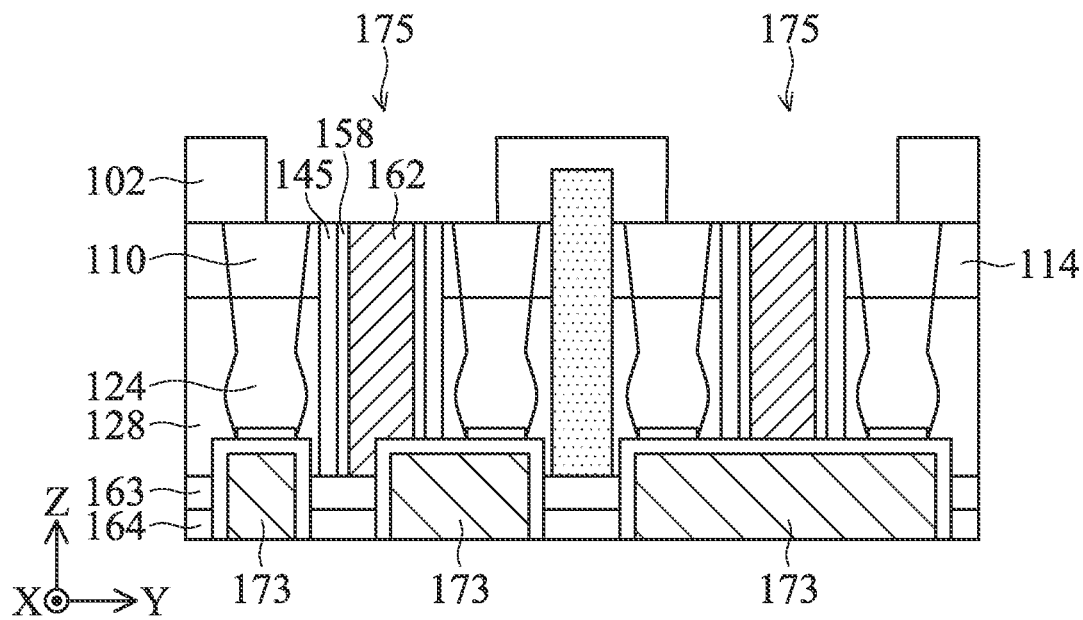
Figure 2P:
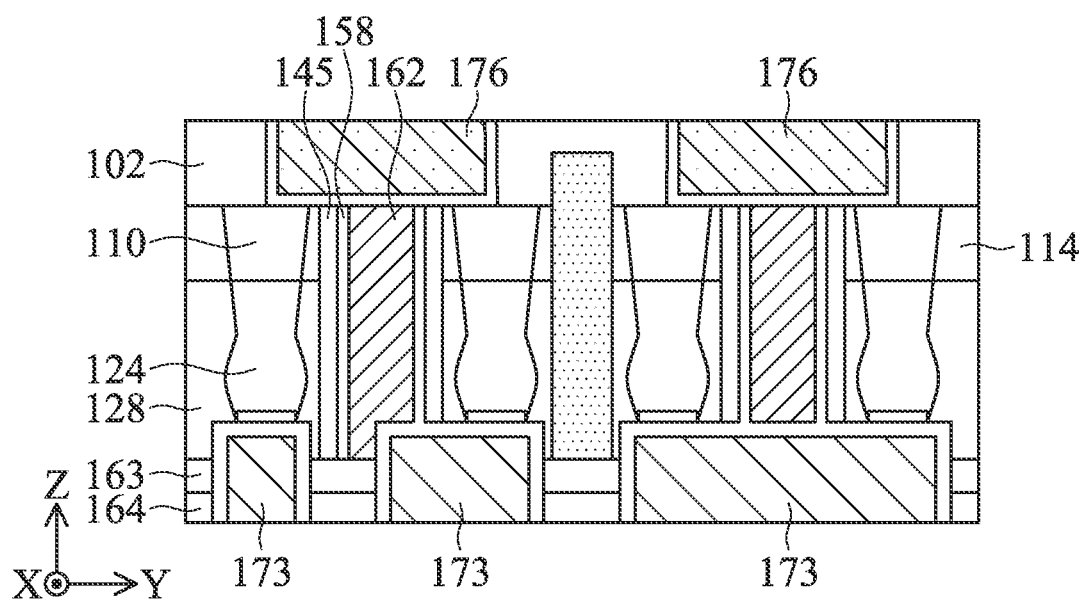
Figure 2Q:
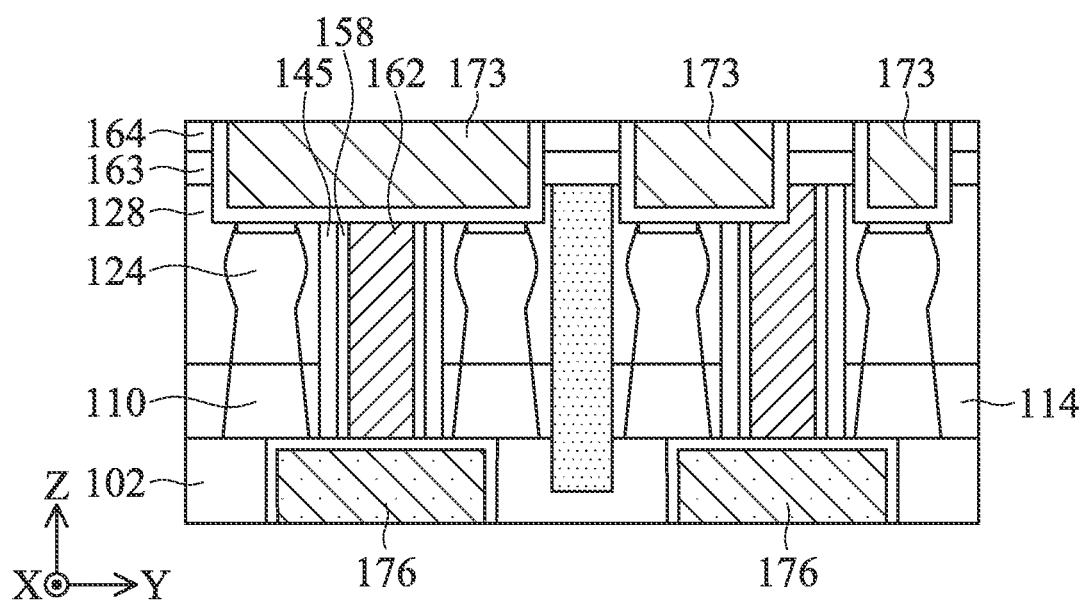

FIGS. 2A-2Q are cross-sectional views of various stages of forming a semiconductor structure, in accordance with some embodiments of the disclosure. It should be noted FIGS. 2A-2Q are illustrated along the line A-A shown in FIG. 1I, but the present disclosure is not limited thereto. As shown in FIG. 2A, a dielectric layer 140 is formed on the ILD structure 128 by a deposition process. The deposition process may include a chemical vapor deposition (CVD) process, a high-density plasma chemical vapor deposition (HDPCVD) process, a spin-on process, a sputtering process, or another applicable process. For example, the dielectric layer 140 includes SiN or any other suitable dielectric material.

Then, as shown in FIG. 2B, a trench 142 is formed in the dielectric layer 140 by an etching process, such as a dry etching process or a wet etching process. In some embodiments, the trench 142 penetrates the dielectric layer 140, the ILD structure 128 and the isolation structure 114, and extends into a portion of the substrate 102. In some embodiments, a bottom surface of the trench 142 is level with a top surface of the substrate 102. In some embodiments, the trench 142 is formed between two adjacent fin structures 110. The S/D structures 124 and the fin structures 110 are not exposed by the trench 142.

Next, as shown in FIG. 2C, an isolation material 150 is filled in the trench 142. In some embodiments, the isolation material 150 overfills the trench 142 and therefore covers the dielectric layer 140. For example, the isolation material 150 includes SiC, SiCN, $GA_2O_3$, diamond, h-BN, p-BN, a-BN, single crystal AlN, p-AlN, or a combination thereof. In some embodiments, the isolation material 150 is deposited by an atomic layer deposition (ALD) process, an atomic layer annealing (ALA) process, a plasma-enhanced chemical vapor deposition (PECVD) process, a physical vapor deposition (PVD) process, or any other suitable process. In some embodiments, the isolation material 150 has a thermal conductivity higher than 4 W/mK.

Then, as shown in FIG. 2D, a plurality of recesses 144 are formed between another two adjacent fin structures 110 by an etching process, such as a dry etching process or a wet etching process. That is, at least one fin structure 110 is located between the recesses 144 and the isolation material 150. The recesses 144 penetrate the dielectric layer 140, the ILD structure 128 and the isolation structure 114, and extend into a portion of the substrate 102. In some embodiments, a bottom surface of the recesses 144 is level with a top surface of the substrate 102.

In some embodiments, as shown in FIG. 2E, liners 145 are formed on the isolation material 150 by a deposition process, such as a chemical vapor deposition (CVD) process, an atomic layer deposition (ALD) process, or another applicable process. The liners 145 are also deposited in the recesses 144. In some embodiments, the liners 145 are conformally formed on the isolation material 150 and sidewalls and a bottom surface of each of the recesses 144. For example, the liners 145 include SiN or any other suitable dielectric material. Next, as shown in FIG. 2F, a sacrificial material 147 overfills the recesses 144 and therefore covers the liners 145. For example, the sacrificial material 147 includes an oxide material or any other suitable material.

In some embodiments, as shown in FIG. 2G, a planarization process is performed on the sacrificial material 147. For example, the planarization process may be a grinding process, a chemical mechanical polish (CMP) process, an etching process or any other suitable process. After the planarization process is completed, an isolation structure 152 is formed, and a sacrificial layer 148 is formed within the liners 145. In some embodiments, a top surface of the sacrificial layer 148 is substantially level with a top surface of the liners 145 and a top surface of the isolation structure 152. Next, as shown in FIG. 2H, the sacrificial layer 148 is removed by an etching process, such as a dry etching process or a wet etching process. A plurality of recesses 149 are formed for subsequent deposition process.

In some embodiments, as shown in FIG. 2I, a barrier layer 158 is deposited on the ILD structure 128 and in the recesses 149, and a conductive material 160 is formed over the barrier layer 158. For example, the barrier layer 158 is made of tantalum (Ta), tantalum nitride (TaN), titanium (Ti), titanium nitride (TiN), cobalt tungsten (CoW) or another applicable material. In some embodiments, the barrier layer 158 is formed by a deposition process, such as a chemical vapor deposition (CVD) process, physical vapor deposition (PVD) process, atomic layer deposition (ALD) process, plating process or another application process. In some embodiments, the second conductive material 160 is made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the conductive material 160 is formed by a deposition process, such as a chemical vapor deposition (CVD) process, physical vapor deposition (PVD) process, atomic layer deposition (ALD) process, plating process or another application process.

Then, as shown in FIG. 2J, a planarization process is performed on the conductive material 160. For example, the planarization process may be a grinding process, a chemical mechanical polish (CMP) process, an etching process or any other suitable process. After the planarization process is completed, a plurality of conductive vias 162 are formed. In some embodiments, as shown in FIG. 2K, a plurality of passivation layers 163 and 164 are successively formed over the isolation structure 152 and the conductive vias 162. Next, as shown in FIG. 2L, a plurality of trenches 165 are formed in the passivation layers 163 and 164 by an etching process, such as a dry etching process or a wet etching process. In some embodiments, an adhesive layer 166 is formed on the bottom of the trenches 165 and over the S/D structures 124. The adhesive layer 166 is exposed from the trenches 165. For example, the adhesive layer 166 includes silicide or any other suitable material.

In some embodiments, as shown in FIG. 2M, a seed layer 170 is formed on the passivation layer 164 and on sidewalls and a bottom surface of the trenches 165, a conductive material 172 is formed on the seed layer 170. In some embodiments, the seed layer 170 is a metal layer, which may be a single layer or a composite layer comprising a plurality of sub-layers formed of different materials. In some embodiments, the seed layer 170 includes a titanium layer and a copper layer over the titanium layer. The seed layer may be formed using, for example, PVD or the like. In some embodiments, the conductive material 172 includes Cu, CuAl, Al, or any other suitable material. The conductive material 172 may be formed by plating, such as electroplating or electroless plating, or the like.

Then, as shown in FIG. 2N, a planarization process is performed on the conductive material 172. For example, the planarization process may be a grinding process, a chemical mechanical polish (CMP) process, an etching process or any other suitable process, after the planarization process is completed, a conductive structure 173 is formed. In some embodiments, as shown in FIG. 2O, the overall semiconductor structure is flipped, and a plurality of trenches 175 are formed in the substrate 102. In some embodiments, before forming the trenches 175, the substrate 102 is thinned. For example, the substrate 102 is thinned by a CMP process or any other suitable process, and a remaining thickness of the thinned substrate 102 is in a range from about 50 μm to about 200 μm. The trenches 175 expose the conductive vias 162. Next, as shown in FIG. 2P, a conductive structure 176 is formed in the trenches 175. In some embodiments, the conductive structure 176 includes Cu, CuAl, Al, or any other suitable material. It is noted that the conductive structure 176 may be formed by the similar processes as forming the conductive structure 173. After that, as shown in FIG. 2Q, the overall semiconductor structure is flipped for performing subsequent processes.

Figure 2R:
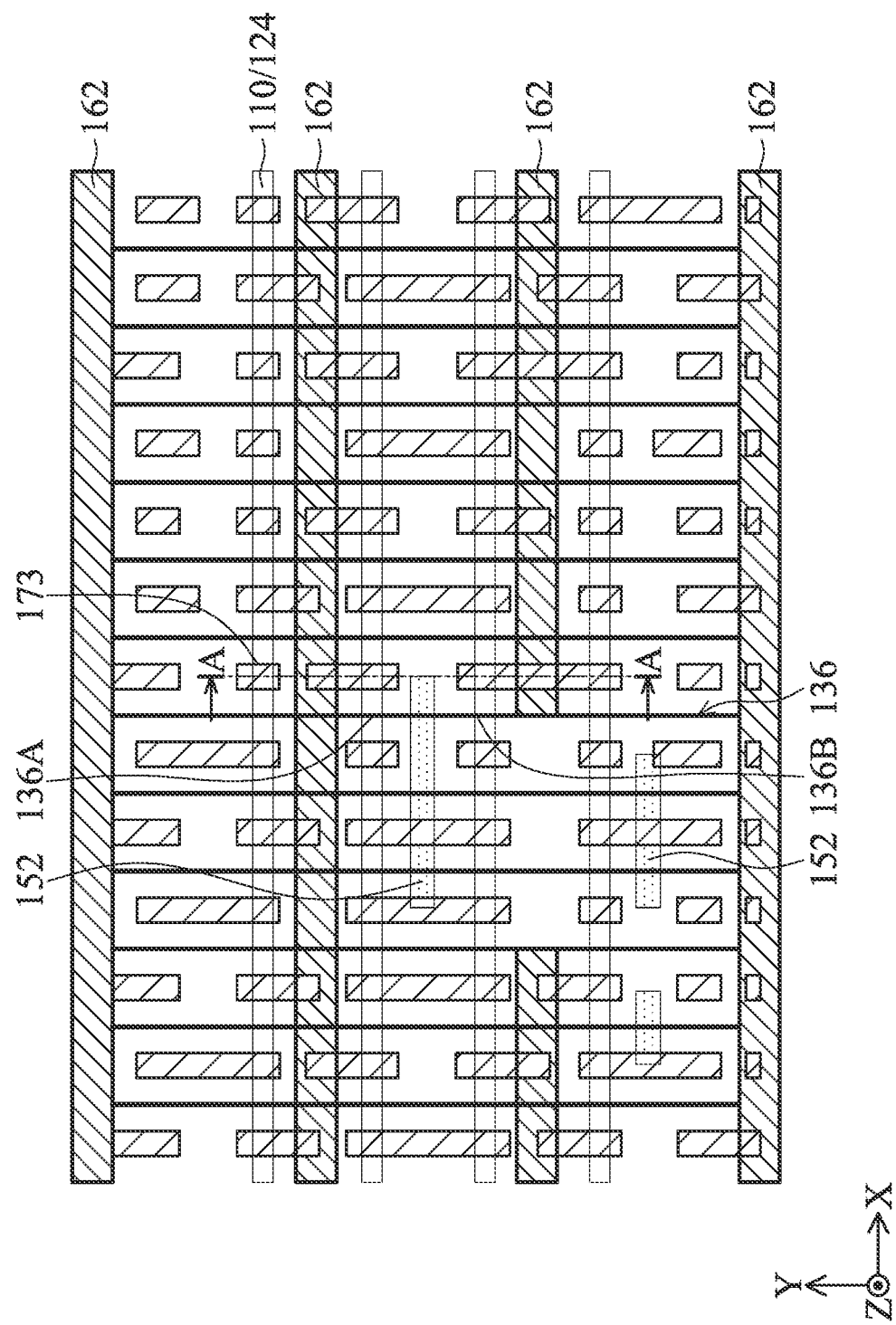

FIG. 2R illustrates a layout of the semiconductor structure, in accordance with some embodiments of the disclosure. As shown in FIG. 2R, the gate structure 136 is formed across the fin structures 110. The isolation structure 152 separates the gate structure 136 into a first region 136A and a second region 136B. In some embodiments, the isolation structure 152 and the conductive structure 173 is partially overlapped with each other in a vertical direction. Since the isolation structure 152 has a relative high thermal conductivity (for example, greater than 4), the formation of the isolation structure 152 helps to dissipate the heat generated by the semiconductor structure.

Figure 3A:
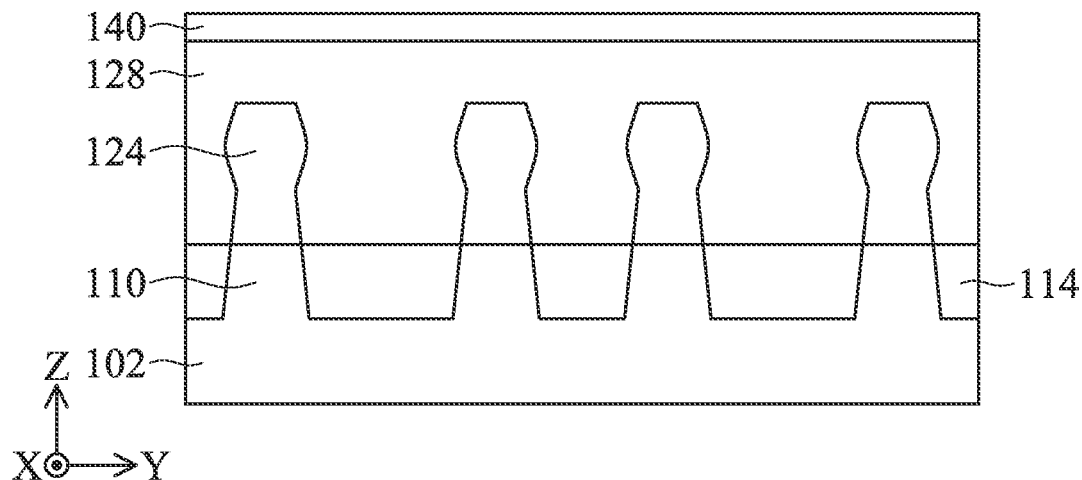
FIGS. 3A-3O are cross-sectional views of various stages of forming a semiconductor structure, in accordance with some embodiments of the disclosure.
Figure 3B:
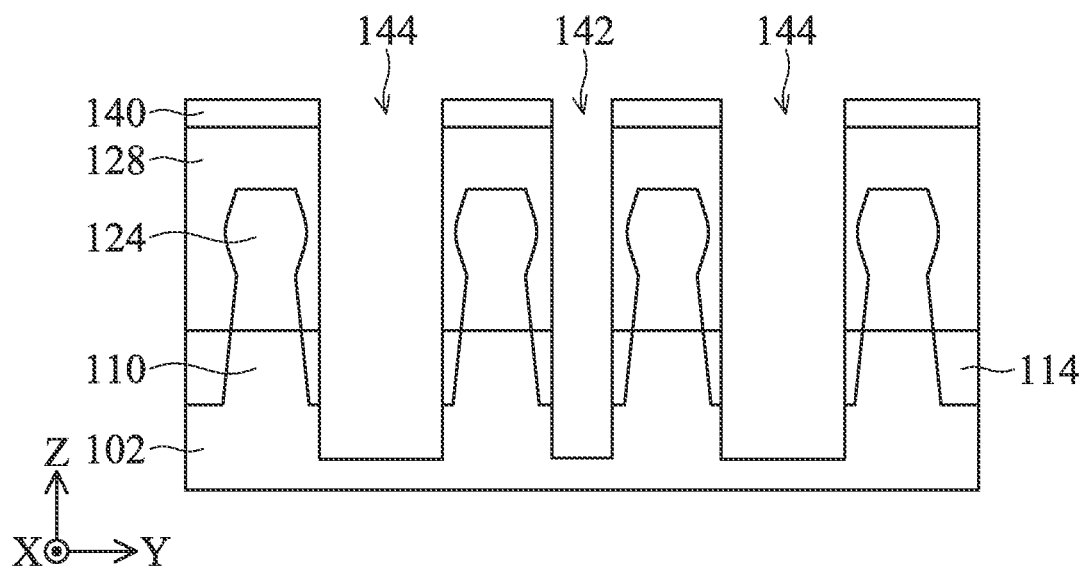
Figure 3C:
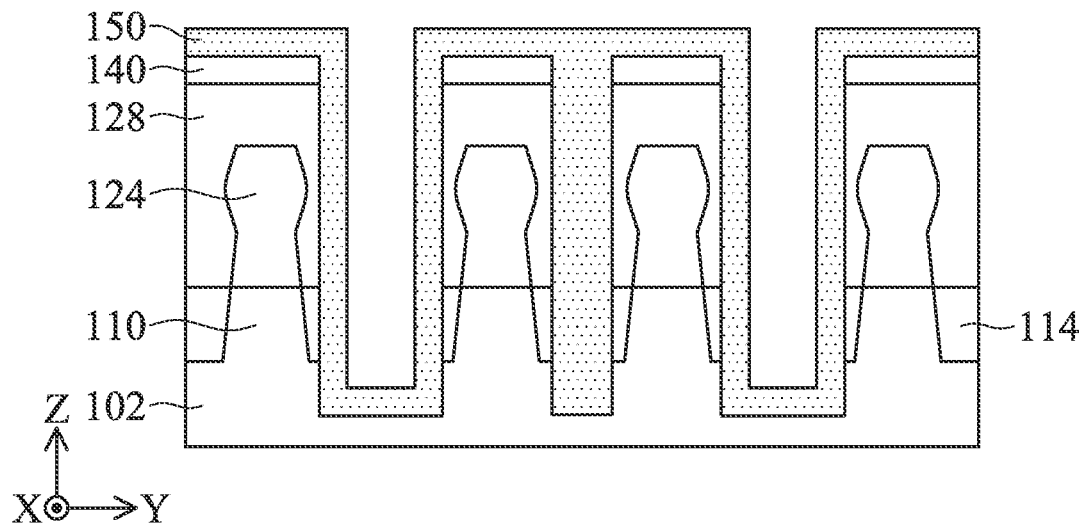
Figure 3D:
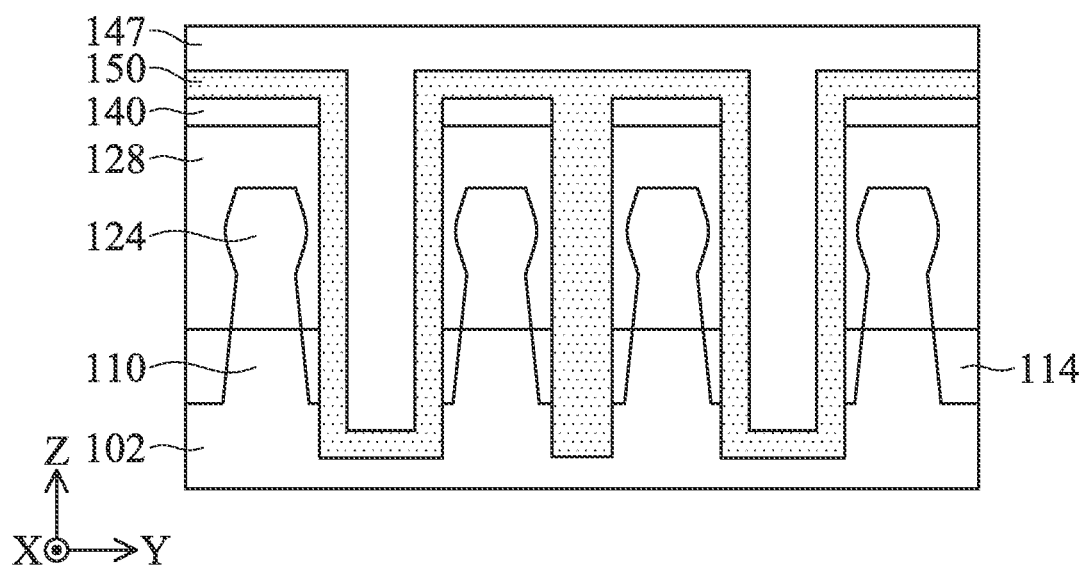
Figure 3E:
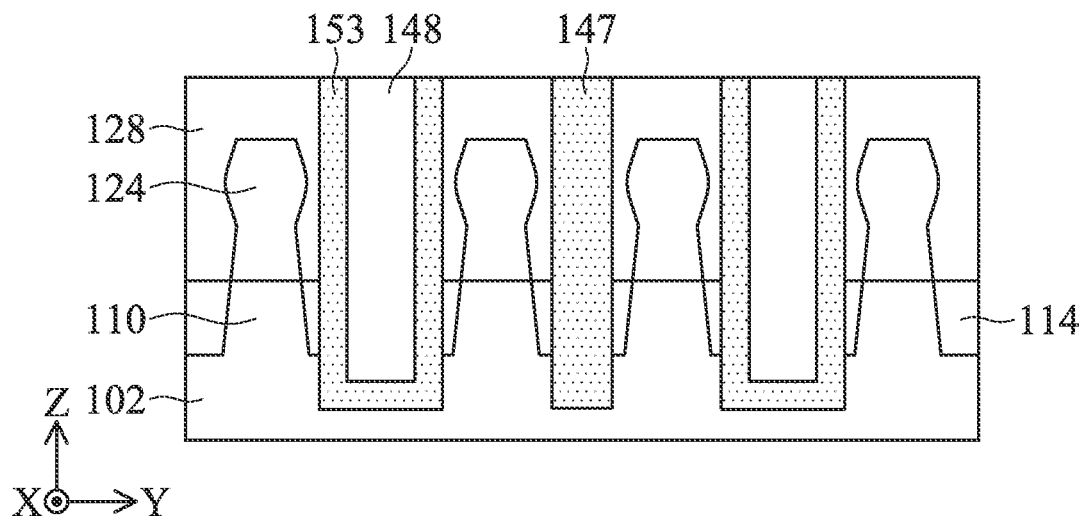
Figure 3F:
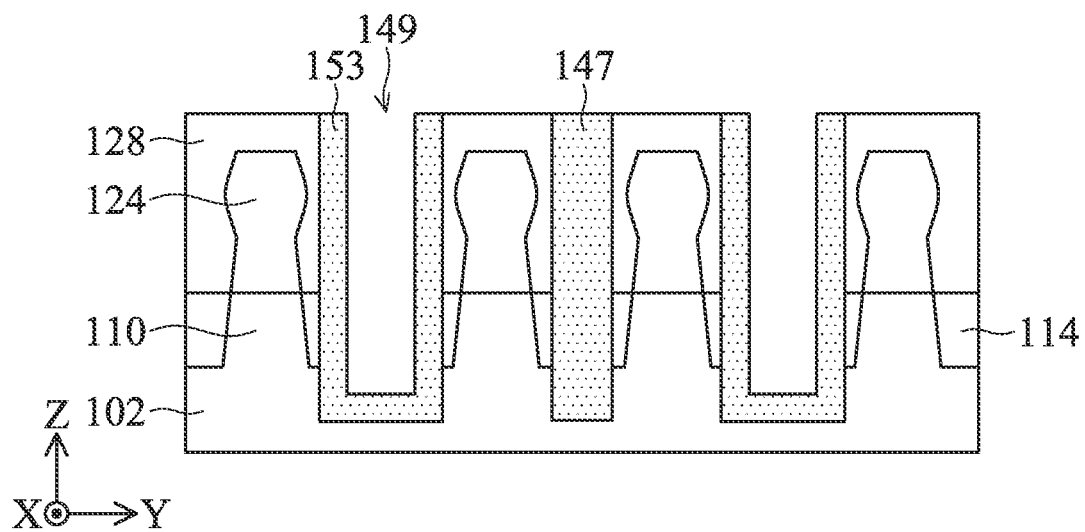
Figure 3G:
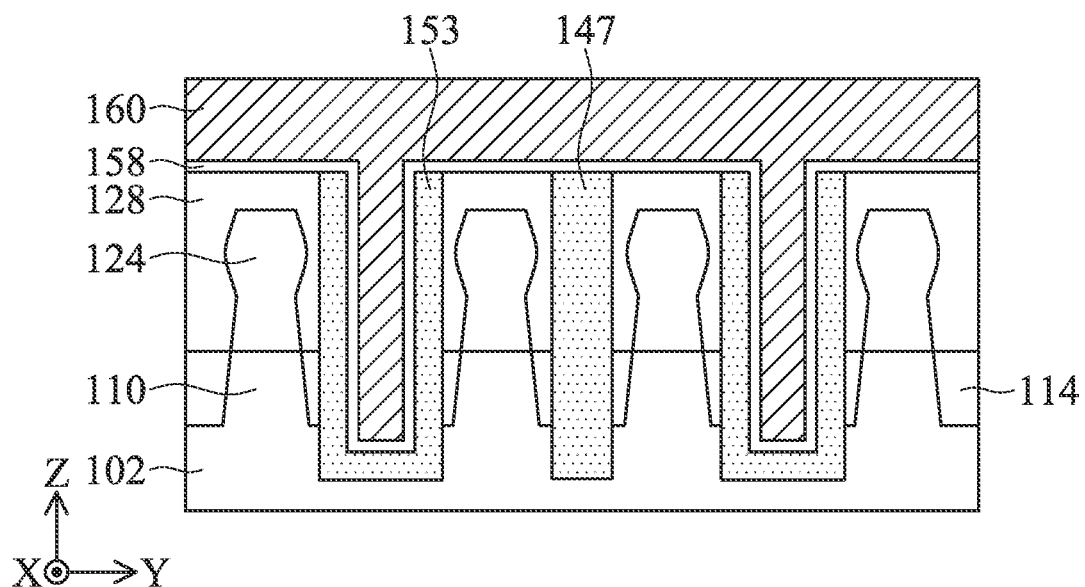
Figure 3H:
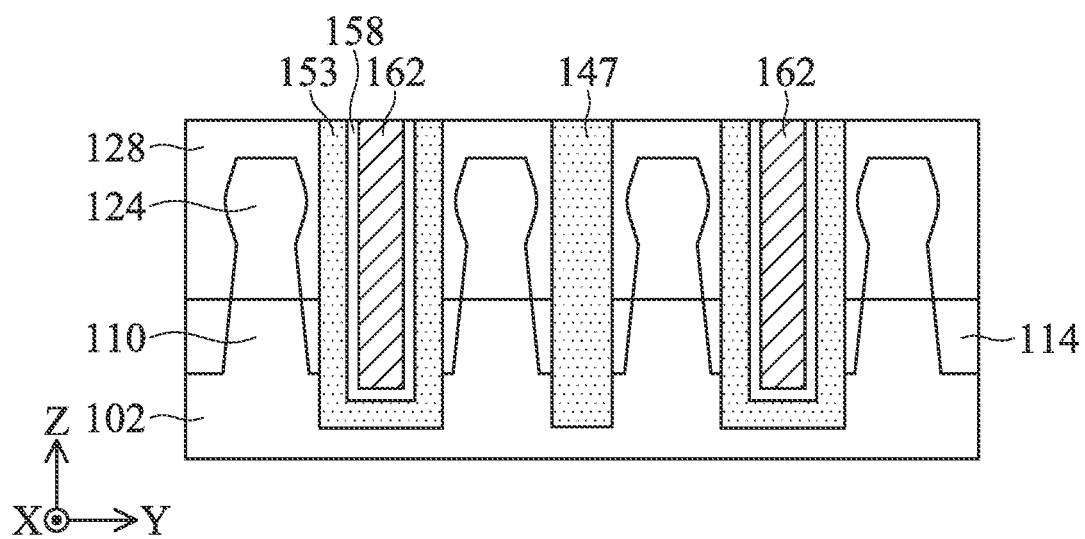
Figure 3I:
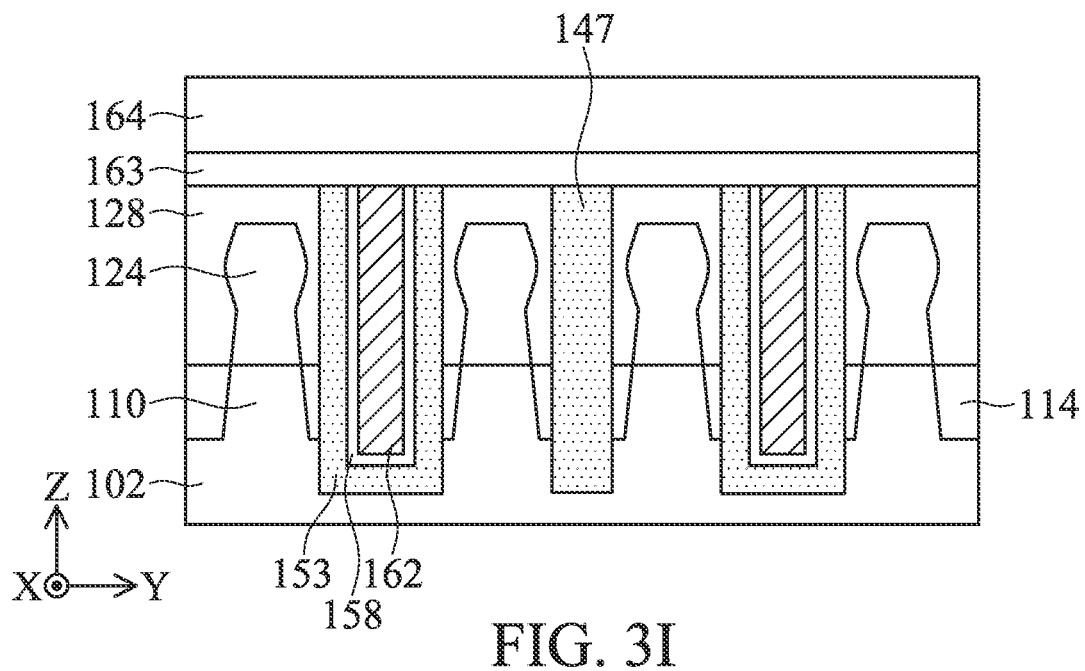
Figure 3J:
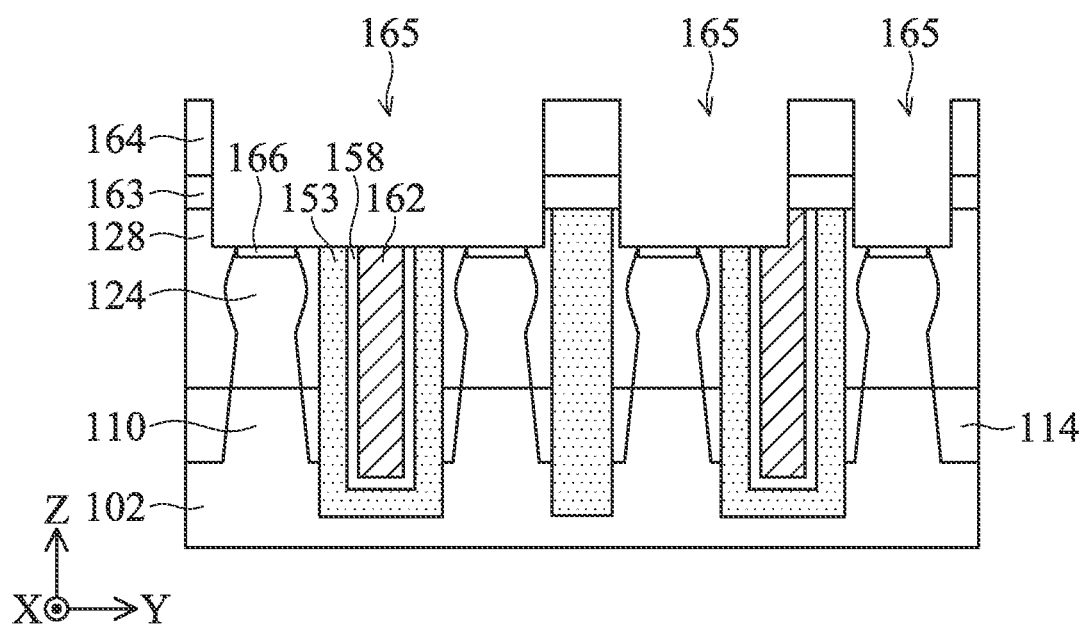
Figure 3K:
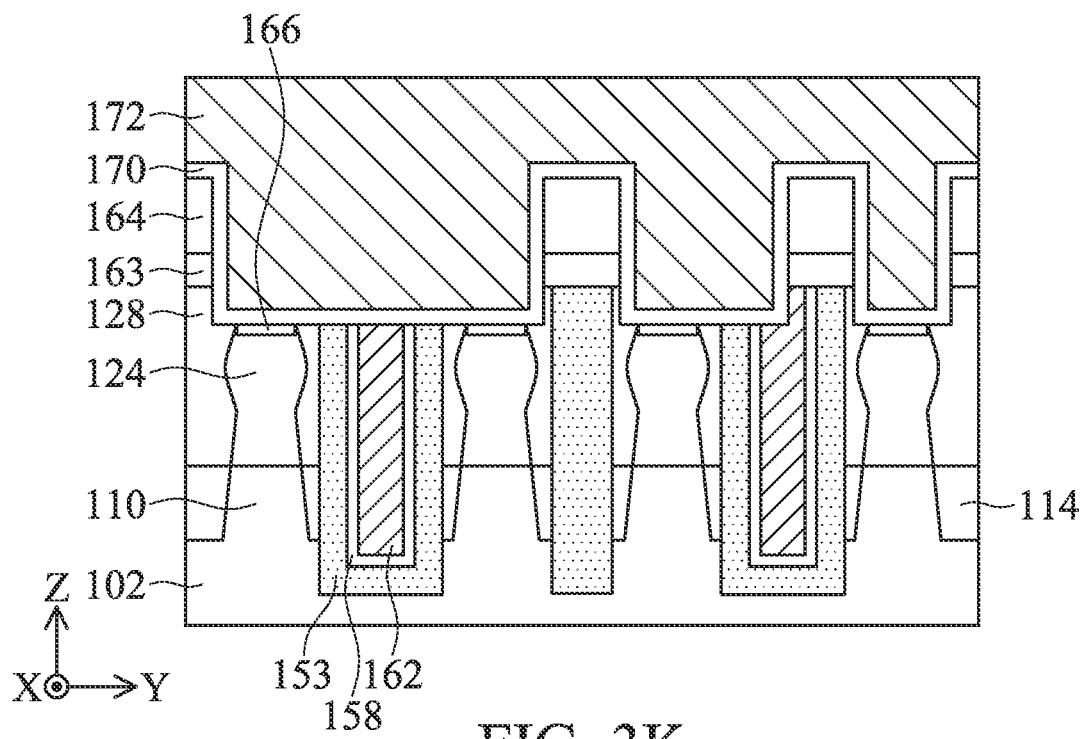
Figure 3L:
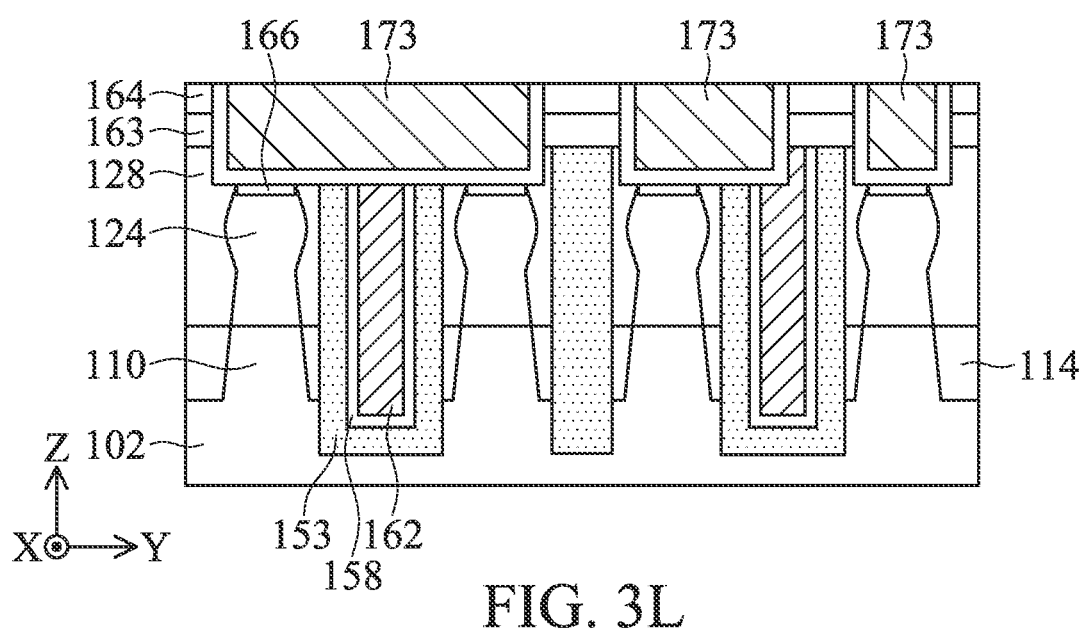
Figure 3M:
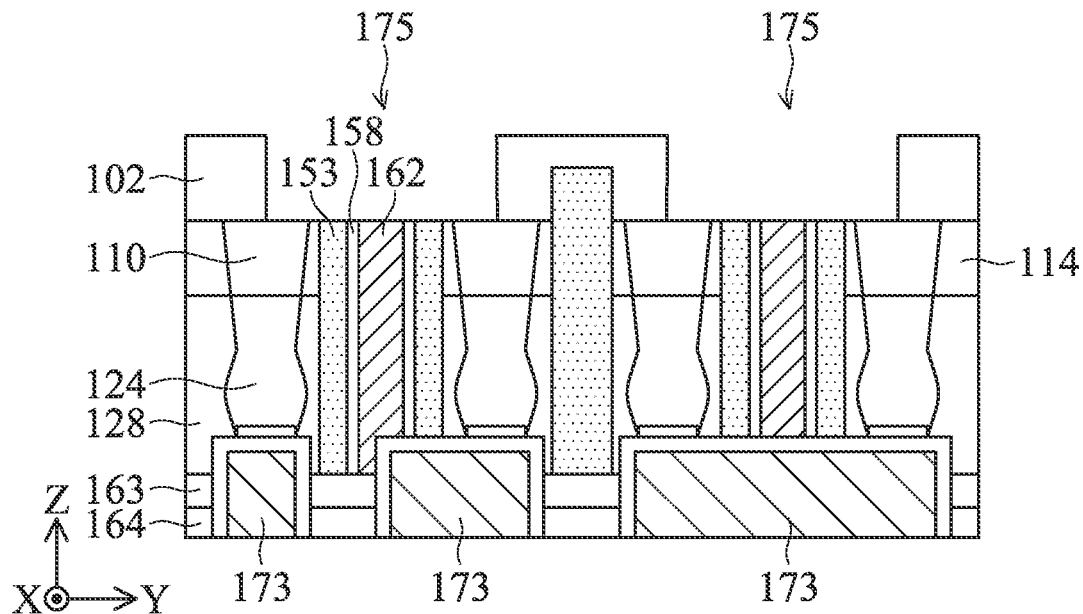
Figure 3N:
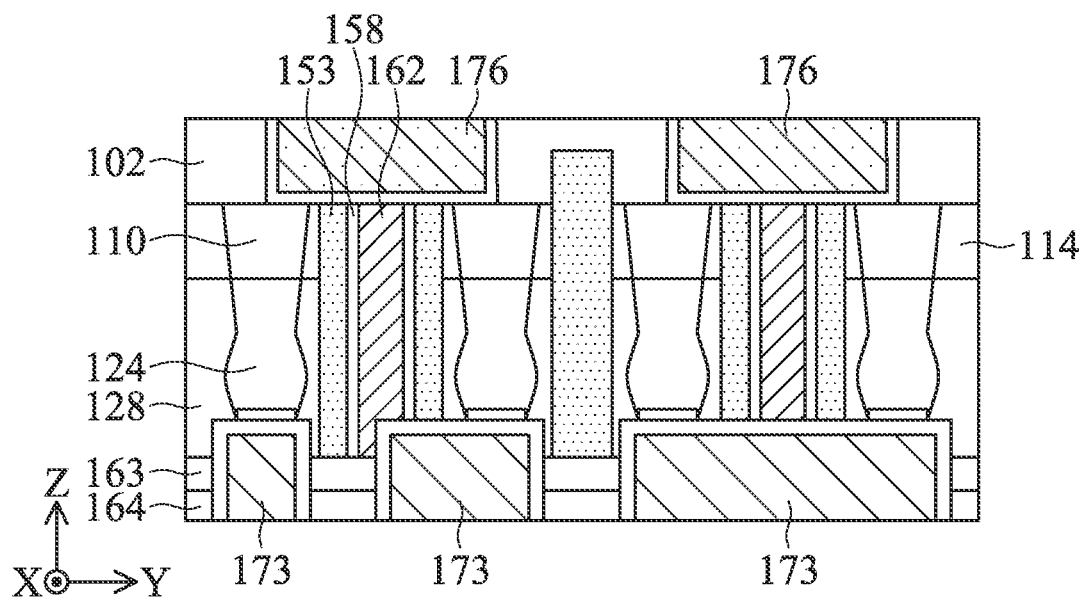
Figure 3O:
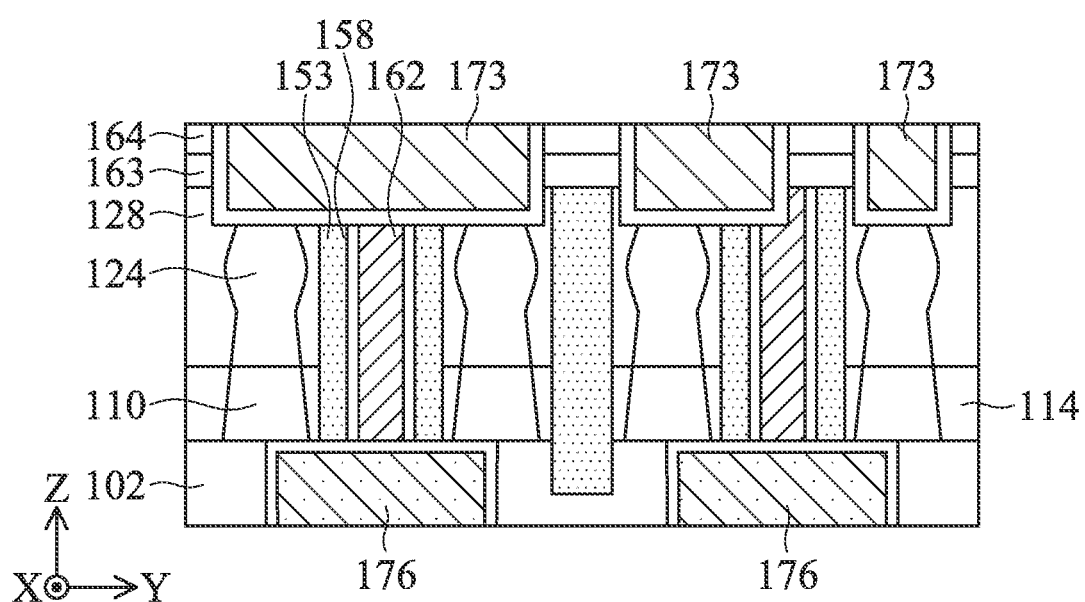

FIGS. 3A-3O are cross-sectional views of various stages of forming a semiconductor structure, in accordance with some embodiments of the disclosure. It should be noted FIGS. 3A-3O are illustrated along the line A-A shown in FIG. 1I, but the present disclosure is not limited thereto. As shown in FIG. 3A, a dielectric layer 140 is formed on the ILD structure 128 by a deposition process. The deposition process may include a chemical vapor deposition (CVD) process, a high-density plasma chemical vapor deposition (HDPCVD) process, a spin-on process, a sputtering process, or another applicable process. For example, the dielectric layer 140 includes SiN or any other suitable dielectric material.

Then, as shown in FIG. 3B, a trench 142 and a plurality of recesses 144 are formed in the dielectric layer 140 by an etching process, such as a dry etching process or a wet etching process. In some embodiments, the trench 142 and the recesses 144 penetrate the dielectric layer 140, the ILD structure 128 and the isolation structure 114, and extend into a portion of the substrate 102. In some embodiments, bottom surfaces of the trench 142 and the recesses 144 are level with a top surface of the substrate 102. In some embodiments, the trench 142 is formed between two adjacent fin structures 110, and the recesses 144 are formed between another two adjacent fin structures 110. That is, at least one fin structure 110 is located between one of the recesses 144 and the trench 142. In some embodiments, the S/D structures 124 and the fin structures 110 may not be exposed by the trench 142.

Next, as shown in FIG. 3C, an isolation material 150 is filled in the trench 142 and the recesses 144. In some embodiments, the isolation material 150 overfills the trench 142 and is conformally formed on sidewalls and a bottom surface of each of the recesses 144. For example, the isolation material 150 includes SiC, SiCN, $GA_2O_3$, diamond, h-BN, p-BN, a-BN, single crystal AlN, p-AlN, or a combination thereof. In some embodiments, the isolation material 150 is deposited by an atomic layer deposition (ALD) process, an atomic layer annealing (ALA) process, a plasma-enhanced chemical vapor deposition (PECVD) process, a physical vapor deposition (PVD) process, or any other suitable process. In some embodiments, the isolation material 150 has a thermal conductivity higher than 4 W/mK.

Then, as shown in FIG. 3D, a sacrificial material 147 overfills the recesses 144 and therefore covers the isolation material 150. For example, the sacrificial material 147 includes an oxide material or any other suitable material. In some embodiments, as shown in FIG. 3E, a planarization process is performed on the sacrificial material 147. For example, the planarization process may be a grinding process, a chemical mechanical polish (CMP) process, an etching process or any other suitable process. After the planarization process is completed, an isolation structure 152 is formed in the trench 142, and a sacrificial layer 148 and liners 153 are formed in the recesses 144. It is noted that the isolation structure 152 and the liners 153 are made of the same material. In some embodiments, a top surface of the sacrificial layer 148 is substantially level with a top surface of the liners 153 and a top surface of the isolation structure 152.

Next, as shown in FIG. 3F, the sacrificial layer 148 is removed by an etching process, such as a dry etching process or a wet etching process. A plurality of recesses 149 are formed for subsequent deposition process. In some embodiments, as shown in FIG. 3G, a barrier layer 158 is deposited on the ILD structure 128 and in the recesses 149, and a conductive material 160 is formed over the barrier layer 158. For example, the barrier layer 158 is made of tantalum (Ta), tantalum nitride (TaN), titanium (Ti), titanium nitride (TiN), cobalt tungsten (CoW) or another applicable material. In some embodiments, the barrier layer 158 is formed by a deposition process, such as a chemical vapor deposition (CVD) process, physical vapor deposition (PVD) process, atomic layer deposition (ALD) process, plating process or another application process. In some embodiments, the second conductive material 160 is made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the conductive material 160 is formed by a deposition process, such as a chemical vapor deposition (CVD) process, physical vapor deposition (PVD) process, atomic layer deposition (ALD) process, plating process or another application process.

Then, as shown in FIG. 3H, a planarization process is performed on the conductive material 160. For example, the planarization process may be a grinding process, a chemical mechanical polish (CMP) process, an etching process or any other suitable process. After the planarization process is completed, a plurality of conductive vias 162 are formed. It is noted that since the liners 153 that is adjacent to the conductive vias 162 has a thermal conductivity higher than 4 W/mK, the thermal dissipation of the overall semiconductor structure may be improved.

In some embodiments, as shown in FIG. 3I, a plurality of passivation layers 163 and 164 are successively formed over the isolation structure 152 and the conductive vias 162. Next, as shown in FIG. 3J, a plurality of trenches 165 are formed in the passivation layers 163 and 164 by an etching process, such as a dry etching process or a wet etching process. In some embodiments, an adhesive layer 166 is formed on the bottom of the trenches 165 and over the S/D structures 124. The adhesive layer 166 is exposed from the trenches 165. For example, the adhesive layer 166 includes silicide or any other suitable material.

In some embodiments, as shown in FIG. 3K, a seed layer 170 is formed on the passivation layer 164 and on sidewalls and a bottom surface of the trenches 165, a conductive material 172 is formed on the seed layer 170. In some embodiments, the seed layer 170 is a metal layer, which may be a single layer or a composite layer comprising a plurality of sub-layers formed of different materials. In some embodiments, the seed layer 170 includes a titanium layer and a copper layer over the titanium layer. The seed layer may be formed using, for example, PVD or the like. In some embodiments, the conductive material 172 includes Cu, CuAl, Al, or any other suitable material. The conductive material 172 may be formed by plating, such as electroplating or electroless plating, or the like.

Then, as shown in FIG. 3L, a planarization process is performed on the conductive material 172. For example, the planarization process may be a grinding process, a chemical mechanical polish (CMP) process, an etching process or any other suitable process, after the planarization process is completed, a conductive structure 173 is formed. In some embodiments, as shown in FIG. 3M, the overall semiconductor structure is flipped, and a plurality of trenches 175 are formed in the substrate 102. In some embodiments, before forming the trenches 175, the substrate 102 is thinned. For example, the substrate 102 is thinned by a CMP process or any other suitable process, and a remaining thickness of the thinned substrate 102 is in a range from about 50 μm to about 200 μm. The trenches 175 expose the conductive vias 162. Next, as shown in FIG. 3R, a conductive structure 176 is formed in the trenches 175. In some embodiments, the conductive structure 176 includes Cu, CuAl, Al, or any other suitable material. It is noted that the conductive structure 176 may be formed by the similar processes as forming the conductive structure 173. After that, as shown in FIG. 3O, the overall semiconductor structure is flipped for performing subsequent processes.

Figure 4A:
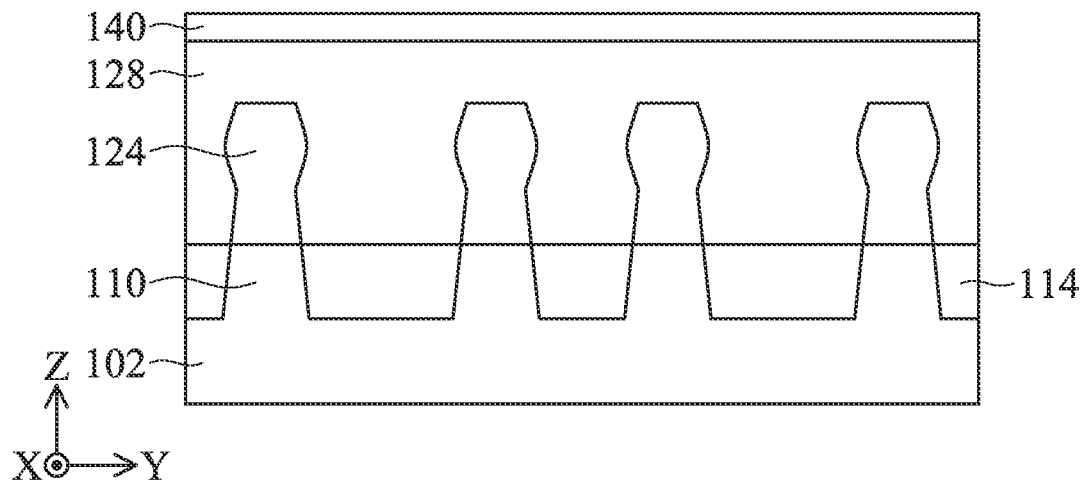
FIGS. 4A-4O are cross-sectional views of various stages of forming a semiconductor structure, in accordance with some embodiments of the disclosure.
Figure 4B:
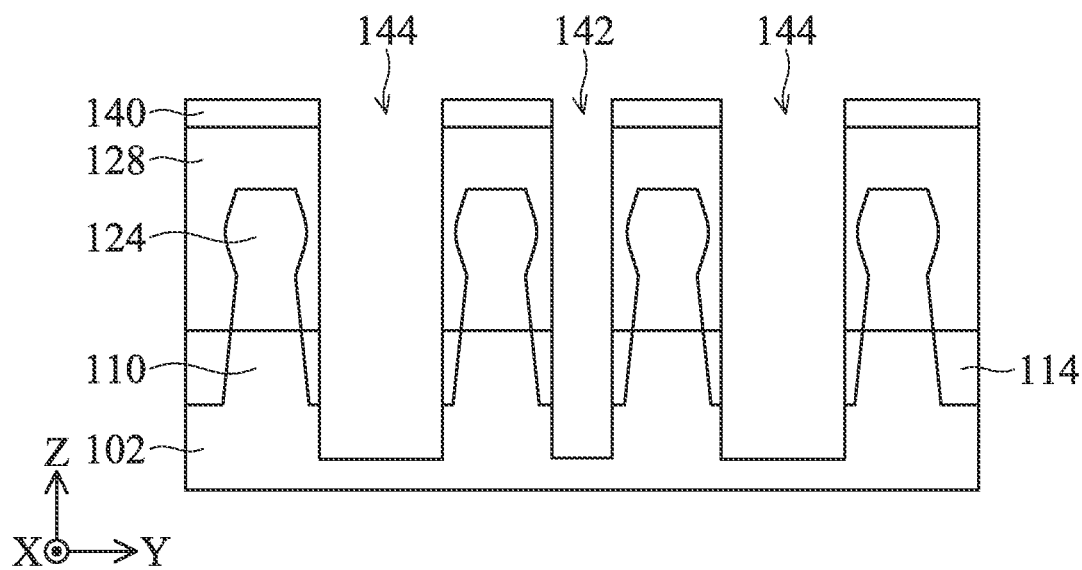
Figure 4C:
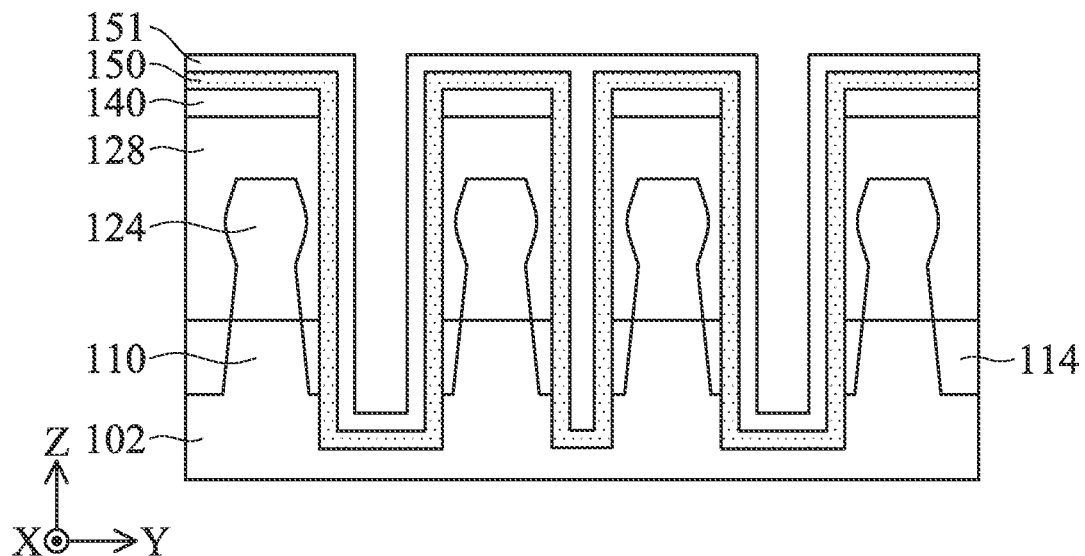
Figure 4D:
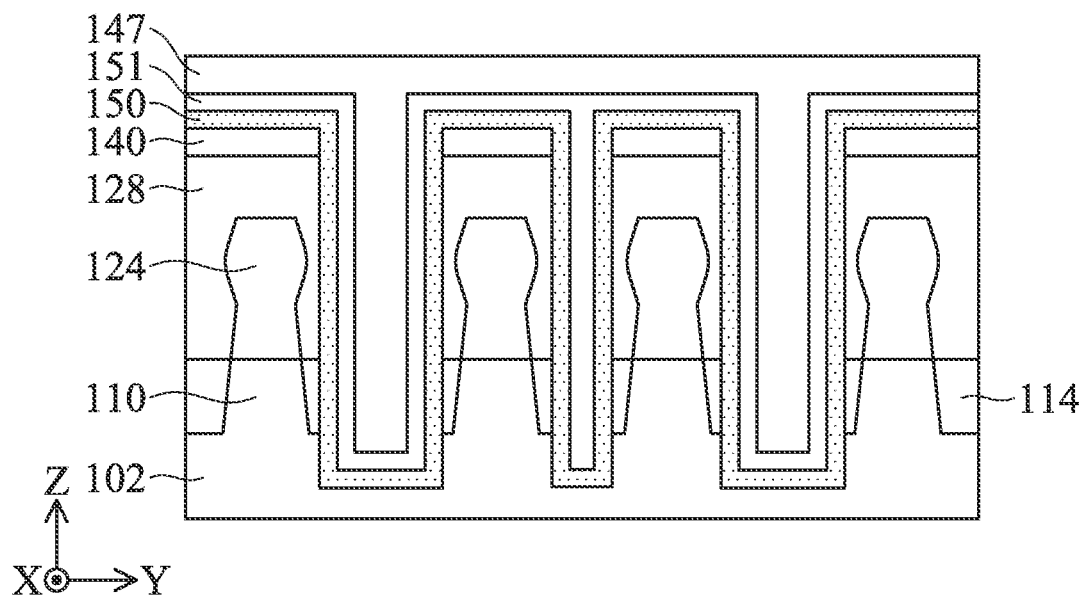
Figure 4E:
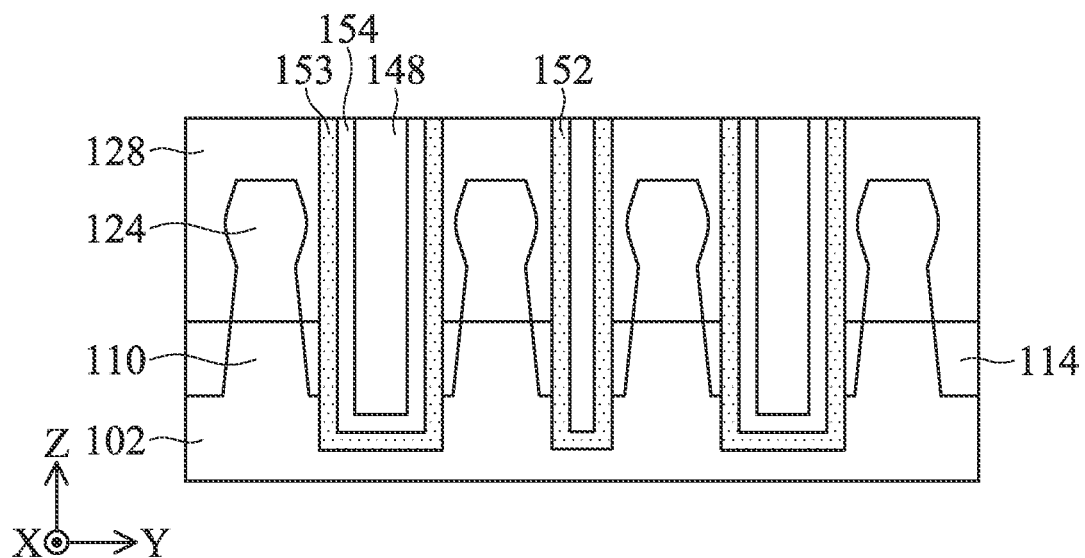
Figure 4F:
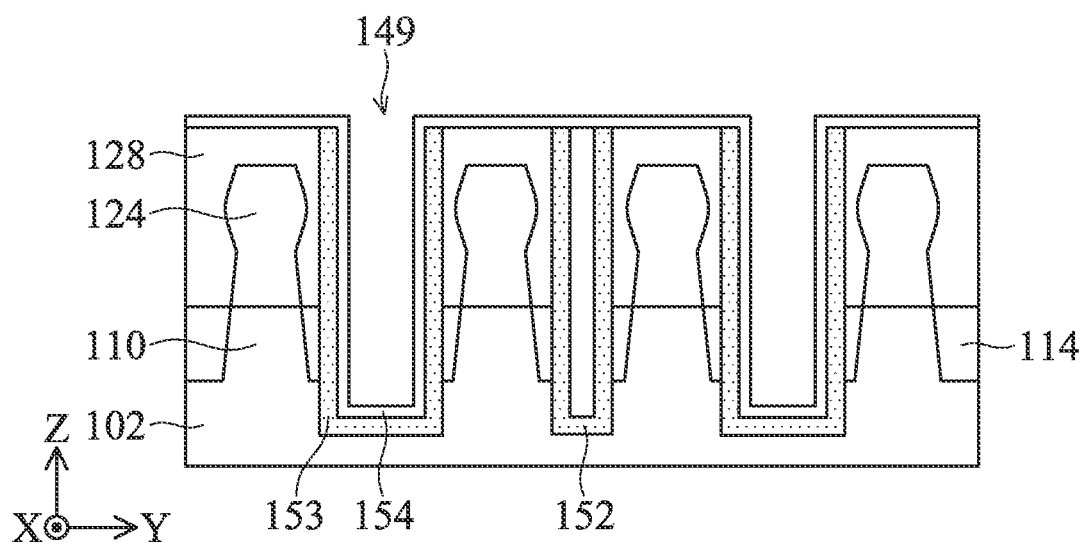
Figure 4G:
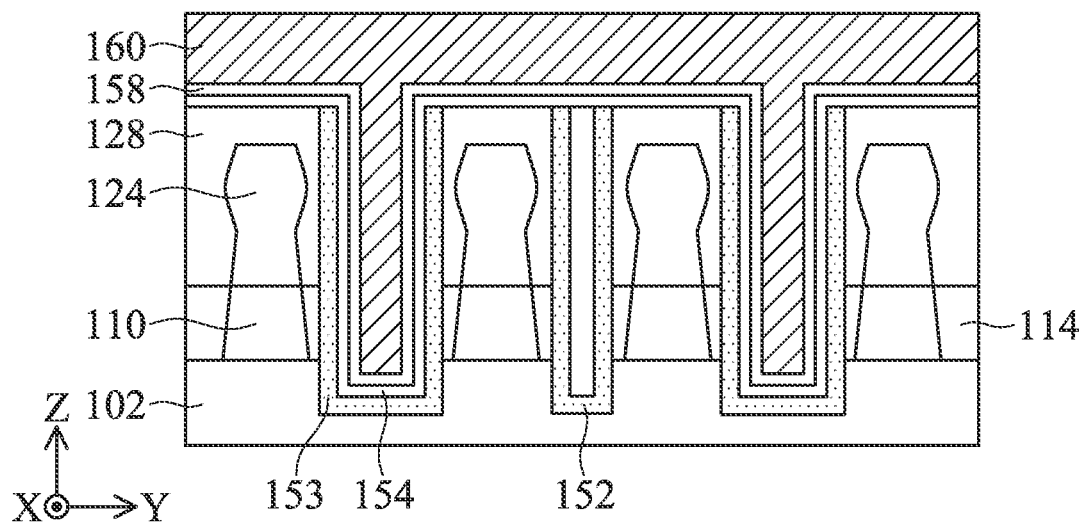
Figure 4H:
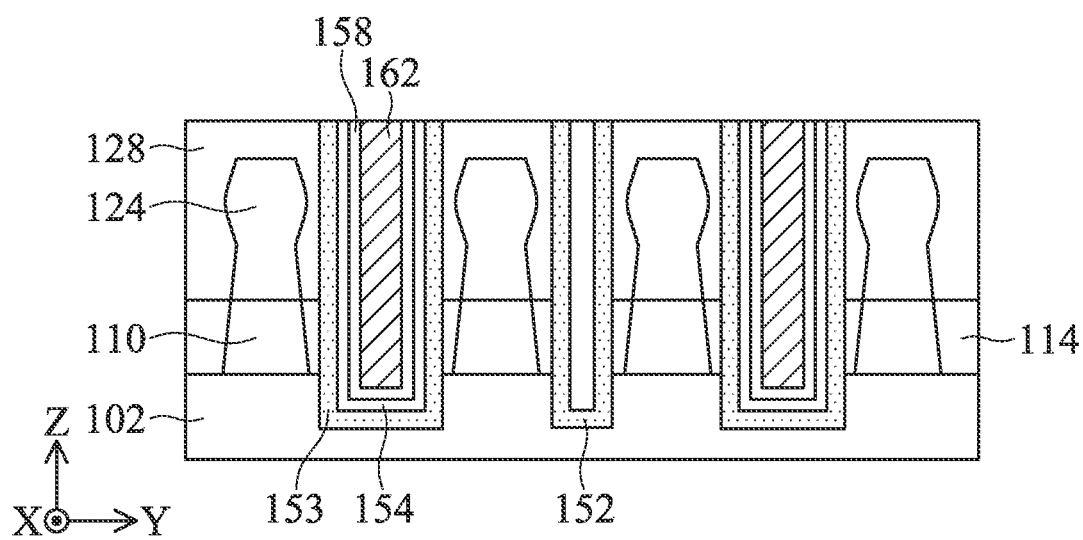
Figure 4I:
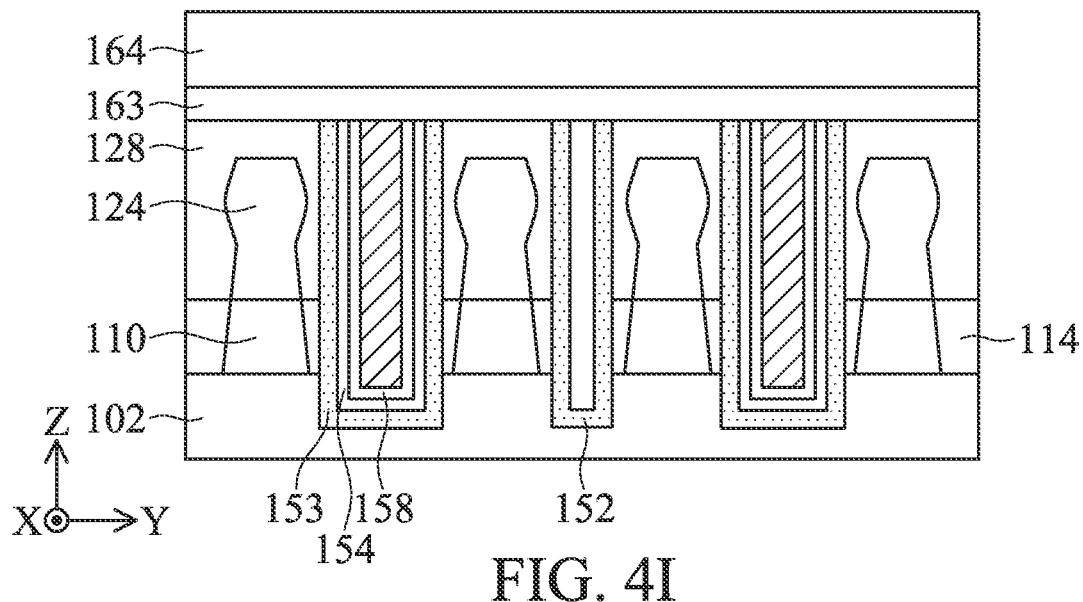
Figure 4J:
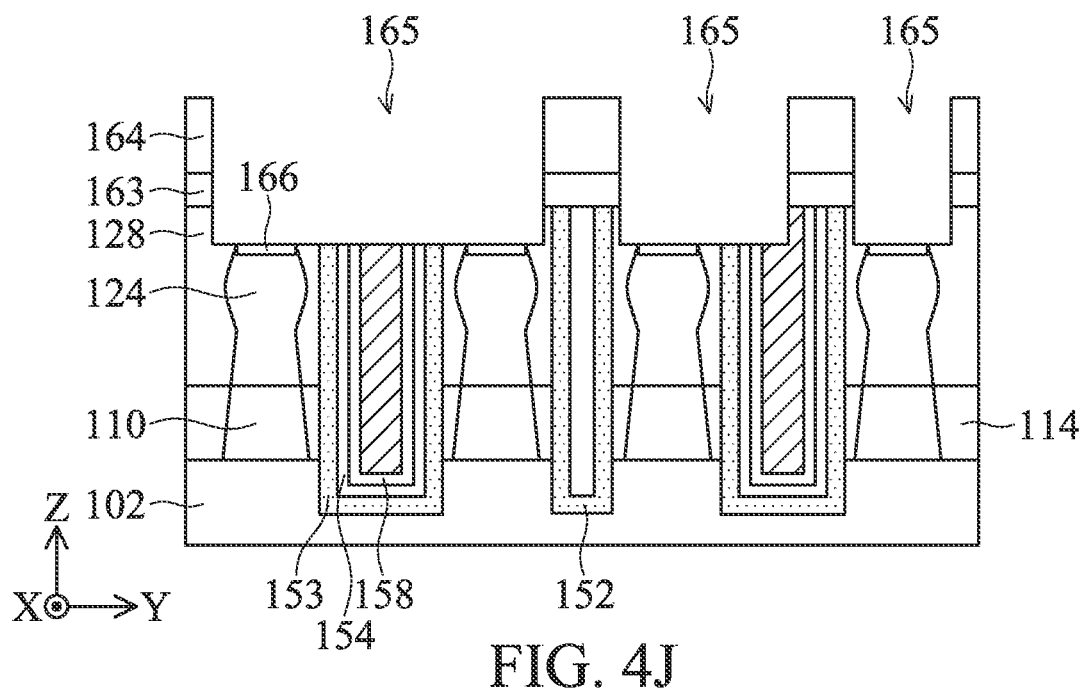
Figure 4K:
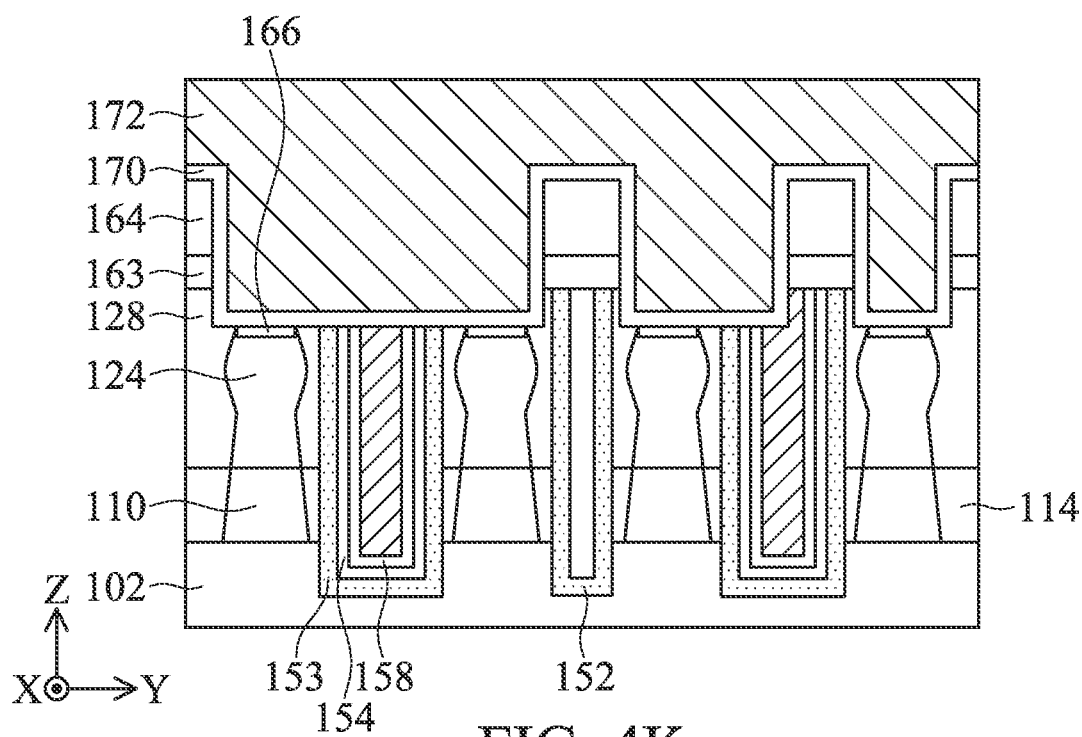
Figure 4L:
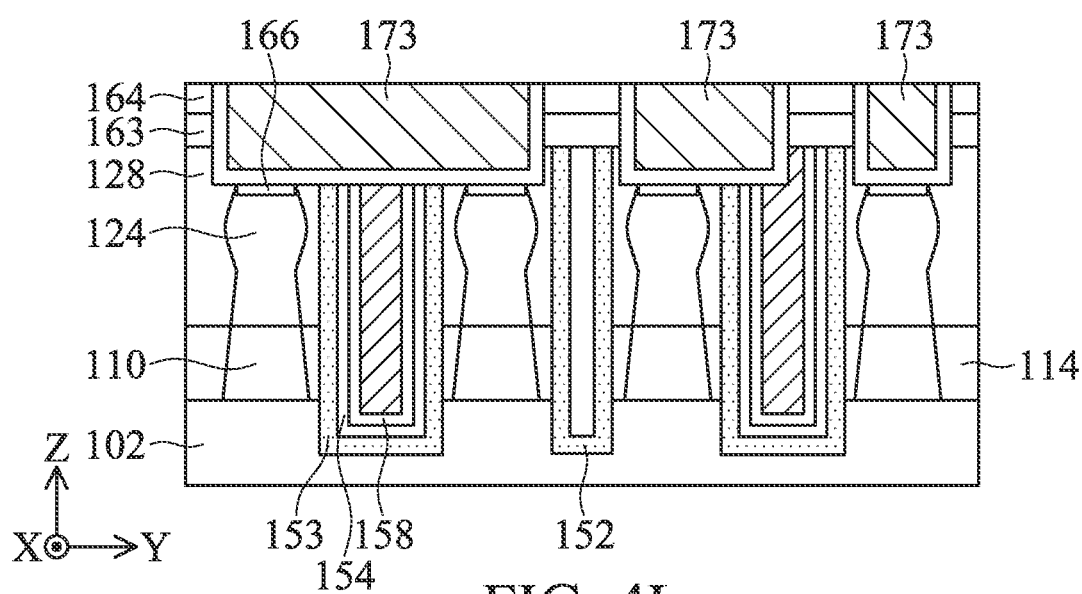
Figure 4M:
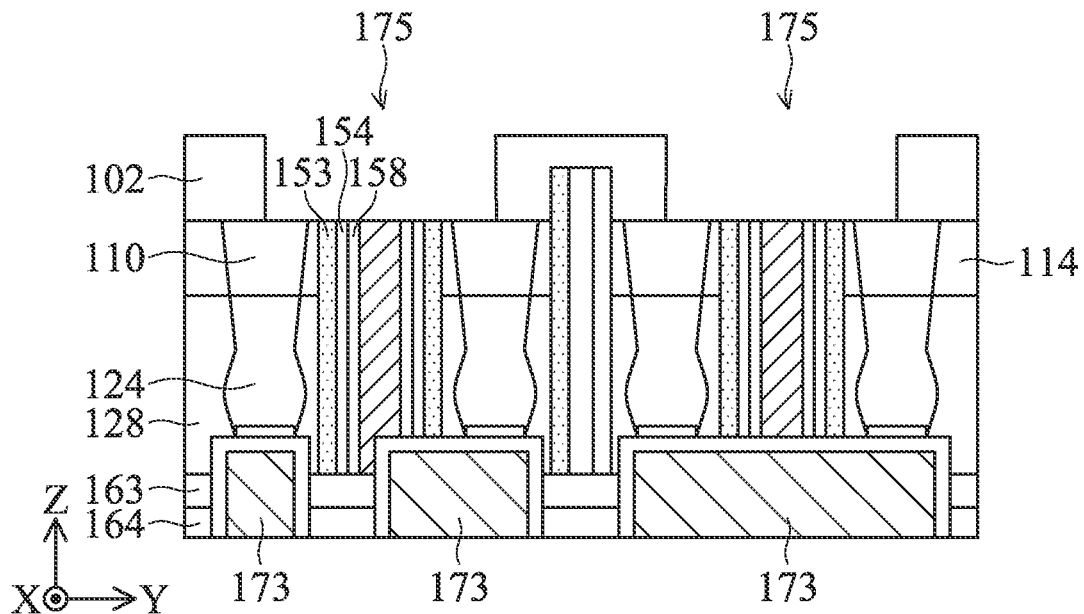
Figure 4N:
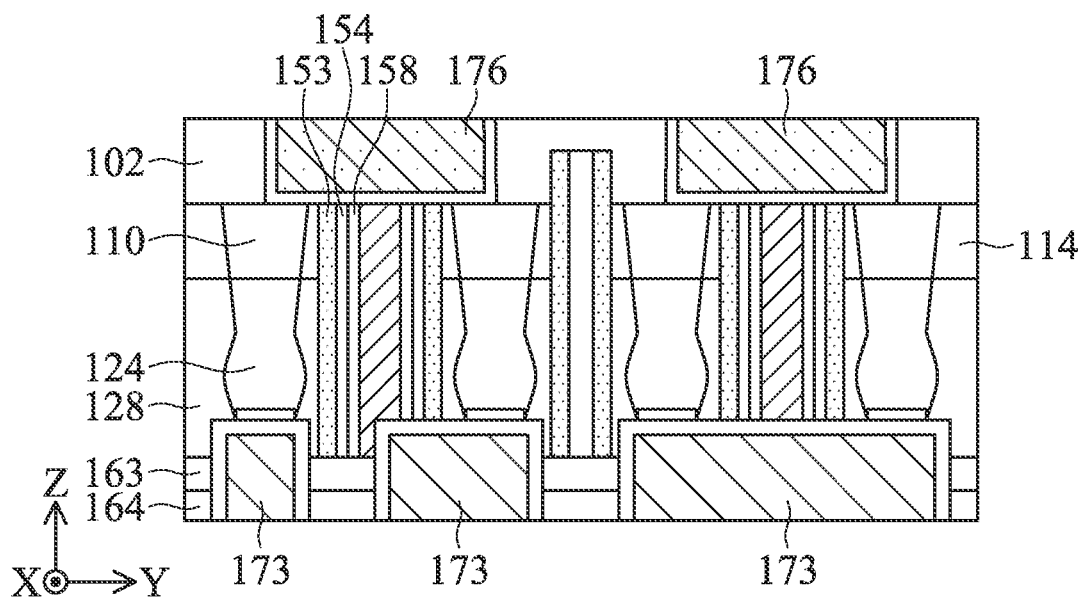
Figure 4O:
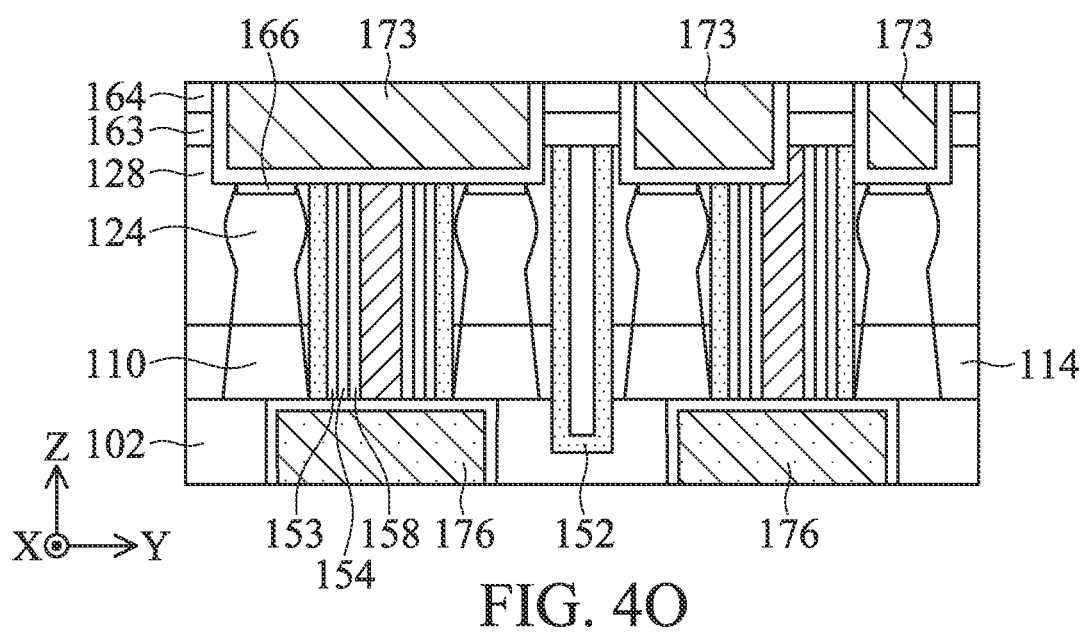

FIGS. 4A-4O are cross-sectional views of various stages of forming a semiconductor structure, in accordance with some embodiments of the disclosure. It should be noted FIGS. 4A-4O are illustrated along the line A-A shown in FIG. 1I, but the present disclosure is not limited thereto. As shown in FIG. 4A, a dielectric layer 140 is formed on the ILD structure 128 by a deposition process. The deposition process may include a chemical vapor deposition (CVD) process, a high-density plasma chemical vapor deposition (HDPCVD) process, a spin-on process, a sputtering process, or another applicable process. For example, the dielectric layer 140 includes SiN or any other suitable dielectric material.

Then, as shown in FIG. 4B, a trench 142 and a plurality of recesses 144 are formed in the dielectric layer 140 by an etching process, such as a dry etching process or a wet etching process. In some embodiments, the trench 142 and the recesses 144 penetrate the dielectric layer 140, the ILD structure 128 and the isolation structure 114, and extend into a portion of the substrate 102. In some embodiments, bottom surfaces of the trench 142 and the recesses 144 are level with a top surface of the substrate 102. In some embodiments, the trench 142 is formed between two adjacent fin structures 110, and the recesses 144 are formed between another two adjacent fin structures 110. That is, at least one fin structure 110 is located between one of the recesses 144 and the trench 142. In some embodiments, the S/D structures 124 and the fin structures 110 may not be exposed by the trench 142.

Next, as shown in FIG. 4C, an isolation material 150 and an electrical dielectric material 151 are filled in the trench 142 and the recesses 144. In some embodiments, the isolation material 150 and the electrical dielectric material 151 overfill the trench 142 and are conformally formed on sidewalls and a bottom surface of each of the recesses 144. For example, the isolation material 150 includes SiC, SiCN, GA$_2$O$_3$, diamond, h-BN, p-BN, a-BN, single crystal AlN, p-AlN, or a combination thereof. In some embodiments, the isolation material 150 is deposited by an atomic layer deposition (ALD) process, an atomic layer annealing (ALA) process, a plasma-enhanced chemical vapor deposition (PECVD) process, a physical vapor deposition (PVD) process, or any other suitable process. In some embodiments, the isolation material 150 has a thermal conductivity higher than 4 W/mK.

Then, as shown in FIG. 4D, a sacrificial material 147 overfills the recesses 144 and therefore covers the isolation material 150 and the electrical dielectric material 151. For example, the sacrificial material 147 includes an oxide material or any other suitable material. In some embodiments, as shown in FIG. 4E, a planarization process is performed on the sacrificial material 147. For example, the planarization process may be a grinding process, a chemical mechanical polish (CMP) process, an etching process or any other suitable process. After the planarization process is completed, an isolation structure 152 is formed in the trench 142, a sacrificial layer 148, liners 153, and an electrical dielectric layer 154 are formed in the recesses 144. In particular, the electrical dielectric layer 154 is located between the liners 153 and the sacrificial layer 148. It is noted that the isolation structure 152 and the liners 153 are made of the same material. In some embodiments, a top surface of the sacrificial layer 148 is substantially level with a top surface of the liners 153 and a top surface of the isolation structure 152.

Next, as shown in FIG. 4F, the sacrificial layer 148 is removed by an etching process, such as a dry etching process or a wet etching process. A plurality of recesses 149 are formed and expose the electrical dielectric layer 154 for subsequent deposition process. In some embodiments, as shown in FIG. 4G, a barrier layer 158 is deposited on the ILD structure 128 and in the recesses 149, and a conductive material 160 is formed over the barrier layer 158. For example, the barrier layer 158 is made of tantalum (Ta), tantalum nitride (TaN), titanium (Ti), titanium nitride (TiN), cobalt tungsten (CoW) or another applicable material. In some embodiments, the barrier layer 158 is formed by a deposition process, such as a chemical vapor deposition (CVD) process, physical vapor deposition (PVD) process, atomic layer deposition (ALD) process, plating process or another application process. In some embodiments, the second conductive material 160 is made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the conductive material 160 is formed by a deposition process, such as a chemical vapor deposition (CVD) process, physical vapor deposition (PVD) process, atomic layer deposition (ALD) process, plating process or another application process.

Then, as shown in FIG. 4H, a planarization process is performed on the conductive material 160. For example, the planarization process may be a grinding process, a chemical mechanical polish (CMP) process, an etching process or any other suitable process. After the planarization process is completed, a plurality of conductive vias 162 are formed. It is noted that since the electrical dielectric layer 154 is located between the liners 153 and the conductive vias 162, the possibility that a breakdown occurred between the liners 153 and the conductive vias 162 may be reduced.

In some embodiments, as shown in FIG. 4I, a plurality of passivation layers 163 and 164 are successively formed over the isolation structure 152 and the conductive vias 162. Next, as shown in FIG. 4J, a plurality of trenches 165 are formed in the passivation layers 163 and 164 by an etching process, such as a dry etching process or a wet etching process. In some embodiments, an adhesive layer 166 is formed on the bottom of the trenches 165 and over the S/D structures 124. The adhesive layer 166 is exposed from the trenches 165. For example, the adhesive layer 166 includes silicide or any other suitable material.

In some embodiments, as shown in FIG. 4K, a seed layer 170 is formed on the passivation layer 164 and on sidewalls and a bottom surface of the trenches 165, a conductive material 172 is formed on the seed layer 170. In some embodiments, the seed layer 170 is a metal layer, which may be a single layer or a composite layer comprising a plurality of sub-layers formed of different materials. In some embodiments, the seed layer 170 includes a titanium layer and a copper layer over the titanium layer. The seed layer may be formed using, for example, PVD or the like. In some embodiments, the conductive material 172 includes Cu, CuAl, Al, or any other suitable material. The conductive material 172 may be formed by plating, such as electroplating or electroless plating, or the like.

Then, as shown in FIG. 4L, a planarization process is performed on the conductive material 172. For example, the planarization process may be a grinding process, a chemical mechanical polish (CMP) process, an etching process or any other suitable process, after the planarization process is completed, a conductive structure 173 is formed. In some embodiments, as shown in FIG. 4M, the overall semiconductor structure is flipped, and a plurality of trenches 175 are formed in the substrate 102. In some embodiments, before forming the trenches 175, the substrate 102 is thinned. For example, the substrate 102 is thinned by a CMP process or any other suitable process, and a remaining thickness of the thinned substrate 102 is in a range from about 50 μm to about 200 μm. The trenches 175 expose the conductive vias 162.

Next, as shown in FIG. 4R, a conductive structure 176 is formed in the trenches 175. In some embodiments, the conductive structure 176 includes Cu, CuAl, Al, or any other suitable material. It is noted that the conductive structure 176 may be formed by the similar processes as forming the conductive structure 173. After that, as shown in FIG. 4O, the overall semiconductor structure is flipped for performing subsequent processes.

Figure 5A:
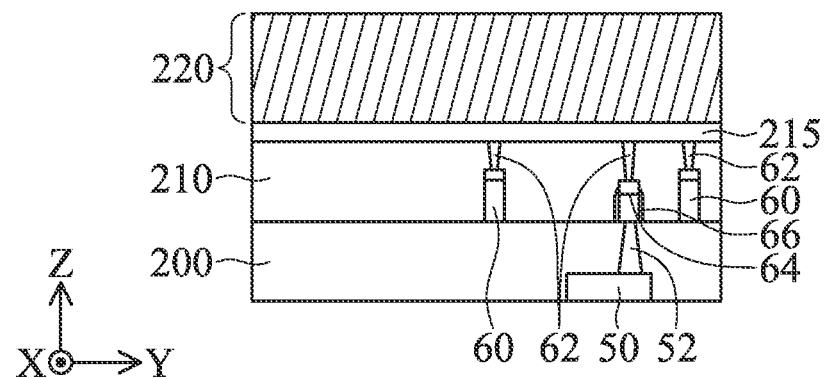
FIGS. 5A-5I are cross-sectional views of various stages of forming a semiconductor structure, in accordance with some embodiments of the disclosure.

FIGS. 5A-5I are cross-sectional views of various stages of forming a semiconductor structure, in accordance with some embodiments of the disclosure. As shown in FIG. 5A, a substrate 200 is provided. The device region 210 is formed on the substrate 200. In addition, an etch stop layer 215 is formed on the device region 210. In some embodiments, the substrate 200 includes a conductive structure 50 and a conductive via 52 electrically connected to the conductive structure 50. It is noted that the conductive structure 50 and the conductive via 52 are illustrative, and the present disclosure is not limited thereto. For example, the conductive structure 50 and the conductive via 52 are the conductive structures and the conductive vias discussed in the previous embodiments.

In addition, the device region 210 includes a plurality of devices 60 and a plurality of conductive vias 62 electrically connected to the devices 60. For example, the devices 60 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. In some embodiments, one of the devices includes a gate structure 64 and spacers 66 that are disposed adjacent to the gate structure 64.

A conductive material 220 is formed on the etch stop layer 215 and includes a two-dimensional (2D) material, The term "2D material" used in this disclosure refers to single layer material or monolayer-type material that is atomically thin crystalline solid having intralayer covalent bonding and interlayer van der Waals bonding. Examples of a 2D material may include graphene, hexagonal boron nitride (h-BN), or transition metal dichalcogenides ($MX_2$), where M is a transition metal element and X is a chalcogenide element. Some exemplary $MX_2$ materials may include, but are not limited to, $MoS_2$, $TiS_2$, $MoSe_2$, or any combination thereof, which has anisotropic conductivity. In some embodiments, the conductive material 220 has a relative high horizontal conductivity and relative low vertical conductivity. In some embodiments, the conductive material 220 has $Al_2O_3$, AlN, diamond, $C_3N_4$, h-BN, graphite, graphene, $Si_3N_4$, or a combination thereof.

Figure 5B:
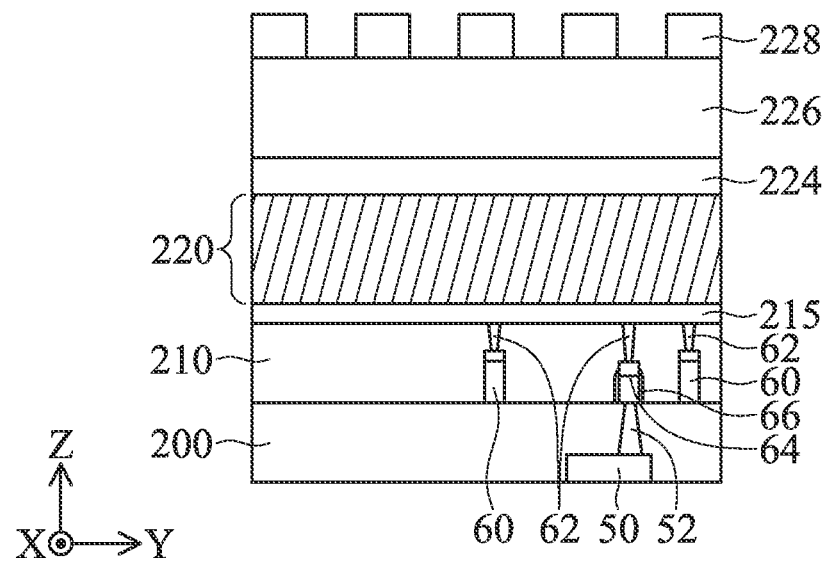

A dielectric layer 224 and a mask layer 226 are formed over the conductive material 220, and a patterned photoresist layer 228 is formed over the mask layer 226, as shown in FIG. 5B in accordance with some embodiments. In some embodiments, the patterned photoresist layer 228 is formed by a deposition process and a patterning process.

The deposition process for forming the patterned photoresist layer 228 includes a chemical vapor deposition (CVD) process, a high-density plasma chemical vapor deposition (HDPCVD) process, a spin-on process, a sputtering process, or another applicable process. The patterning process for forming the patterned photoresist layer 108 includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

Moreover, the dielectric layer 224 is a buffer layer between the conductive material 220 and the mask layer 226. In some embodiments, the dielectric layer 224 is used as a stop layer when the mask layer 226 is removed. In some embodiments, the dielectric layer 224 is made of silicon oxide. The mask layer 226 is made of silicon oxide, silicon nitride, silicon oxynitride, or another applicable material. In some other embodiments, more than one mask layer 226 is formed over the dielectric layer 224. The dielectric layer 224 and the mask layer 226 is formed by deposition processes, which includes a chemical vapor deposition (CVD) process, a high-density plasma chemical vapor deposition (HDPCVD) process, a spin-on process, a sputtering process, or another applicable process.

Figure 5C:
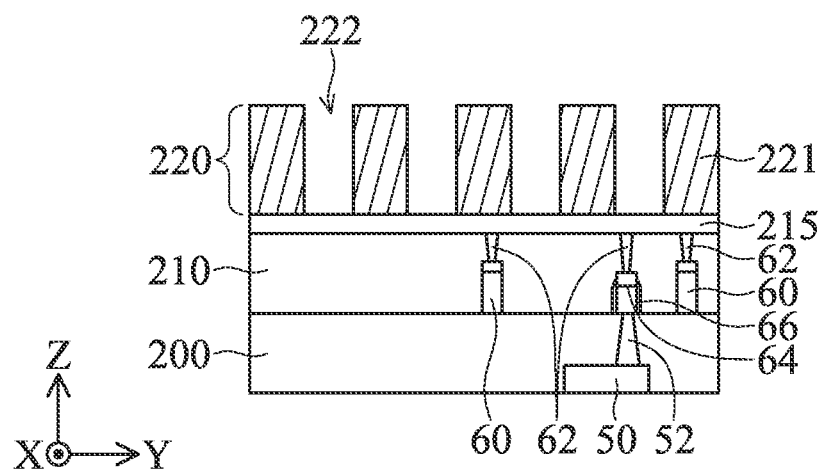
Figure 5D:
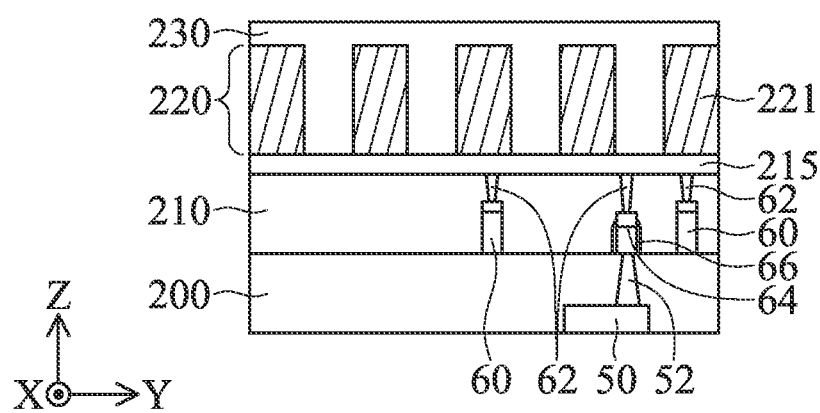

Next, as shown in FIG. 5C, a conductive layer 221 is formed by an etching process, such as a dry etching process or a wet etching process, and a plurality of recesses 222 is formed in the conductive layer 221. It is noted that the conductive layer 221 is shown as several separate sections, these sections may be electrically connected to each other. In some embodiments, as shown in FIG. 5D, a dielectric material 230 overfills the recesses 222 and therefore covers the conductive layer 221. For example, the dielectric material 230 has a dielectric constant (k-value) in a range from about 3.1 to about 4.5. The density of the dielectric material 230 may be higher than 1.2 $g/cm^3$, such as in a range from about 1.3 $g/cm^3$ to about 2.5 $g/cm^3$. In some embodiments, the Young's modulus of the dielectric material 230 is greater than about 10 GPa. The above parameters may help to reduce the possibility that the conductive layer 221 is damaged during the deposition of the dielectric material 230.

Figure 5E:
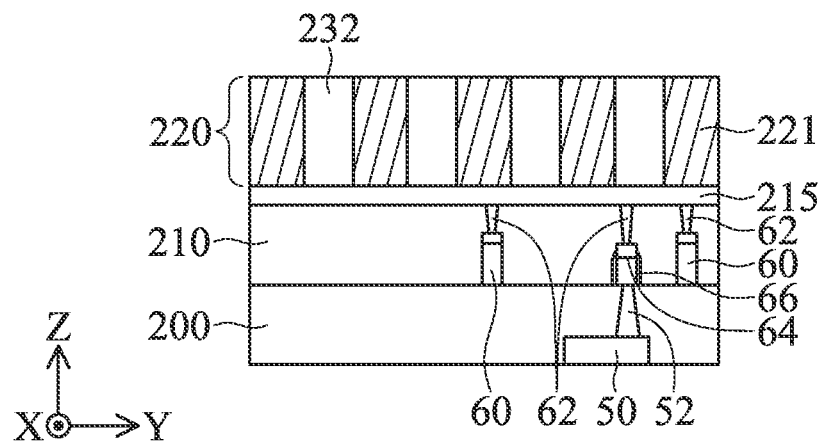

In some embodiments, as shown in FIG. 5E, a planarization process is performed on the dielectric material 230. For example, the planarization process may be a grinding process, a chemical mechanical polish (CMP) process, an etching process or any other suitable process. After the planarization process is completed, a dielectric layer 232 is formed in the recesses 222.

Figure 5F:
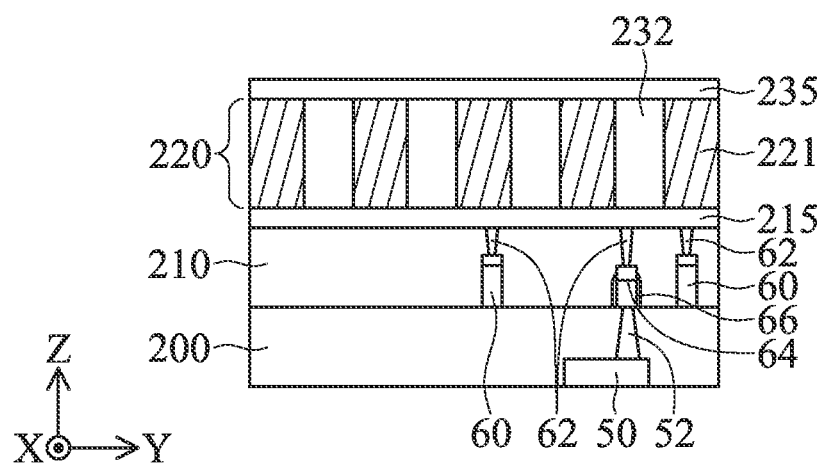
Figure 5G:
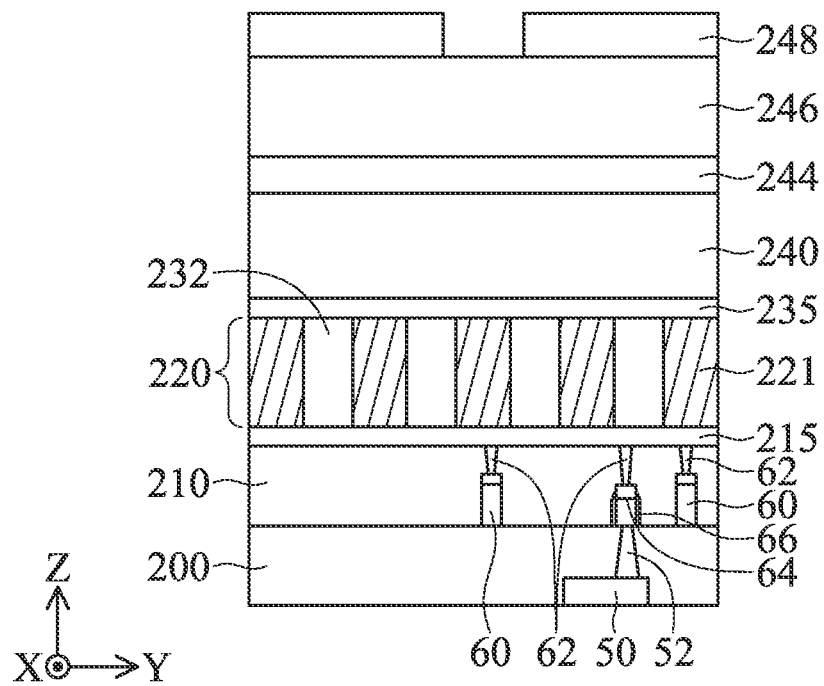

Then, as shown in FIG. 5F, an etch stop layer 235 is formed on the conductive layer 221 and the dielectric layer 232. That is, the conductive layer 221 and the dielectric layer 232 are located between the etch stop layer 215 and the etch stop layer 235. In some embodiments, as shown in FIG. 5G in accordance with some embodiments, a dielectric layer 240 is deposited over the etch stop layer 215. Similarly, a dielectric layer 244 and a mask layer 246 are formed over the dielectric layer 240, and a patterned photoresist layer 248 is formed over the mask layer 246. In some embodiments, the patterned photoresist layer 228 is formed by a deposition process and a patterning process.

Figure 5H:
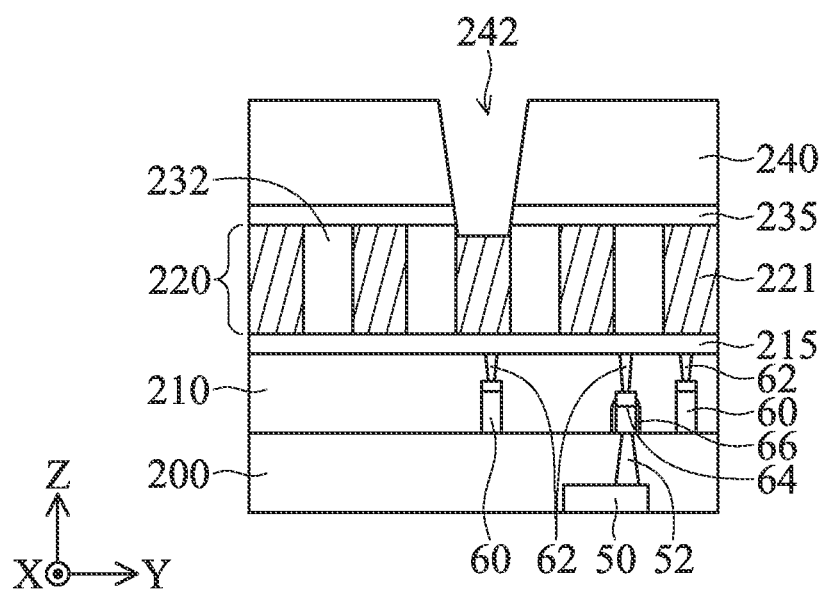
Figure 5I:
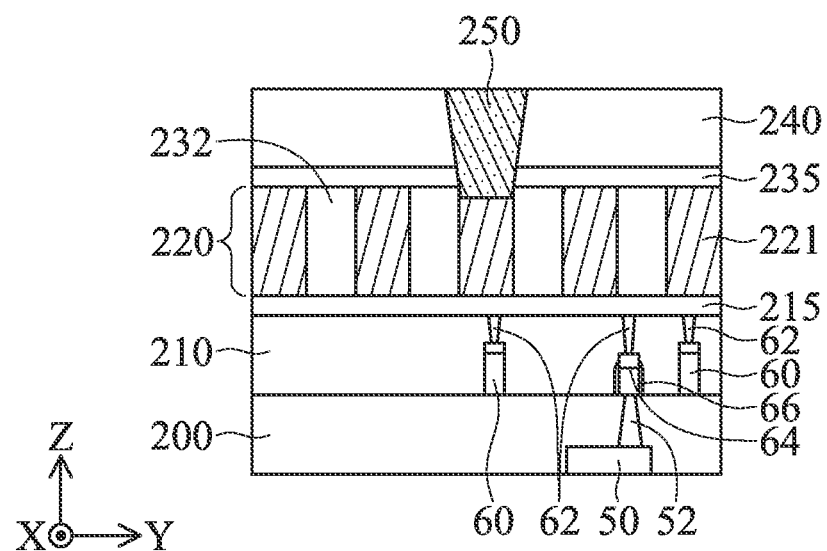

Then, as shown in FIG. 5H, a recess 242 is formed by an etching process, such as a dry etching process or a wet etching process. In some embodiment, the recess 242 penetrates the dielectric layer 240 and the etch stop layer 235, and exposes at least a portion of the conductive layer 221. In some embodiment, as shown in FIG. 5H, a conductive via 250 is formed in the recess 242 and electrically/physically connected to the conductive layer 221.

Figure 6A:
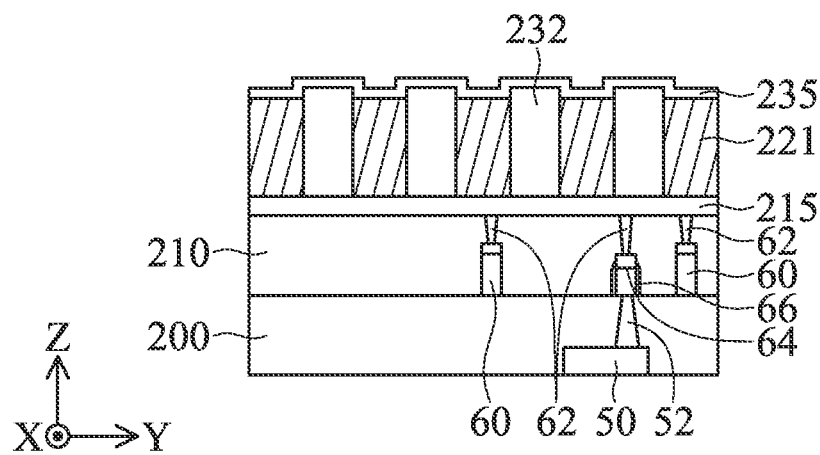
FIGS. 6A-6D are cross-sectional views of various stages of forming a semiconductor structure, in accordance with some embodiments of the disclosure.

FIGS. 6A-6D are cross-sectional views of various stages of forming a semiconductor structure, in accordance with some embodiments of the disclosure. It is noted that the processes shown in FIGS. 6A-6D may continue on the process shown in FIG. 5E, and therefore the processes shown in FIGS. 5A-5E are also included in the present embodiment. In some embodiments, the conductive layer 221 is recessed to be lower than the dielectric layer 232 by an additional etching process, such as a dry etching process or a wet etching process. Then, as shown in FIG. 6A, an etch stop layer 235 is formed on the conductive layer 221 and the dielectric layer 232. In some embodiments, the etch stop layer 235 is conformally formed on the conductive layer 221 and the dielectric layer 232.

Figure 6B:
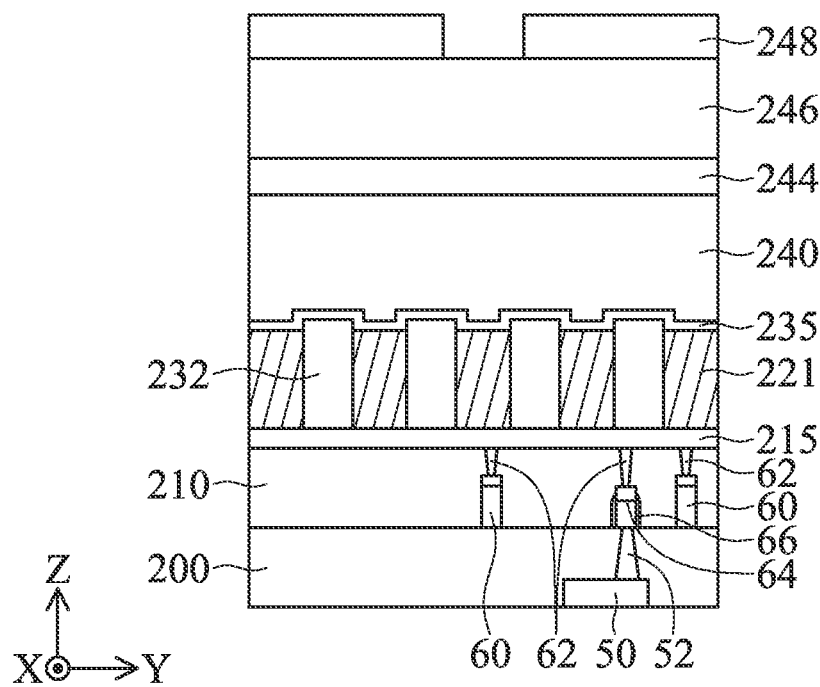

In some embodiments, as shown in FIG. 6B in accordance with some embodiments, a dielectric layer 240 is deposited over the etch stop layer 215. Similarly, a dielectric layer 244 and a mask layer 246 are formed over the dielectric layer 240, and a patterned photoresist layer 248 is formed over the mask layer 246. In some embodiments, the patterned photoresist layer 228 is formed by a deposition process and a patterning process.

Figure 6C:
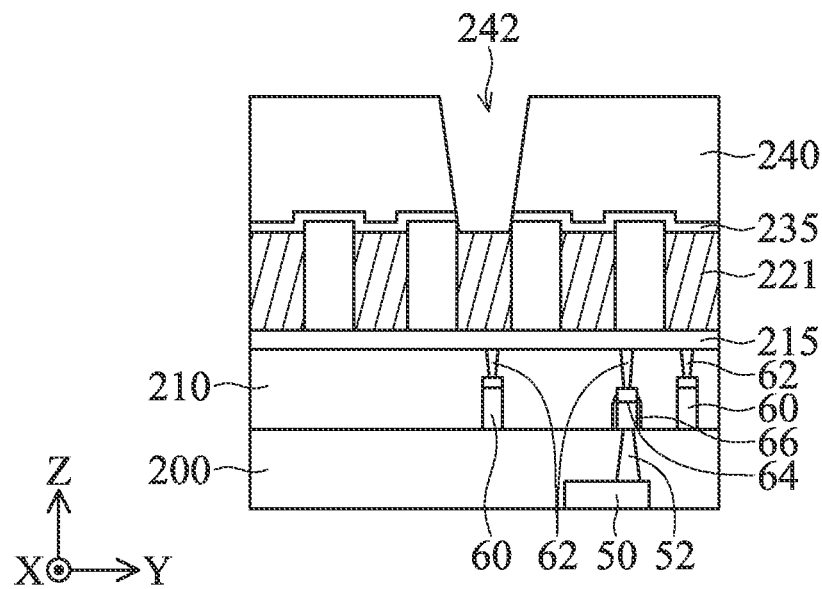
Figure 6D:
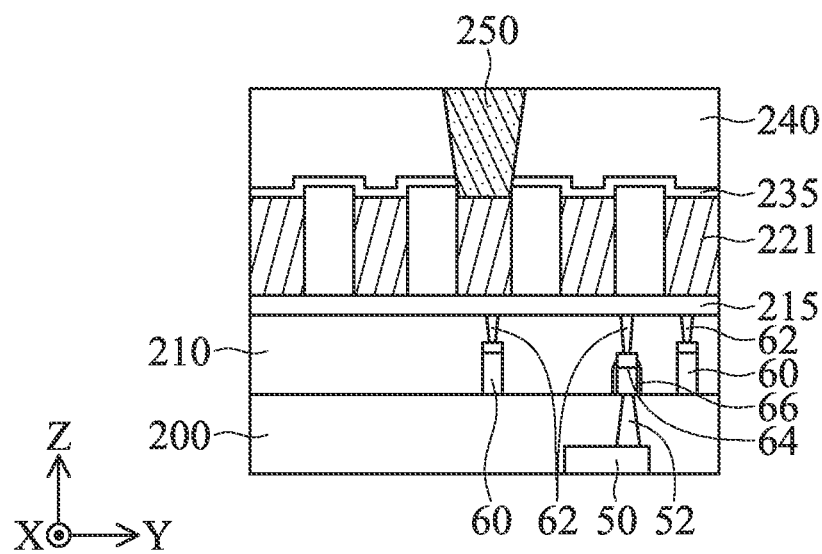

Then, as shown in FIG. 6C, a recess 242 is formed by an etching process, such as a dry etching process or a wet etching process. In some embodiment, the recess 242 penetrates the dielectric layer 240 and the etch stop layer 235, and exposes at least a portion of the conductive layer 221. In some embodiment, as shown in FIG. 6D, a conductive via 250 is formed in the recess 242 and electrically/physically connected to the conductive layer 221. It is noted that the recess 242 and the conductive via 250 formed therein are aligned to the portion of the conductive layer 221 more successfully since the height difference exists between the conductive layer 221 and the dielectric layer 232. Therefore, the possibility of the misalignment between conductive via 250 and the conductive layer 221 may be reduced.

Figure 7A:
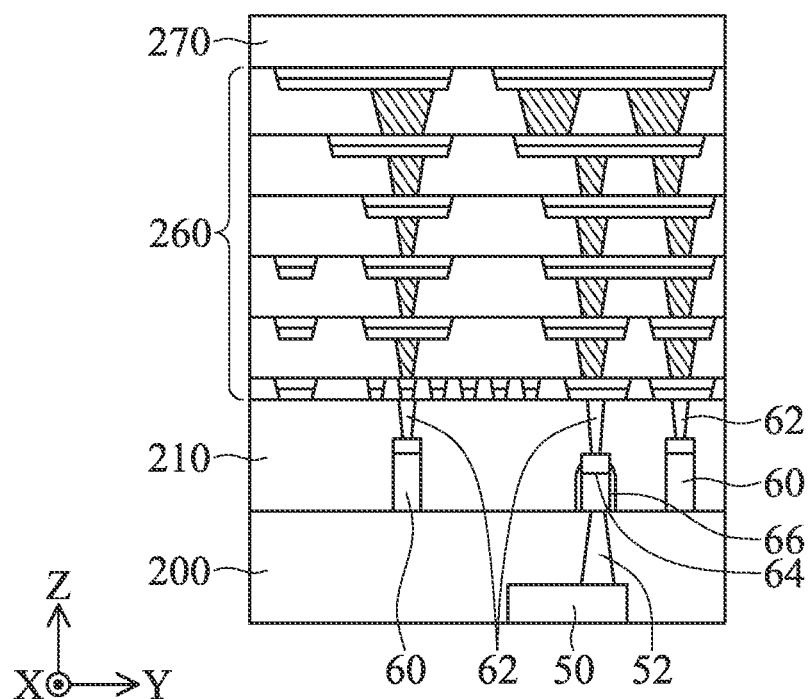
FIGS. 7A-7C are cross-sectional views of a semiconductor structure, in accordance with some embodiments of the disclosure.
Figure 7B:
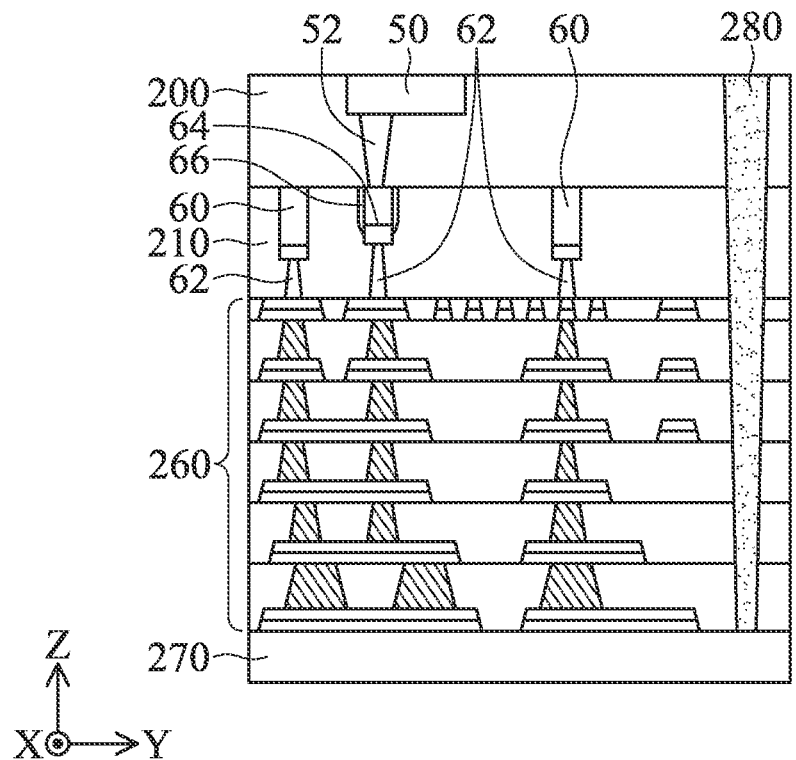
Figure 7C:
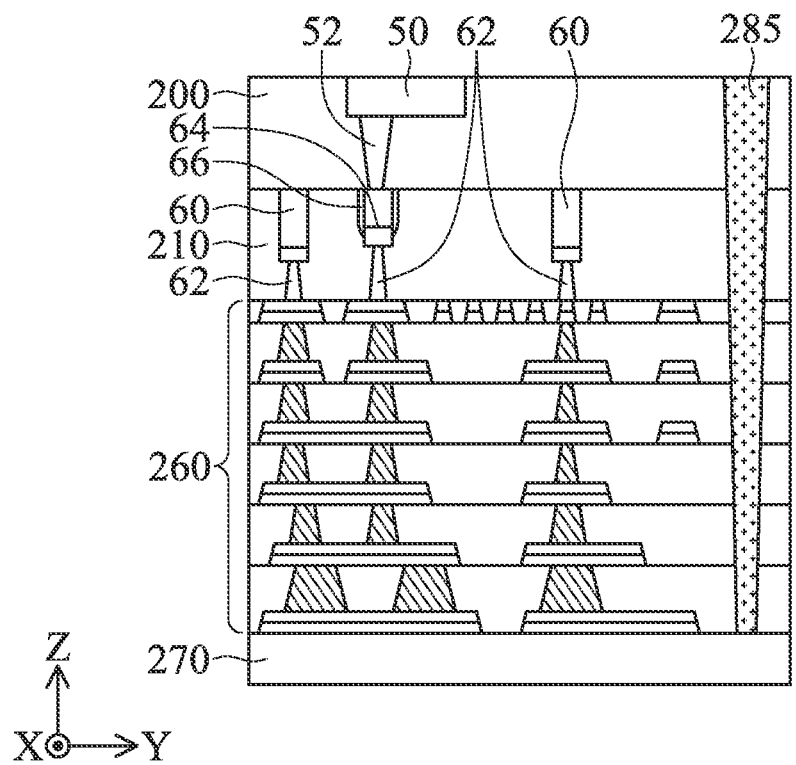

FIGS. 7A-7C are cross-sectional views of a semiconductor structure, in accordance with some embodiments of the disclosure. It is noted that the semiconductor structures shown in FIGS. 7A-7C include a substrate 200, a device region 210 formed on the substrate 200, an interconnect structure 260 formed on and electrically connected to the device region 210, and a heat sink 270 disposed on the interconnect structure 260. The interconnect structure 260 are formed by repeating the processes shown in FIGS. 5A-5I and/or FIGS. 6A-6D, and therefore includes multiple layers of the conductive layer 221, the dielectric layers 232, 240 and the conductive via 250. The heat sink 270 is configured to dissipate the heat generated by the overall semiconductor structure.

In some embodiments, as shown in FIG. 7B, the overall semiconductor structure is flipped, and a through via 280 is formed adjacent to the conductive layers 221 and the conductive vias 250, penetrating the substrate 200, the device region 210, and the dielectric layers 240. In some embodiments, the through via 280 is in contact with the heat sink 270. For example, the through via 280 is formed by laser drilling process and metal filling process. However, any other suitable process may also be adopted. The through via 280 is made of metallic material or any other suitable thermal-conductive material. Accordingly, the heat dissipation of the overall semiconductor structure is improved, especially in a vertical direction.

In some embodiments, as shown in FIG. 7C, the overall semiconductor structure is flipped, and a through via 285 is formed adjacent to the conductive layers 221 and the conductive vias 250, penetrating the substrate 200, the device region 210, the dielectric layers 240, and the heat sink 270. In some embodiments, the through via 285 is electrically connected to external components and configured to transmit power to the substrate 200 and the device region 210. For example, the through via 285 is made of metallic material or any other suitable thermal-conductive material. Accordingly, the heat dissipation of the overall semiconductor structure is improved, and the variety of circuit design of the overall semiconductor structure may be enhanced.

FIGS. 8A-8G are cross-sectional views of various stages of forming a semiconductor structure, in accordance with some embodiments of the disclosure. It is noted that the semiconductor structures shown in FIGS. 8A-8G include a substrate 300, a device region 310 formed on the substrate 300, an interconnect structure 320 formed on and electrically connected to the device region 310. In some embodiments, the interconnect structure 320 are formed by repeating the processes shown in FIGS. 5A-5I and/or FIGS. 6A-6D. In some embodiments, the interconnect structure 320 includes a dielectric layer 321 and a conductive layer 322 formed in the dielectric layer 321. It is noted that the conductive layer 322 is shown as several separate sections, these sections may be electrically connected to each other.

Figure 8A:
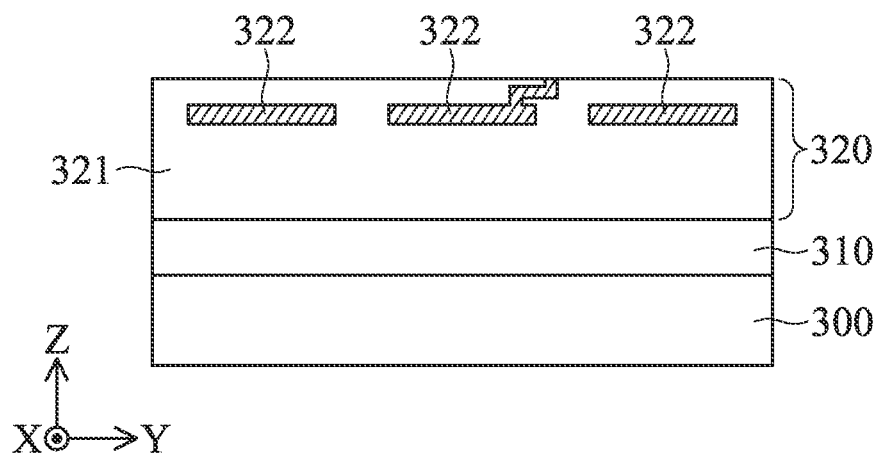
FIGS. 8A-8G are cross-sectional views of various stages of forming a semiconductor structure, in accordance with some embodiments of the disclosure.
Figure 8B:
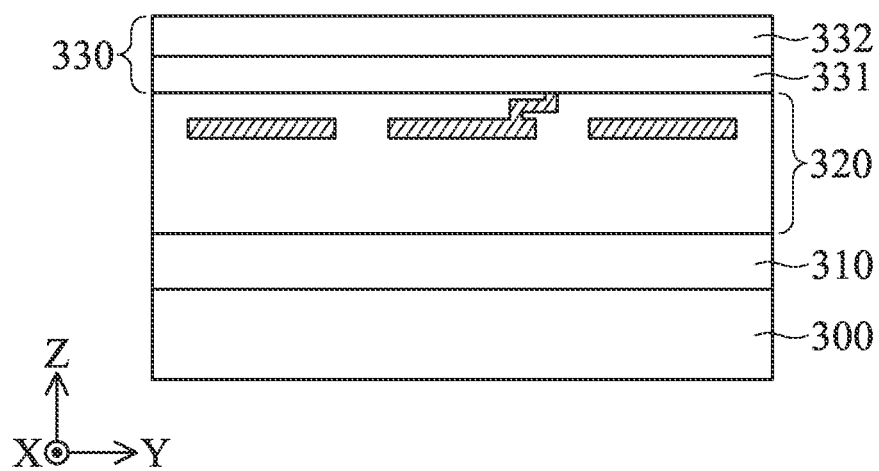

Next, as shown in FIG. 8B, a first passivation layer 330 is formed over the interconnect structure 320. In some embodiments, the first passivation layer 330 includes a first layer 331 in contact with the interconnect structure 320 and a second layer 332 formed on the first layer 331. In some embodiments, the first layer 331 and the second layer 332 are made of undoped silicate glass (USG), SiN, or any other suitable material. For example, the first layer 331 and the second layer 332 are deposited by a high density plasma CVD (HDPCVD) process, or a plasma enhanced CVD (PECVD) process. However, any other deposition process may also be adopted.

Figure 8C:
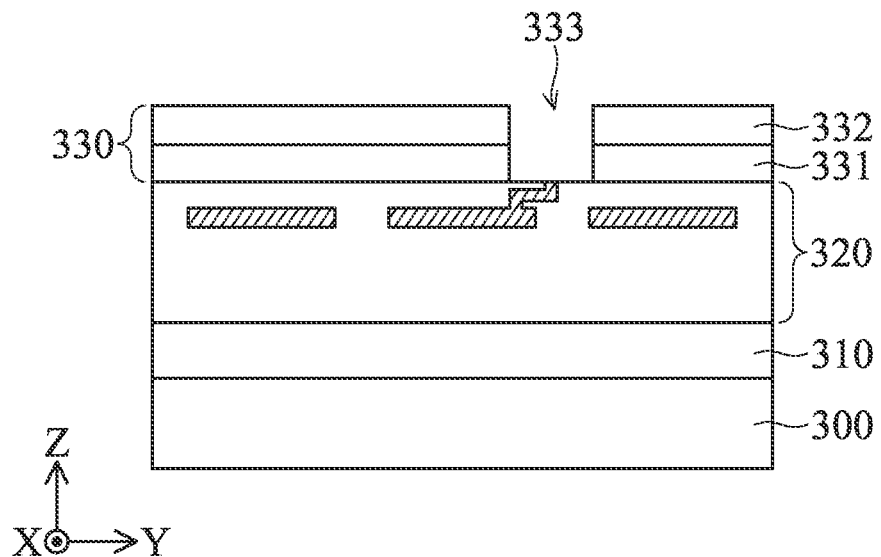
Figure 8D:
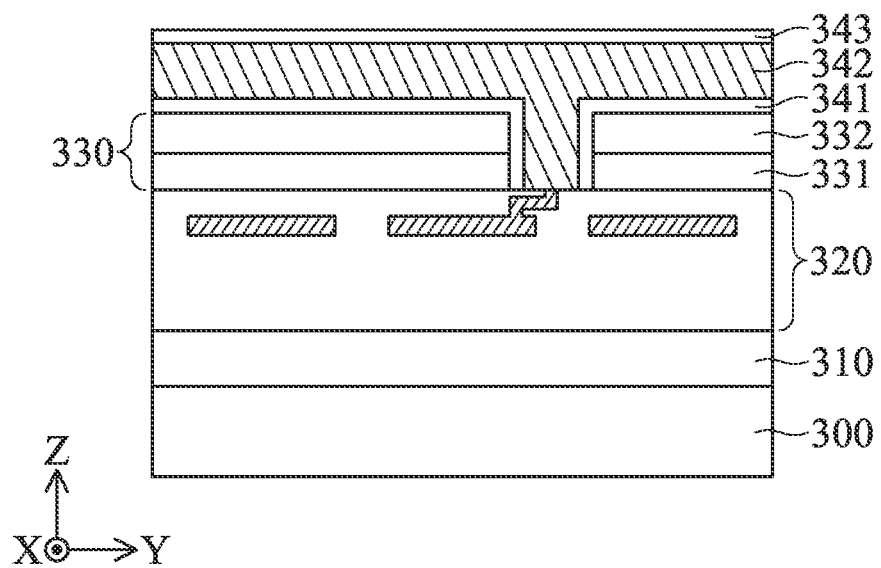
Figure 8E:
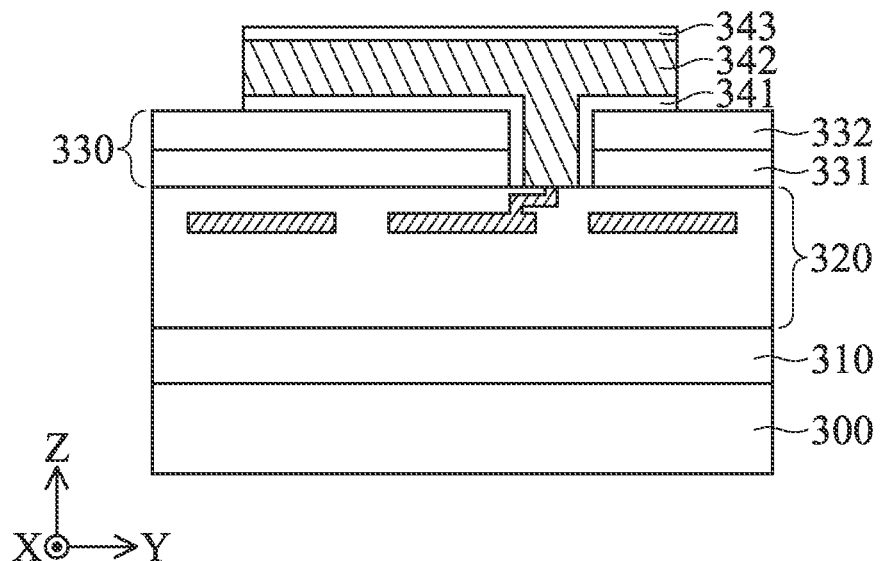

Then, as shown in FIG. 8C, a recess 333 is formed by an etching process, such as a dry etching process or a wet etching process. In some embodiment, the recess 333 penetrates the first passivation layer 330, and exposes at least a portion of the conductive layer 322. In some embodiments, as shown in FIG. 8D, a barrier layer 341, a metal pad 342, and an anti-reflection layer 343 are formed over and extending into the first passivation layer 330. In some embodiments, the barrier layer 341, the metal pad 342, and the anti-reflection layer 343 are successively deposited. That is, the barrier layer 341 is located between the metal pad 342 and the first passivation layer 330. The barrier layer 341 includes Ta, TiN, TaN and may be deposited by PVD, ALD, CVD, or a combination thereof. In some embodiments, the metal pad 342 includes Cu, CuAl, or Al. In some embodiments, the anti-reflection layer 343 includes SiON and may be deposited by PVD, ALD, CVD, or a combination thereof. Then, as shown in FIG. 8E, the barrier layer 341, the metal pad 342, and the anti-reflection layer 343 are patterned for subsequent process.

Figure 8F:
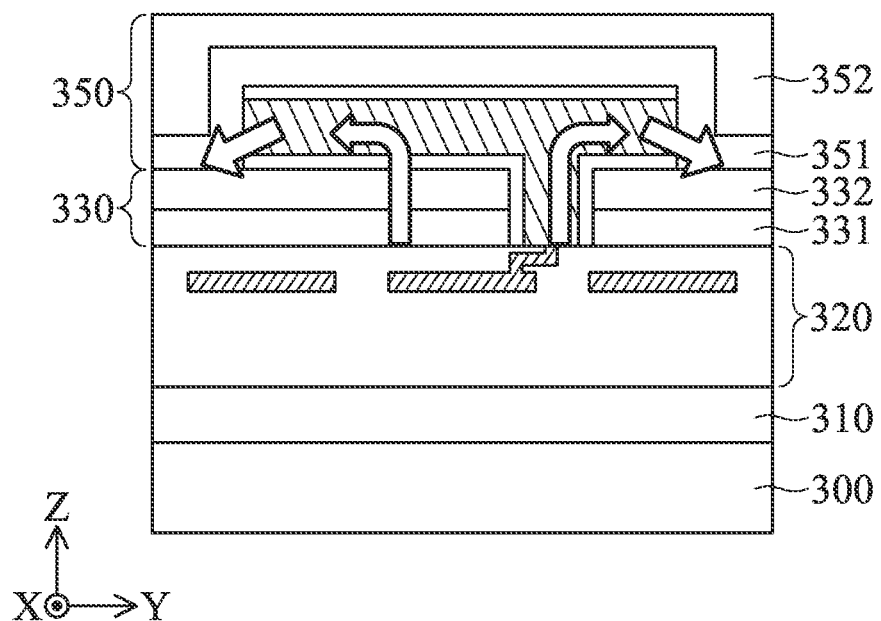

In some embodiments, as shown in FIG. 8F, a second passivation layer 350 is formed over the first passivation layer 330. In some embodiments, the anti-reflection layer 343 is located between the metal pad 342 and the second passivation layer 350. In some embodiments, the second passivation layer 350 is in direct contact with the barrier layer 341 and the anti-reflection layer 343. The second passivation layer 350 includes a first layer 351 formed over the metal pad 342 and a second layer 352 formed on the first layer 351. In some embodiments, the first layer 351 includes a thermal conductive material, and the thermal conductivity of the thermal conductive material is higher than 4 W/mK. For example, the thermal conductive material includes SiC, SiCN, $GA_2O_3$, diamond, h-BN, p-BN, a-BN, single crystal AlN, p-AlN, or a combination thereof, and may be deposited by an atomic layer deposition (ALD) process, an atomic layer annealing (ALA) process, a plasma-enhanced chemical vapor deposition (PECVD) process, a physical vapor deposition (PVD) process, or any other suitable process. In some embodiments, the first layer 351 and the second layer 352 are made of different materials. For example, the second layer 352 is made of undoped silicate glass (USG), SiN, or any other suitable material. For example, the second layer 352 is deposited by a high density plasma CVD (HDPCVD) process, or a plasma enhanced CVD (PECVD) process. However, any other deposition process may also be adopted. Since the first layer 351 is made of a thermal conductive material, the heat generated by the overall semiconductor structure may be conducted along the metal pad 342 and the first layer 351, indicated as the arrows in FIG. 8F. Accordingly, the thermal dissipation of the overall semiconductor structure may be improved, enhancing the performance of the overall semiconductor structure.

Figure 8G:
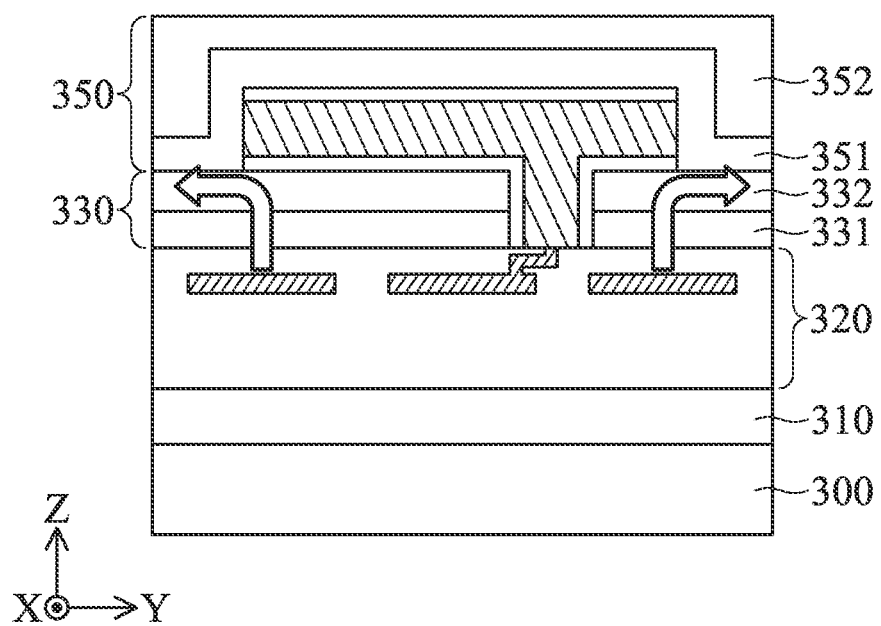

Alternatively, in some embodiments, as shown in FIG. 8G, the first passivation layer 330 includes the above thermal conductive material. For example, the second layer 332 is made of a thermal conductive material. The material and formation of the second layer 332 may be the same as the first layer 351, which is discussed above. Since the second layer 332 and the first layer 351 are both made of a thermal conductive material, the heat generated by the overall semiconductor structure may be conducted along the second layer 332 and the first layer 351, indicated as the arrows in FIG. 8G. Accordingly, the thermal dissipation region is greater, enhancing the performance of the overall semiconductor structure.

Embodiments of a semiconductor structures are provided. The semiconductor structure may include a thermal conductive material having a thermal conductivity higher than 4 W/mK. In some embodiments, the isolation structure separating the gate structure, the liners and the conductive layer, or the passivation layers may also adopted the thermal conductive material for improving the thermal dissipation of the overall semiconductor structure. In some embodiments, an electrical dielectric layer is formed between the liners and the conductive vias for reducing the possibility that a breakdown occurred between the liners and the conductive vias. In some embodiments, a through via is formed penetrating the substrate and the interconnect structure for improving the heat dissipation of the overall semiconductor structure, especially in a vertical direction.

In some embodiments, a semiconductor structure is provided. The semiconductor structure includes a substrate and a device region formed over the substrate. The semiconductor structure also includes an interconnect structure formed over the device region and a first passivation layer formed over the interconnect structure. The semiconductor structure further includes a metal pad formed over and extending into the first passivation layer and a second passivation layer formed over the first passivation layer. The second passivation layer comprises a thermal conductive material, and a thermal conductivity of the thermal conductive material is higher than 4 W/mK.

In some embodiments, a semiconductor structure is provided. The semiconductor structure includes a substrate, and a first fin, a second fin, and a third fin that protrude from the substrate. The semiconductor structure also includes a gate structure formed across the first fin, the second fin, and the third fin. The semiconductor structure includes a first source/drain structure attached to the first fin, a second source/drain structure attached to the second fin, a third source/drain structure attached to the third fin. The semiconductor structure further includes a conductive via disposed between the first source/drain structure and the second source/drain structure and an isolation structure disposed between the second source/drain structure and the third source/drain structure. The isolation structure separates the gate structure into a first region and a second region and comprises a thermal conductive material having a thermal conductivity higher than 4 W/mK.

In some embodiments, a semiconductor structure is provided. The semiconductor structure includes a substrate and a device region formed over the substrate. The semiconductor structure also includes a dielectric layer formed over the device region and a conductive layer formed in the dielectric layer. The conductive layer has anisotropic conductivity. The semiconductor structure further includes a conductive via formed in the dielectric layer and connected to the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a device region formed over the substrate;
   an interconnect structure formed over the device region;
   a first passivation layer formed over the interconnect structure;
   a metal pad formed over and extending into the first passivation layer;
   a second passivation layer formed over the first passivation layer, wherein the second passivation layer comprises a thermal conductive material, and a thermal conductivity of the thermal conductive material is higher than 4 W/mK;
   a barrier layer between the metal pad and the first passivation layer; and
   an anti-reflection layer between the metal pad and the second passivation layer.

2. The semiconductor structure as claimed in claim 1, wherein the second passivation layer comprises:
   a first layer formed over the metal pad; and
   a second layer, formed over the first layer, wherein the first layer and the second layer are made of different materials.

3. The semiconductor structure as claimed in claim 2, wherein the first layer is made of the thermal conductive material.

4. The semiconductor structure as claimed in claim 1, wherein the first passivation layer comprises the thermal conductive material.

5. The semiconductor structure as claimed in claim 1, wherein the second passivation layer is in direct contact with the barrier layer and the anti-reflection layer.

6. The semiconductor structure as claimed in claim 1, wherein the thermal conductive material comprises SiC, SiCN, $GA_2O_3$, diamond, h-BN, p-BN, a-BN, single crystal AlN, p-AlN, or a combination thereof.

7. The semiconductor structure as claimed in claim 1, wherein the barrier layer comprises Ta, TiN, or TaN.

8. A semiconductor structure, comprising:

an interconnect structure formed over a substrate and comprising:
   a dielectric layer; and
   a conductive layer formed in and partially exposed from the dielectric layer;
a first passivation layer formed over the interconnect structure;
a metal pad formed over the first passivation layer and electrically connected to the conductive layer, wherein the metal pad penetrates the first passivation layer and in contact with the conductive layer;
a barrier layer laterally sandwiched between the metal pad and the first passivation layer; and
a second passivation layer formed over the first passivation layer and the metal pad, wherein the second passivation layer comprises:
   a first layer covering the metal pad; and
   a second layer on the first layer, wherein the first layer and the second layer are made of different materials.

9. The semiconductor structure as claimed in claim 8, wherein the second layer is spaced apart from the metal pad via the first layer.

10. The semiconductor structure as claimed in claim 8, further comprising an anti-reflection layer between the metal pad and the first layer.

11. The semiconductor structure as claimed in claim 10, wherein in a direction perpendicular to a normal direction of the substrate, a width of the anti-reflection layer is substantially equal to a width of the metal pad.

12. The semiconductor structure as claimed in claim 10, wherein the anti-reflection layer comprises SiON.

13. The semiconductor structure as claimed in claim 8, wherein the barrier layer comprises Ta, TiN, or TaN.

14. The semiconductor structure as claimed in claim 8, wherein the first layer comprises a thermal conductive material, and a thermal conductivity of the thermal conductive material is higher than 4 W/mK.

15. The semiconductor structure as claimed in claim 8, wherein the first layer comprises SiC, SiCN, $GA_2O_3$, diamond, h-BN, p-BN, a-BN, single crystal AlN, p-AlN, or a combination thereof.

16. A method for fabricating a semiconductor structure, comprising:
   forming an interconnect structure over a substrate;
   forming a first passivation layer over the interconnect structure;
   forming a metal pad over the first passivation layer, wherein the metal pad passes through the first passivation layer and is electrically connected to the interconnect structure; and
   forming a second passivation layer over the metal pad, wherein the second passivation layer comprises a thermal conductive material over a top surface and sidewalls of the metal pad, and a thermal conductivity of the thermal conductive material is higher than 4 W/mK.

17. The method as claimed in claim 16, further comprising:
   forming a recess penetrating the first passivation layer and partially exposing a conductive layer of the interconnect structure.

18. The method as claimed in claim 17, further comprising:
   filling a barrier layer and the metal pad into the recess on the first passivation layer.

19. The method as claimed in claim 16, wherein forming the first passivation layer further comprises forming the thermal conductive material over the interconnect structure, and the thermal conductive materials in the first passivation layer and the second passivation layer are in contact with each other.

20. The method as claimed in claim 16, wherein forming the second passivation layer further comprises forming a passivation material over the thermal conductive material, and the passivation material comprises undoped silicate glass (USG) or SiN.

* * * * *